US008864894B2

(12) United States Patent
Shibayama et al.

(10) Patent No.: US 8,864,894 B2
(45) Date of Patent: Oct. 21, 2014

(54) RESIST UNDERLAYER FILM FORMING COMPOSITION CONTAINING SILICONE HAVING ONIUM GROUP

(75) Inventors: Wataru Shibayama, Toyama (JP); Makoto Nakajima, Toyama (JP); Yuta Kanno, Toyama (JP)

(73) Assignee: Nissan Chemical Industries, Ltd., Tokyo (JP)

(*) Notice: Subject to any disclaimer, the term of this patent is extended or adjusted under 35 U.S.C. 154(b) by 627 days.

(21) Appl. No.: 13/058,109

(22) PCT Filed: Aug. 13, 2009

(86) PCT No.: PCT/JP2009/064301
§ 371 (c)(1),
(2), (4) Date: Feb. 8, 2011

(87) PCT Pub. No.: WO2010/021290
PCT Pub. Date: Feb. 25, 2010

(65) Prior Publication Data

US 2011/0143149 A1 Jun. 16, 2011

(30) Foreign Application Priority Data

Aug. 18, 2008 (JP) ................................ 2008-209685

(51) Int. Cl.

| | |
|---|---|
| ***C09D 183/08*** | (2006.01) |
| ***C09D 5/00*** | (2006.01) |
| ***G03F 7/075*** | (2006.01) |
| ***G03F 7/004*** | (2006.01) |
| ***G03F 7/095*** | (2006.01) |
| *C08G 77/26* | (2006.01) |

(52) U.S. Cl.
CPC .............. *G03F 7/0755* (2013.01); *C09D 5/006* (2013.01); *C08G 77/26* (2013.01); *C09D 183/08* (2013.01); *G03F 7/0045* (2013.01); *G03F 7/0757* (2013.01); *G03F 7/095* (2013.01)
USPC ............ 106/287.11; 106/287.13; 106/287.14; 106/287.15; 106/287.16; 427/97.4; 427/97.5

(58) Field of Classification Search
USPC ............ 106/287.11, 287.13, 287.14, 287.16, 106/287.15; 427/97.4, 97.5
See application file for complete search history.

(56) References Cited

U.S. PATENT DOCUMENTS

| | | | |
|---|---|---|---|
| 3,813,364 | A | 5/1974 | De Zuba et al. |
| 5,100,503 | A | 3/1992 | Allman et al. |
| 5,152,834 | A | 10/1992 | Allman |
| 5,209,775 | A | 5/1993 | Bank et al. |
| 5,302,198 | A | 4/1994 | Allman |
| 5,472,488 | A | 12/1995 | Allman |
| 5,527,872 | A | 6/1996 | Allman |
| 5,665,845 | A | 9/1997 | Allman |
| 5,962,188 | A | 10/1999 | DeBoer et al. |
| 6,576,393 | B1 | 6/2003 | Sugita et al. |
| 7,192,683 | B2 | 3/2007 | Yamasaki et al. |
| 2004/0253461 | A1 | 12/2004 | Ogihara et al. |
| 2004/0266925 | A1 | 12/2004 | Shiono |
| 2006/0003252 | A1 | 1/2006 | Hirayama et al. |
| 2006/0093959 | A1 | 5/2006 | Huang et al. |
| 2007/0190459 | A1 | 8/2007 | Hashimoto et al. |
| 2007/0224816 | A1 | 9/2007 | Uh et al. |
| 2008/0076059 | A1 | 3/2008 | Abdallah et al. |
| 2008/0107997 | A1 | 5/2008 | Hiroi et al. |
| 2008/0312400 | A1 | 12/2008 | Yamashita et al. |
| 2009/0050020 | A1 | 2/2009 | Konno et al. |
| 2009/0130594 | A1 | 5/2009 | Takei et al. |
| 2009/0148789 | A1 | 6/2009 | Amara et al. |
| 2009/0162782 | A1 | 6/2009 | Takei et al. |
| 2010/0151384 | A1 | 6/2010 | Konno et al. |
| 2010/0304305 | A1 | 12/2010 | Nakajima et al. |
| 2010/0330505 | A1 | 12/2010 | Nakajima et al. |
| 2011/0287369 | A1 | 11/2011 | Shibayama et al. |
| 2012/0070994 | A1 | 3/2012 | Kanno et al. |

(Continued)

FOREIGN PATENT DOCUMENTS

| | | | |
|---|---|---|---|
| EP | 0 260 976 | A2 | 3/1988 |
| EP | 1 798 599 | A1 | 6/2007 |

(Continued)

OTHER PUBLICATIONS

International Search Report dated Nov. 2, 2009 in corresponding International Application No. PCT/JP2009/064301.

(Continued)

*Primary Examiner* — David M Brunsman
(74) *Attorney, Agent, or Firm* — Oliff PLC

(57) ABSTRACT

There is provided a resist underlayer film forming composition for lithography for forming a resist underlayer film capable of being used as a hard mask or a bottom anti-reflective coating, or a resist underlayer film causing no intermixing with a resist and having a dry etching rate higher than that of the resist. A film forming composition comprising a silane compound having an onium group, wherein the silane compound having an onium group is a hydrolyzable organosilane having, in a molecule thereof, an onium group, a hydrolysis product thereof, or a hydrolysis-condensation product thereof. The composition uses as a resist underlayer film forming composition for lithography. A composition comprising a silane compound having an onium group, and a silane compound having no onium group, wherein the silane compound having an onium group exists in the whole silane compound at a ratio of less than 1% by mol, for example 0.01 to 0.95% by mol. The hydrolyzable organosilane may be a compound of Formula: $R^1_aR^2_bSi(R^3)_{4-(a+b)}$. A resist underlayer film obtained by applying the composition as claimed in any one of claims 1 to 14 onto a semiconductor substrate and by baking the composition.

15 Claims, No Drawings

(56) References Cited

U.S. PATENT DOCUMENTS

| | | | |
|---|---|---|---|
| 2012/0178261 | A1 | 7/2012 | Kanno et al. |
| 2012/0315765 | A1 | 12/2012 | Nakajima et al. |
| 2013/0078814 | A1 | 3/2013 | Shibayama et al. |

FOREIGN PATENT DOCUMENTS

| | | | |
|---|---|---|---|
| EP | 1 855 159 | A1 | 11/2007 |
| EP | 2 249 204 | A1 | 11/2010 |
| JP | A-54-123965 | | 9/1979 |
| JP | A-05-027444 | | 2/1993 |
| JP | A-5-311158 | | 11/1993 |
| JP | A-5-333292 | | 12/1993 |
| JP | A-06-001796 | | 1/1994 |
| JP | A-6-228459 | | 8/1994 |
| JP | A-8-53560 | | 2/1996 |
| JP | A-10-209134 | | 8/1998 |
| JP | A-10-510860 | | 10/1998 |
| JP | A-11-012544 | | 1/1999 |
| JP | A-11-258813 | | 9/1999 |
| JP | A-2000-282014 | | 10/2000 |
| JP | A-2001-93824 | | 4/2001 |
| JP | A-2001-294810 | | 10/2001 |
| JP | A-2004-276603 | | 10/2004 |
| JP | A-2005-70776 | | 3/2005 |
| JP | A-2005-255858 | | 9/2005 |
| JP | A-2006-182688 | | 7/2006 |
| JP | A-2006-272588 | | 10/2006 |
| JP | A-2007-81133 | | 1/2007 |
| JP | A-2007-031627 | | 2/2007 |
| JP | A-2007-241259 | | 9/2007 |
| JP | A-2007-258622 | | 10/2007 |
| JP | A-2008-038131 | | 2/2008 |
| JP | A-2008-519297 | | 6/2008 |
| JP | A-2008-213177 | | 9/2008 |
| JP | A-2008-309929 | | 12/2008 |
| JP | A-2009-244722 | | 10/2009 |
| WO | WO 96/18918 | | 6/1996 |
| WO | WO 98/28366 | A1 | 7/1998 |
| WO | WO 00/01752 | A1 | 1/2000 |
| WO | WO 2004/055598 | A1 | 7/2004 |
| WO | WO 2005/088398 | A1 | 9/2005 |
| WO | WO 2006/093057 | A1 | 9/2006 |
| WO | WO 2007/066597 | A1 | 6/2007 |
| WO | WO 2008/038863 | A1 | 4/2008 |
| WO | WO 2009/034998 | A1 | 3/2009 |
| WO | WO 2009/041511 | A1 | 4/2009 |
| WO | WO 2009/104552 | A1 | 8/2009 |
| WO | WO 2009/111121 | A2 | 9/2009 |
| WO | WO 2009/111122 | A2 | 9/2009 |

OTHER PUBLICATIONS

Mar. 10, 2009 International Search Report issued in Application No. PCT/JP2009/052535.
Feb. 1, 2013 Office Action issued in U.S. Appl. No. 13/681,186.
Mar. 9, 2010 International Search Report issued in International Patent Application No. PCT/JP2009/070984.
May 8, 2012 Search Report issued in European Patent Application No. 09833458.4.
Feb. 7, 2013 Office Action issued in U.S. Appl. No. 13/133,751.
U.S. Appl. No. 13/133,751, filed Aug. 4, 2011.
Jun. 22, 2010 Written Opinion of ISA issued in International Patent Application No. PCT/JP2010/059117 (translation).
Jun. 22, 2010 International Search Report issued in International Patent Application No. PCT/JP2010/059117.
Oct. 19, 2010 International Search Report issued in International Patent Application No. PCT/JP2010/065307.
May 24, 2011 Translation of the Written Opinion issued in PCT/JP2011/053525.
May 24, 2011 Translation of the International Search Report issued in PCT/JP2011/053525.
Jun. 7, 2012 Office Action issued in U.S. Appl. No. 12/867,587.
Mar. 21, 2013 Final Rejection issued in U.S. Appl. No. 12/867,587.
Oct. 18, 2012 Restriction Requirement issued in U.S. Appl. No. 13/133,751.
Dec. 9, 2011 European Search Report issued in Application No. 09712238.6.
U.S. Appl. No. 12/867,587, filed Aug. 13, 2010.
U.S. Appl. No. 13/681,186, filed Nov. 19, 2012.
U.S. Appl. No. 13/375,517, filed Dec. 1, 2011.
U.S. Appl. No. 13/496,768, filed Mar. 16, 2012.
U.S. Appl. No. 13/580,066, filed Aug. 20, 2012.
Notice of Examination Opinion and Search Report dated Feb. 6, 2014 from Taiwanese Patent Application No. 098143678 (with English-language translation).
U.S. Office Action dated Nov. 29, 2013 from U.S. Appl. No. 13/375,517.
U.S. Office Action dated Dec. 3, 2013 from U.S. Appl. No. 13/580,066.
U.S. Office Action dated Oct. 21, 2013 from U.S. Appl. No. 13/681,186.
Office Action cited in U.S. Appl. No. 13/496,768 on Jan. 3, 2014.
Office Action cited in U.S. Appl. No. 13/133,751 on Dec. 26, 2013.
U.S. Office Action dated May 1, 2014 from U.S. Appl. No. 13/580,066.

RESIST UNDERLAYER FILM FORMING COMPOSITION CONTAINING SILICONE HAVING ONIUM GROUP

This application is a 371 filing of PCT/JP2009/064301, filed Aug. 13, 2009.

TECHNICAL FIELD

The present invention relates to a film forming composition for forming a resist underlayer film between a substrate and a resist (for example, a photoresist and an electron beam resist) that are used in the production of semiconductor devices. More specifically, the present invention relates to a resist underlayer film forming composition for lithography for forming a resist underlayer film used as an underlayer of a photoresist in a lithography process of the production of semiconductor devices. Furthermore, the present invention relates to a method of forming a resist pattern using the resist underlayer film forming composition, which is used in the production of semiconductor devices.

BACKGROUND ART

Fine processing of a semiconductor substrate by lithography using a photoresist has been performed in the production of semiconductor devices. The fine processing is a processing method including: forming a thin film of a photoresist on a semiconductor substrate such as a silicon wafer; irradiating the resultant thin film with an active ray such as an ultraviolet ray through a mask pattern in which a pattern of a semiconductor device is depicted for development; and etching the substrate by using the resultant photoresist pattern as a protecting film so as to form fine convexo-concave shapes corresponding to the pattern on the surface of the substrate. Recently, however, high integration of semiconductor devices has progressed and the active ray used tends to have a shorter wavelength, such as an ArF excimer laser (193 nm) replacing a KrF excimer laser (248 nm). Following such a tendency, the influence of reflection of an active ray on a semiconductor substrate has become a major problem. Thus, in order to solve this problem, a method of providing a bottom anti-reflective coating between the photoresist and the substrate has been widely studied. For such a bottom anti-reflective coating, many investigations on an organic bottom anti-reflective coating composed of a polymer having a light absorbing group and the like are performed due to easy use and other reasons. Examples of the coating include an acrylic resin-based bottom anti-reflective coating having both a hydroxy group as a crosslinkable group and a light absorbing group within a single molecule thereof, and a novolac resin-based bottom anti-reflective coating having both a hydroxy group as a crosslinkable group and a light absorbing group within a single molecule thereof.

Examples of the characteristic required for the bottom anti-reflective coating include: having a large absorbance to light or radiation; causing no intermixing with a photoresist (being insoluble in a photoresist solvent); causing no diffusion of low molecule substances from the bottom anti-reflective coating to the photoresist as the upper layer during heating and baking; and having a dry etching rate higher than that of the photoresist.

Furthermore, in recent years, in order to solve a problem of wiring delay that has become apparent as the application of a finer design rule of semiconductor devices has promoted, it has been studied to use copper as a wiring material. Along with that, a dual damascene process has been studied as a wiring forming method for a semiconductor substrate. For this reason, in the dual damascene process, a bottom anti-reflective coating is formed on a substrate having a large aspect ratio in which a via hole is formed. Therefore, the bottom anti-reflective coating used in this process is required to have filling characteristics capable of filling holes without voids, planarization characteristics capable of forming a planar film on the substrate surface, and the like.

As an intermediate film between the semiconductor substrate and the photoresist, a film known as a hard mask containing a metal element such as silicon and titanium (see, for example, Patent Document 1) is used. In this case, the resist and the hard mask have components largely different from each other, so that the removal rates of the resist and the hard mask by dry etching largely depend on the type of a gas used for dry etching. Then, by appropriately selecting the type of a gas, the hard mask can be removed by dry etching without a large decrease in the film thickness of the photoresist.

Thus, in the production of semiconductor devices in recent years, for achieving various effects such as anti-reflection effects, a resist underlayer film has become disposed as an intermediate layer between the semiconductor substrate and the photoresist. Then, also until today, the studies of a composition for a resist underlayer film have been performed. However, due to the diversity of characteristics required for the composition and the like, the development of a novel material for the resist underlayer film is desired.

For example, there is disclosed a composition or a pattern forming method using a compound having a silicon-silicon bond (see, for example, Patent Document 2).

There is disclosed a bottom anti-reflective coating forming composition containing an isocyanate group or a blocked isocyanate group (see, for example, Patent Document 3).

There is disclosed a hard mask material using a polycarbosilane-containing resin (for example, Patent Document 4 and Patent Document 5).

There is disclosed a silica-based coating film forming composition containing a siloxane polymer, a solvent, and a cyclic basic compound (see, for example, Patent Document 6 and Patent Document 7).

RELATED-ART DOCUMENT

Patent Document

Patent Document 1: Japanese Patent Application Publication No. JP-A-11-258813

Patent Document 2: Japanese Patent Application Publication No. JP-A-10-209134

Patent Document 3: International Publication No. WO 2000/001752 pamphlet

Patent Document 4: Japanese Patent Application Publication No. JP-A-2001-93824

Patent Document 5: Japanese Patent Application Publication No. JP-A-2005-70776

Patent Document 6: Japanese Patent Application Publication No. JP-A-2007-081133

Patent Document 7: International Publication No. WO 2006/093057 pamphlet

DISCLOSURE OF THE INVENTION

Problem to be Solved by the Invention

It is an object of the present invention to provide a film forming composition. More in detail, it is an object of the present invention to provide a resist underlayer film for lithography capable of being used in the production of a semiconductor device and a forming composition for the resist underlayer film. It is also an object of the present invention to provide a resist underlayer film forming composition for lithography for forming a resist underlayer film capable of being used as a hard mask. Further, it is an object of the present invention to provide a resist underlayer film forming composition for lithography for forming a resist underlayer film capable of being used as a bottom anti-reflective coating. Furthermore, it is an object of the present invention to provide a resist underlayer film for lithography causing no intermixing with a resist and having a dry etching rate higher than that of the resist, and a resist underlayer film forming composition for forming the underlayer film.

Then, it is another object of the present invention to provide a resist pattern forming method using the resist underlayer film forming composition for lithography, which is used in the production of a semiconductor device.

Means for Solving the Problem

The present invention provides, according to a first aspect, a film forming composition containing a silane compound having an onium group, in which the silane compound having an onium group is a hydrolyzable organosilane having, in a molecule thereof, an onium group, a hydrolysis product thereof, or a hydrolysis-condensation product thereof, according to a second aspect, a resist underlayer film forming composition for lithography containing a silane compound having an onium group, in which the silane compound having an onium group is a hydrolyzable organosilane having, in a molecule thereof, an onium group, a hydrolysis product thereof, or a hydrolysis-condensation product thereof, according to a third aspect, the composition according to the first aspect or the second aspect containing: a silane compound having an onium group: and a silane compound having no onium group in which the silane compound having an onium group exists in the whole silane compound at a ratio of less than 1% by mol, according to a fourth aspect, the composition according to the first aspect or the second aspect containing: a silane compound having an onium group; and a silane compound having no onium group, in which the silane compound having an onium group exists in the whole silane compound at a ratio of 0.01 to 0.95% by mol, according to a fifth aspect, the composition according to any one of the first aspect to the fourth aspect, in which the hydrolyzable organosilane is a compound of Formula (1):

$$R^1_aR^2_bSi(R^3)_{4-(a+b)}$$ Formula (1)

(where $R^1$ is an onium group or an organic group containing an onium group, and is a group bonded to a silicon atom through a Si—N bond, a Si—P bond, a Si—S bond, or a Si—C bond; $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond; $R^3$ is an alkoxy group, an acyloxy group, or a halogen group; and a is an integer of 1 or 2, and b is an integer of 0 or 1, where a+b is an integer of 1 or 2), according to a sixth aspect, the composition according to any one of the first aspect to the fifth aspect, in which the onium group is an ammonium group, a sulfonium group, an iodonium group, or a phosphonium group, according to a seventh aspect, the composition according to any one of the first aspect to the fifth aspect, in which the onium group is a cyclic ammonium group or a linear ammonium group, according to an eighth aspect, the composition according to any one of the first aspect to the fifth aspect, in which the onium group is a tertiary ammonium group or a quaternary ammonium group, according to a ninth aspect, the composition according to the seventh aspect, in which the cyclic ammonium group is an aromatic heterocyclic ammonium group of Formula (2):

Formula (2)

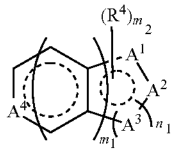

[where $A^1$, $A^2$, $A^3$, and $A^4$ are individually a group of Formula (3):

Formula (3)

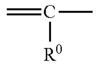

(where $R^0$s are individually a single bond, a hydrogen atom, an alkyl group, an aryl group, an aralkyl group, or an alkenyl group), Formula (4), or Formula (4'):

Formula (4)

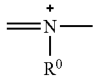

Formula (4')

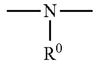

(where $R^0$s are individually a single bond, a hydrogen atom, an alkyl group, an aryl group, an aralkyl group, or an alkenyl group), where at least one of $A^1$ to $A^4$ is a group of Formula (4); the substituent $R^4$s are individually an alkyl group, an aryl group, an aralkyl group, an alkenyl group, a hydroxy group, or a combination thereof, where $R^4$s may form a ring with each other; $n_1$ is an integer of 1 to 8; $m_1$ is an integer of 0 or 1; and $m_2$ is 0 or 0 or an integer of 1 to a maximum number of $R^4$s that are substituted on a monocycle or a polycycle], or an aliphatic heterocyclic ammonium group of Formula (5):

Formula (5)

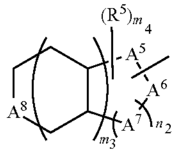

[where $A^5$, $A^6$, $A^7$, and $A^8$ are individually a group of Formula (6):

Formula (6)

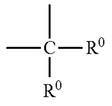

(where $R^0$s are individually a single bond, a hydrogen atom, an alkyl group, an aryl group, an aralkyl group, or an alkenyl group), Formula (7), or Formula (7'):

Formula (7)

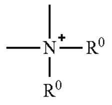

Formula (7')

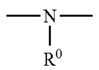

(where $R^0$s are individually a single bond, a hydrogen atom, an alkyl group, an aryl group, an aralkyl group, or an alkenyl group), where at least one of $A^5$ to $A^8$ is a group of Formula (7); the substituent $R^5$s are individually an alkyl group, an aryl group, an aralkyl group, an alkenyl group, a hydroxy group, or a combination thereof, where $R^5$s optionally form a ring with each other; $n_2$ is an integer of 1 to 8; $m_3$ is an integer of 0 or 1; and $m_4$ is 0 or an integer of 1 to a maximum number of $R^5$s that are substituted on a monocycle or a polycycle], according to a tenth aspect, the composition according to the seventh aspect, in which the linear ammonium group is a linear ammonium group of Formula (8):

Formula (8)

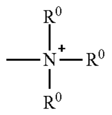

(where $R^0$s are individually a hydrogen atom, an alkyl group, an aryl group, an aralkyl group, or an alkenyl group), according to an eleventh aspect, the composition according to the third aspect or the fourth aspect containing: a combination of the hydrolyzable organosilane of Formula (1) as described in the fifth aspect with at least one of organosilicon compound selected from a group consisting of compounds of Formula (9) and Formula (10):

$$R^6_aSi(R^7)_{4-a} \qquad \text{Formula (9)}$$

(where $R^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond; $R^7$ is an alkoxy group, an acyloxy group, or a halogen group; and a is an integer of 0 to 3), $$[R^8_cSi(R^9)_{3-c}]_2Y_b \qquad \text{Formula (10)}$$

(where $R^8$ is an alkyl group bonded to a silicon atom through a Si—C bond; $R^9$ is an alkoxy group, an acyloxy group, or a halogen group; Y is an alkylene group or an arylene group; b is an integer of 0 or 1; and c is an integer of 0 or 1); a hydrolysis product thereof; or a hydrolysis-condensation product thereof, according to a twelfth aspect, the composition according to the eleventh aspect containing: a hydrolysis-condensation product of the hydrolyzable organosilane of Formula (1) as described in the fifth aspect; or a hydrolysis-condensation product of a combination of the hydrolyzable organosilane of Formula (1) as described in the fifth aspect with the organosilicon compound of Formula (9) as described in the eleventh aspect, according to a thirteenth aspect, the composition according to any one of the first aspect to the twelfth aspect further containing an acid as a hydrolysis catalyst, according to a fourteenth aspect, the composition according to any one of the first aspect to the thirteenth aspect further containing water, according to a fifteenth aspect, a resist underlayer film obtained by applying the composition as described in any one of the first aspect to the fourteenth aspect onto a semiconductor substrate and by baking the composition, according to a sixteenth aspect, a method of forming a resist pattern used in a production of a semiconductor device, including: applying the composition as described in any one of the first aspect to the fourteenth aspect onto a semiconductor substrate and baking the composition to form a resist underlayer film; applying a resist composition onto the resist underlayer film to form a resist film; exposing the resist film to light; developing the exposed resist film to obtain a resist pattern; etching the resist underlayer film according to the resist pattern; and processing the semiconductor substrate according to the patterned resist underlayer film, and according to a seventeenth aspect, a method of forming a resist pattern used in a production of a semiconductor device, including: forming an underlayer organic film on a semiconductor substrate; applying the composition as described in any one of the first aspect to the fourteenth aspect onto the underlayer organic film and baking the composition to form a resist underlayer film; applying a resist composition onto the resist underlayer film to form a resist film; exposing the resist film to light; developing the exposed resist to obtain a resist pattern; etching the resist underlayer film according to the resist pattern; etching the underlayer organic film according to the patterned resist underlayer film; and processing the semiconductor substrate according to the patterned underlayer organic film.

Effects of the Invention

In the present invention, the resist underlayer film is formed by an applying method either on a substrate or on an underlayer organic film formed on a substrate, and on the resist underlayer film, a resist film (for example, a photoresist or an electron beam resist) is formed. Then, a resist pattern is fanned by exposure and development, and either by dry etching the resist underlayer film using the resist pattern to transfer the pattern, the substrate is processed by the transferred pattern, or by etching the underlayer organic film on the substrate using the pattern to transfer the pattern, the substrate is processed by the pattern of the etched underlayer organic film.

In forming a fine pattern, for preventing a pattern collapse, the resist film thickness tends to become smaller. Due to the thinning of the resist, the dry etching for transferring the pattern to a film existing as an underlayer of the resist cannot transfer the pattern unless the etching rate of the underlayer film is higher than that of the upper layer film. In the present invention, the substrate is coated with the resist underlayer film (containing an inorganic silicon-based compound) of the present invention either with or without an underlayer organic film interposed therebetween and then the resist underlayer film is coated with a resist film (an organic resist film). An organic component film and an inorganic component film have dry etching rates largely different from each other depending on the selection of the etching gas such that the dry etching rate of the organic component film is enhanced by using an oxygen-based gas and the dry etching rate of the inorganic component film is enhanced by using a halogen-based gas.

For example, there is formed a resist pattern that is transferred to the resist underlayer film of the present invention existing as the underlayer of the resist pattern by dry etching the resist underlayer film with a halogen-based gas, and the substrate is processed with a halogen-based gas according to the pattern transferred to the resist underlayer film. Alternatively, by dry etching the underlayer organic film existing as the underlayer of the resist underlayer film to which the pattern is transferred with an oxygen-based gas using the resist underlayer film, the pattern is transferred to the underlayer organic film, and the substrate is processed with a halogen-based gas according to the pattern transferred to the underlayer organic film.

In the present invention, the resist underlayer film functions as a hard mask and a hydrolyzable group in the structure of Formula (1) such as an alkoxy group, an acyloxy group, and a halogen group is hydrolyzed or partially hydrolyzed to generate a silanol group and forms thereafter a polymer in a polysiloxane structure by a condensation reaction of the silanol group. The polymer having a polysiloxane structure has a satisfactory function as a hard mask.

The hydrolyzable organosilane compound of Formula (1) having an onium group used in the present invention forms a polyorganosiloxane by hydrolysis and a subsequent condensation reaction.

It is considered that an onium group such as an ammonium group also acts as a catalyst for accelerating the formation of a polysiloxane by condensing a silanol group generated by the hydrolysis of a hydrolyzable group of a hydrolyzable silane. The hydrolyzable organosilane used in the present invention contains, in the molecule thereof, an onium group such as an ammonium group, so that the onium group such as an ammonium group exhibits a catalyst action when a dehydration-condensation of a silanol group progresses for forming a polyorganosiloxane.

The bonding moiety contained in the polyorganosiloxane has a carbon-nitrogen bond or a carbon-oxygen bond, which has a dry etching rate by a halogen-based gas higher than that of a carbon-carbon bond, so that the bonding moiety is effective for transferring an upper layer resist pattern to the resist underlayer film.

The polyorganosiloxane (resist underlayer film) is effective as a hard mask used for etching an underlayer organic film existing under the resist underlayer film or for processing (etching) the substrate. In other words, the polyorganosiloxane has satisfactory dry etching resistance during the substrate processing or relative to an oxygen-based dry etching gas used for etching the underlayer organic film.

The resist underlayer film of the present invention possesses an ability of enhancing the dry etching rate relative to the upper layer resist, and dry etching resistance during the substrate processing or the like.

A resist underlayer film formed from the resist underlayer film forming composition of the present invention may have an absorption relative to a wavelength of a light used in a lithography process, and can suitably be used as a bottom anti-reflective coating having an effect of preventing a reflection light on a substrate.

Further, a film or a resist underlayer film formed from the film forming composition or the resist underlayer film forming composition of the present invention has resistance against a solvent used for a resist composition, so that they can suitably be used as a resist underlayer film.

BEST MODES FOR CARRYING OUT THE INVENTION

The present invention provides a film forming composition containing a silane compound having an onium group in which the silane compound having an onium group is a hydrolyzable organosilane having an onium group in the molecule thereof, a hydrolysis product thereof, or a hydrolysis-condensation product thereof.

Further, the present invention provides a resist underlayer film forming composition for lithography containing a silane compound having an onium group in which the silane compound having an onium group is a hydrolyzable organosilane having an onium group in the molecule thereof, a hydrolysis product thereof, or a hydrolysis-condensation product thereof.

The composition provided by the present invention may be a composition containing a silane compound having an onium group and a silane compound having no onium group in which the silane compound having an onium group is contained at a ratio of less than 1% by mole relative to the total silane compounds.

Further, the composition provided by the present invention may be a composition containing a silane compound having an onium group and a silane compound having no onium group in which the silane compound having an onium group is contained at a ratio of 0.01 to 0.95% by mole relative to the total silane compounds. With such a content range, a pattern shape obtained by a lithography process becomes advantageous.

Then, the hydrolyzable organosilane, the hydrolysis product thereof, and the hydrolysis-condensation product thereof may be used in a combination thereof. The hydrolyzable organosilane is hydrolyzed to obtain a hydrolysis product thereof and the obtained hydrolysis product is condensed to obtain a condensation product thereof, so that the hydrolyzable organosilane may also be used as a hydrolysis-condensation product thereof. When obtaining the hydrolysis-condensation product thereof, a partial-hydrolysis product produced by an imperfect hydrolysis or a silane compound may be mixed in the hydrolysis-condensation product thereof. This condensation product is a polymer having a polysiloxane structure. To this polysiloxane structure, an onium group or an organic group containing an onium group is bonded.

The resist underlayer film forming composition of the present invention contains a hydrolyzable organosilane having an onium group, a hydrolysis product thereof, or a hydrolysis-condensation product thereof, and a solvent. Then, the resist underlayer film forming composition of the present invention may contain, as optional components, an acid, water, an alcohol, a curing catalyst, an acid generator, other organic polymers, a light-absorptive compound, a surfactant, and the like.

The solid content of the resist underlayer film forming composition of the present invention is, for example 0.5 to 50% by mass, 1 to 30% by mass, or 1 to 25% by mass. Here, the solid content is a component remaining after subtracting a solvent component from the whole component of the (resist underlayer film) film forming composition.

The ratio constituted by the hydrolyzable organosilane, a hydrolysis product thereof, and a hydrolysis-condensation product thereof in the solid content is 20% by mass or more, for example 50 to 100% by mass, 60 to 100% by mass, or 70 to 100% by mass.

The hydrolyzable organosilane having an onium group used in the present invention has a structure of Formula (1).

In Formula (1), $R^1$ is an onium group or an organic group containing an onium group, and is a group bonded to a silicon atom through a Si—N bond, a Si—P bond, a Si—S bond, or a Si—C bond. $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond. $R^3$ is an alkoxy group, an acyloxy group, or a halogen group. a is an integer of 1 or 2, and b is an integer of 0 or 1, where a+b is an integer of 1 or 2.

The alkyl group as $R^2$ in Formula (1) is a linear or branched $C_{1-10}$ alkyl group and examples of the alkyl group include a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

As the alkyl group, a cyclic alkyl group can also be used and examples of the cyclic alkyl group include $C_{1-10}$ cyclic alkyl groups such as a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, cyclohexyl, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl-ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl-ethenyl group, a 1,3-dimethyl-1-butenyl group, a 1,3-dimethyl-2-butenyl group, a 1,3-dimethyl-3-butenyl group, a 1-isobutyl-ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl-ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the alkenyl group also include organic groups in which the groups mentioned above are substituted with a halogen atom such as fluorine, chlorine, bromine, and iodine.

Examples of the organic group having an epoxy group include a glycidoxymethyl group, a glycidoxyethyl group, a glycidoxypropyl group, a glycidoxybutyl group, and an epoxycyclohexyl group.

Examples of the organic group having an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having a cyano group include a cyanoethyl group and a cyanopropyl group.

Examples of the $C_{1-20}$ alkoxy group as $R^3$ in Formula (1) include $C_{1-20}$ alkoxy groups having a linear, branched, or cyclic alkyl portion such as a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group as $R^3$ include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of the $C_{1-20}$ acyloxy group as $R^3$ in Formula (1) include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, 2,2-dimethyl-n-butylcarbonyloxy, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of the halogen group as $R^3$ in Formula (1) include fluorine, chlorine, bromine, and iodine.

As the hydrolyzable organosilane of Formula (1), commercial products may be used.

Examples of the onium group used in the present invention include: groups such as an ammonium group, a phosphonium group, a sulfonium group, and an iodonium group; and organic groups containing these groups.

As the onium group, structures of a cyclic ammonium group and a linear ammonium group can be used.

As the onium group, a tertiary ammonium group or a quaternary ammonium group can be used.

$R^1$ in Formula (1) is an onium group or an organic group containing an onium group. When the onium group is a cyclic ammonium group, a nitrogen atom constituting the ammonium group is also an atom constituting a ring. There is a case where a ring-constituting nitrogen atom is bonded to a silicon atom directly or through a divalent linking group. There is also a case where a ring-constituting carbon atom is bonded to a silicon atom directly or through a divalent linking group.

Examples of the cyclic ammonium group include aromatic heterocyclic ammonium groups of Formula (2).

In Formula (2), $A^1$, $A^2$, $A^3$, and $A^4$ are individually a group of Formula (3), Formula (4), or Formula (4'), where at least one of $A^1$ to $A^4$ is a group of Formula (4) and the rest may be a group of Formula (3) or Formula (4'). Examples of $R^0$ in Formula (3), Formula (4), or Formula (4') include a single bond, a hydrogen atom, an alkyl group, an aryl group, an aralkyl group, and an alkenyl group. Here, when $R^0$ in Formula (3), Formula (4), or Formula (4') is a single bond, the bond is a bond linking to a silicon atom in Formula (1) or a double bond formed between adjacent ring atoms. Examples of the substituent $R^4$ include an alkyl group, an aryl group, an aralkyl group, an alkenyl group, a hydroxy group, and a combination thereof. $R^4$s together may form a ring. Depending on to which atom of $A^1$ to $A^4$ a linking group bonded to a silicon atom is bonded, it is determined whether a bond between any one of $A^1$ to $A^4$ and a ring-forming atom adjacent to the any one is a single bond or a double bond. In other words, whether the bond is a single bond or a double bond is determined by the valence of each atom so that the ring exhibits aromaticity. As the organic group, those exemplified in Formula (1) can be used.

Examples of the aralkyl group include $C_{7-20}$ aralkyl groups such as a benzyl group, an o-methylbenzyl group, an m-methylbenzyl group, a p-methylbenzyl group, an o-chlorobenzyl group, an m-chlorobenzyl group, a p-chlorobenzyl group, an o-fluorobenzyl group, a p-fluorobenzyl group, an o-methoxybenzyl group, a p-methoxybenzyl group, a p-nitrobenzyl group, a p-cyanobenzyl group, a phenethyl group, an o-methylphenethyl group, an m-methylphenethyl group, a p-methylphenethyl group, an o-chlorophenethyl group, an m-chlorophenethyl group, an p-chlorophenethyl group, an o-fluorophenethyl group, a p-fluorophenethyl group, an o-methoxyphenethyl group, a p-methoxyphenethyl group, a p-nitrophenethyl group, a p-cyanophenethyl group, a 3-phenylpropyl group, a 4-phenylbutyl group, a 5-phenylpentyl group, a 6-phenylhexyl group, an α-naphthylmethyl group, a β-naphthylmethyl group, an o-biphenylylmethyl group, an m-biphenylylmethyl group, a p-biphenylylmethyl group, a 1-anthrylmethyl group, a 2-anthrylmethyl group, a 9-anthrylmethyl group, a 1-phenanthrylmethyl group, a 2-phenanthrylmethyl group, a 3-phenanthrylmethyl group, a 4-phenanthrylmethyl group, a 9-phenanthrylmethyl group, an α-naphthylethyl group, a β-naphthylethyl group, an o-biphenylylethyl group, an m-biphenylylethyl group, a p-biphenylylethyl group, a 1-anthrylethyl group, a 2-anthrylethyl group, a 9-anthrylethyl group, a 1-phenanthrylethyl group, a 2-phenanthrylethyl group, a 3-phenanthrylethyl group, a 4-phenanthrylethyl group, and a 9-phenanthrylethyl group.

With respect to each atom of $A^1$ to $A^4$, there are, depending on the bonding state of each of $A^1$ to $A^4$, a case where each of $A^1$ to $A^4$ has a hydrogen atom and another case where each of $A^1$ to $A^4$ has no hydrogen atom. Then, when each of $A^1$ to $A^4$ has a hydrogen atom, the substituent $R^4$ can be replaced by a hydrogen atom.

Accordingly, m2 is 0 or is selected from integers of 1 to a maximum number of $R^4$s by which $R^4$s are convertible into a monocycle or a polycycle. $n_1$ is selected from integers of 1 to 8. $m_1$ is selected from integers of 0 and 1. When $n_1$ is 1, a 5-membered ring is formed; when $n_1$ is 2, a 6-membered ring is formed; when $n_1$ is 3, a 7-membered ring is formed; when $n_1$ is 4, an 8-membered ring is formed; when $n_1$ is 5, a 9-membered ring is formed; when $n_1$ is 6, a 10-membered ring is formed; when $n_1$ is 7, an 11-membered ring is formed; and when $n_1$ is 8, a 12-membered ring is formed. When $m_1$ is 0, the cyclic ammonium group is a monocycle and when $m_1$ is 1, the cyclic amino group is a condensed ring. To an arbitrary carbon atom or an arbitrary nitrogen atom existing in the monocycle or the condensed ring, a silicon atom or a linking group bonded to a silicon atom is bonded to form a cyclic ammonium group or an organic group containing a cyclic ammonium group.

Examples of the divalent linking group between a cyclic ammonium group and a silicon atom in the organic group containing a cyclic ammonium group include an alkylene group, an arylene group, and an alkenylene group.

Examples of the alkylene group include $C_{1-10}$ alkylene groups such as a methylene group, an ethylene group, a propylene group, an isopropylene group, a butylene group, and an octylene group. A divalent organic group derived from the linear or branched alkyl groups exemplified above may be used as the alkylene group.

Examples of the alkylene group also include $C_{3-20}$ cycloalkylene groups such as a cyclopropylene group, a cyclobutylene group, and a cyclohexene group. A divalent organic group derived from the cyclic alkyl groups exemplified above may be used as the alkylene group.

Examples of the arylene group include $C_{6-20}$ arylene groups such as a phenylene group, a naphthylene group, and an anthralene group. A divalent organic group derived from the aryl groups exemplified above may be used as the arylene group.

As the alkenylene group, a divalent organic group derived from the alkenyl groups exemplified above may be used.

Examples of the hydrolyzable organosilane of Formula (1) having an aromatic heterocyclic ammonium group of Formula (2) are shown below.

Formula (I-1)

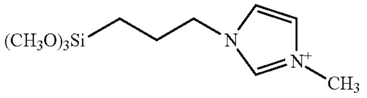

Formula (I-2)

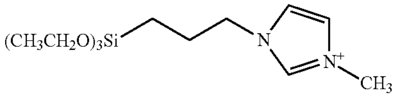

Formula (I-3)

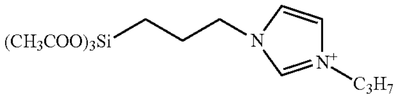

Formula (I-4)

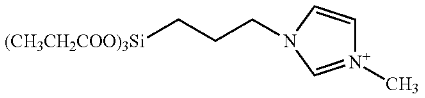

Formula (I-5)

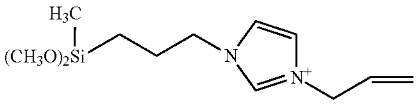

Formula (I-6)

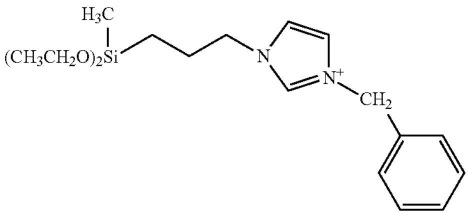

Formula (I-7)

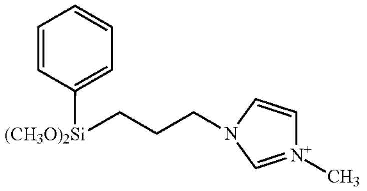

Formula (I-8)

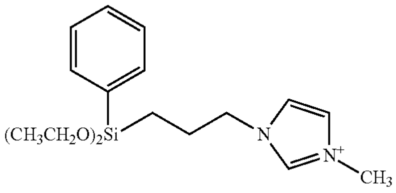

Formula (I-9)

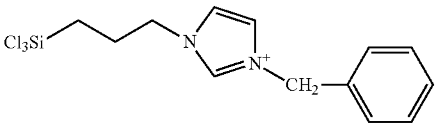

Formula (I-10)

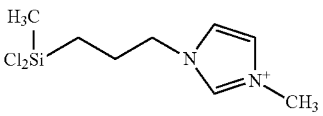

-continued
Formula (I-12)
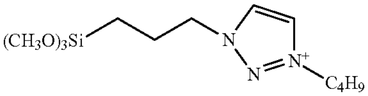
Formula (I-13)
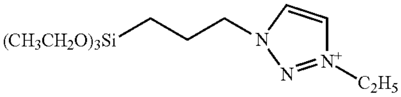
Formula (I-14)
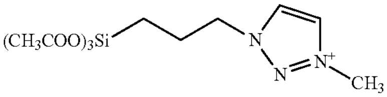
Formula (I-15)
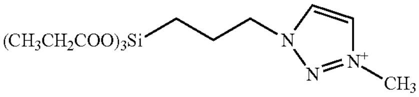
Formula (I-16)
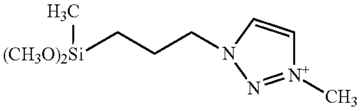
Formula (I-17)
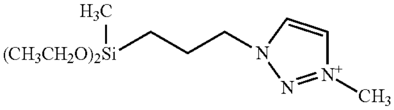
Formula (I-18)
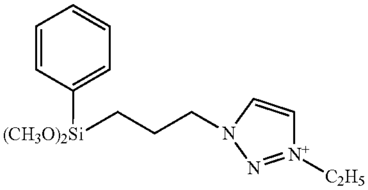
Formula (I-19)
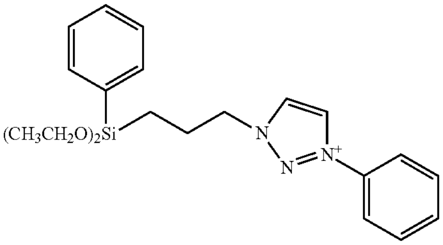
Formula (I-20)
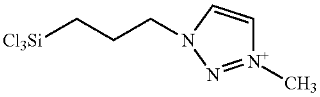
Formula (I-21)
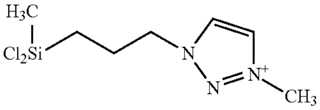
Formula (I-22)
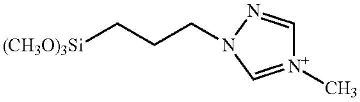
-continued
Formula (I-23)
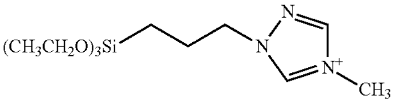
Formula (I-24)
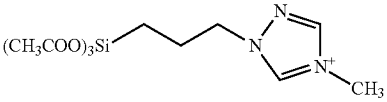
Formula (I-25)
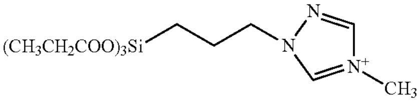
Formula (I-26)
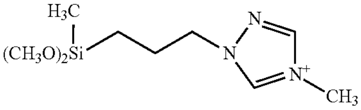
Formula (I-27)
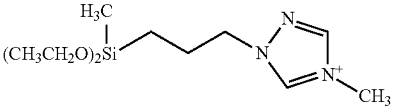
Formula (I-28)
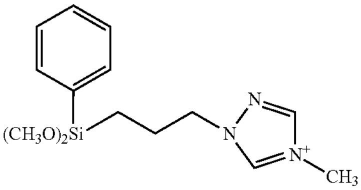
Formula (I-29)
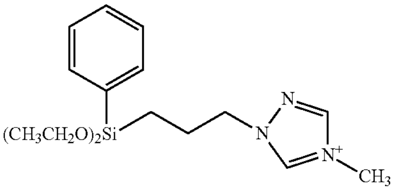
Formula (I-30)
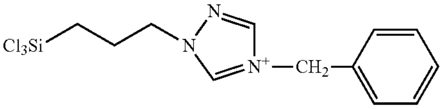
Formula (I-31)
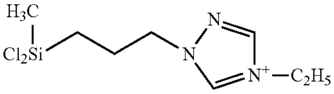
Formula (I-32)
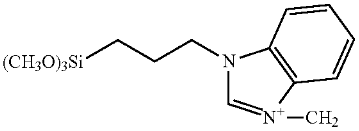
Formula (I-33)
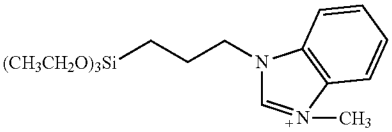

-continued

Formula (I-34)

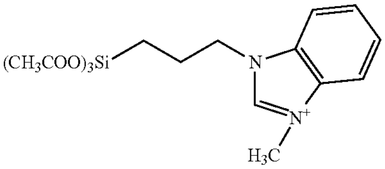

Formula (I-35)

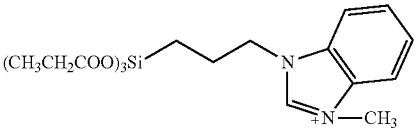

Formula (I-36)

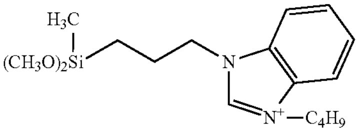

Formula (I-37)

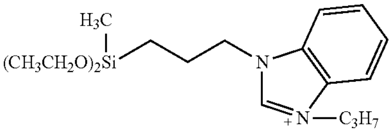

Formula (I-38)

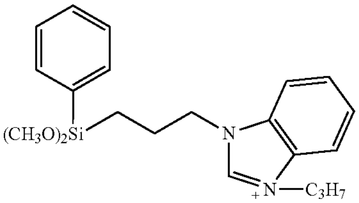

Formula (I-39)

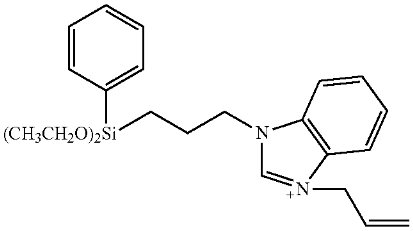

Formula (I-40)

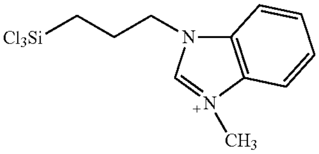

Formula (I-41)

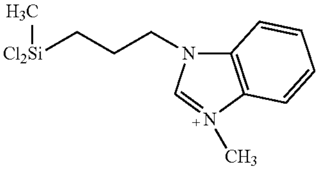

Formula (I-42)

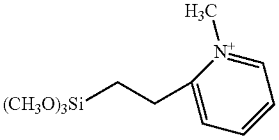

-continued

Formula (I-43)

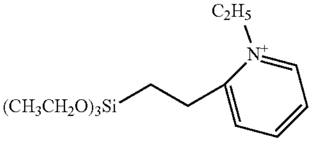

Formula (I-44)

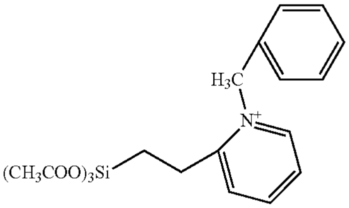

Formula (I-45)

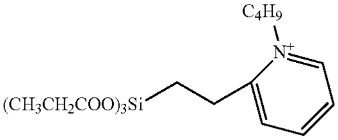

Formula (I-46)

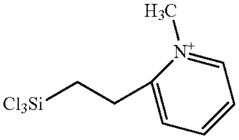

Formula (I-47)

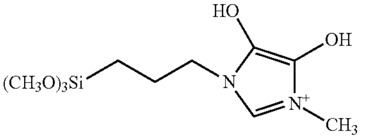

Formula (I-48)

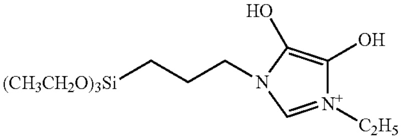

Formula (I-49)

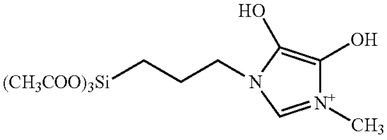

Formula (I-50)

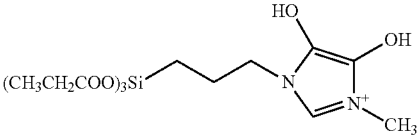

Formula (I-51)

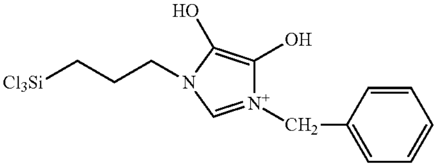

Examples of the cyclic ammonium group include aliphatic heterocyclic ammonium groups of Formula (5).

In the aliphatic heterocyclic ammonium group of Formula (5), $A^5$, $A^6$, $A^7$, and $A^8$ are individually a group of Formula (6), Formula (7), or Formula (7'), where at least one of $A^5$ to $A^8$ is a group of Formula (7) and the rest may be a group of Formula (6) or Formula (7'). Examples of $R^0$ in Formula (6), Formula (7), or Formula (7') include a single bond, a hydrogen atom, an alkyl group, an aryl group, an aralkyl group, and an alkenyl group. Here, when $R^0$ in Formula (6), Formula (7), or Formula (7') is a single bond, the bond is a bond linking to a silicon atom in Formula (1) or a double bond formed between adjacent ring atoms. As the organic group, the above-exemplified groups may be used. Examples of the substituent $R^5$ include an alkyl group, an aryl group, an aralkyl group, an alkenyl group, a hydroxy group, and a combination thereof. $R^5$s together may form a ring. When $R^5$s together form a ring, $R^5$s form a crosslinking ring structure such as a cyclic ammonium having an adamantane ring, a norbornene ring, or a spiro ring.

Depending on to which atom of $A^5$ to $A^8$ a linking group bonded to a silicon atom is bonded, it is determined whether a bond between any one of $A^5$ to $A^8$ and a ring-forming atom adjacent to the any one is a single bond or a double bond. In other words, whether the bond is a single bond or a double bond is determined by the valence of each atom so that the ring exhibits non-aromaticity.

With respect to each atom of $A^5$ to $A^8$, there are, depending on the bonding state of each of $A^5$ to $A^8$, a case where each of $A^5$ to $A^8$ has a hydrogen atom and another case where each of $A^5$ to $A^8$ has no hydrogen atom. Then, when each of $A^5$ to $A^8$ has a hydrogen atom, the substituent $R^5$ can be replaced by a hydrogen atom. Accordingly, $m_4$ is 0 or is selected from integers of 1 to a maximum number of $R^5$s by which $R^5$s are convertible into a monocycle or a polycycle. $n_2$ is selected from integers of 1 to 8. $m_3$ is selected from integers of 0 and 1. When $n_2$ is 1, a 5-membered ring is formed; when $n_2$ is 2, a 6-membered ring is formed; when $n_2$ is 3, a 7-membered ring is formed; when $n_2$ is 4, an 8-membered ring is formed; when $n_2$ is 5, a 9-membered ring is formed; when $n_2$ is 6, a 10-membered ring is formed; when $n_2$ is 7, an 11-membered ring is formed; and when $n_2$ is 8, a 12-membered ring is formed. When $m_3$ is 0, the cyclic ammonium group is a monocycle and when $m_3$ is 1, the cyclic ammonium group is a condensed ring. To an arbitrary carbon atom or an arbitrary nitrogen atom existing in the monocycle or the condensed ring, a silicon atom or a linking group bonded to a silicon atom is bonded to form a cyclic ammonium or an organic group containing a cyclic ammonium. Examples of the divalent linking group between a cyclic ammonium and a silicon atom in the organic group containing a cyclic ammonium include an alkylene group, an arylene group, and an alkenylene group.

Examples of the alkylene group include $C_{1-10}$ alkylene groups such as a methylene group, an ethylene group, a propylene group, an isopropylene group, a butylene group, and an octylene group. A divalent organic group derived from the linear or branched alkyl groups exemplified above may be used as the alkylene group.

Examples of the alkylene group also include $C_{3-20}$ cycloalkylene groups such as a cyclopropylene group, a cyclobutylene group, and a cyclohexene group. A divalent organic group derived from the cyclic alkyl groups exemplified above may be used as the alkylene group.

Examples of the arylene group include $C_{6-20}$ arylene groups such as a phenylene group, a naphthylene group, and an anthralene group. A divalent organic group derived from the aryl groups exemplified above may be used as the arylene group.

As the alkenylene group, a divalent organic group derived from the alkenyl groups exemplified above may be used as the alkenylene group.

Examples of the hydrolyzable organosilane of Formula (1) having an aliphatic heterocyclic ammonium group of Formula (5) are shown below.

Formula (II-1)

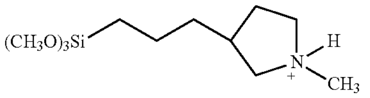

Formula (II-2)

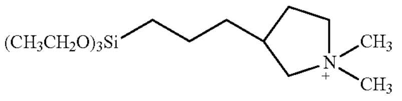

Formula (II-3)

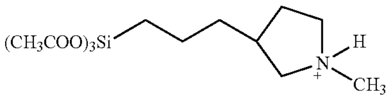

Formula (II-4)

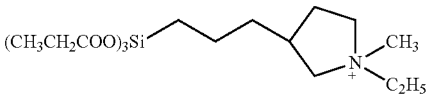

Formula (II-5)

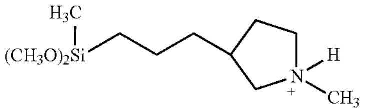

Formula (II-6)

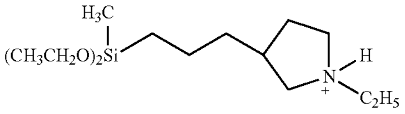

Formula (II-7)

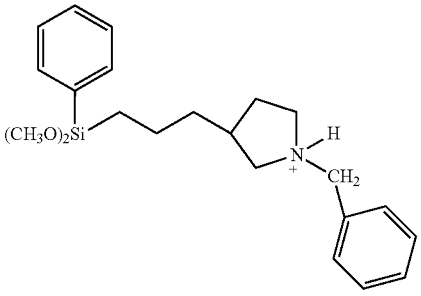

Formula (II-8)

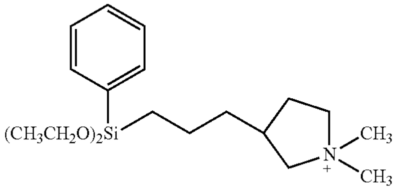

Formula (II-9)

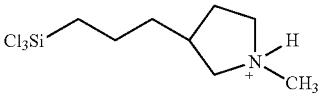

Formula (II-10)

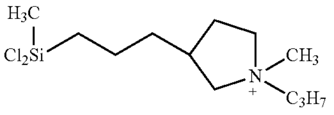

-continued

Formula (II-12)

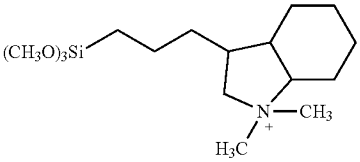

Formula (II-13)

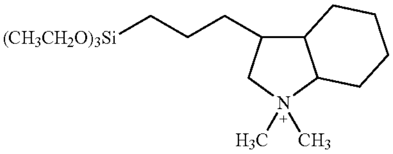

Formula (II-14)

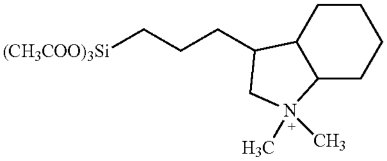

Formula (II-15)

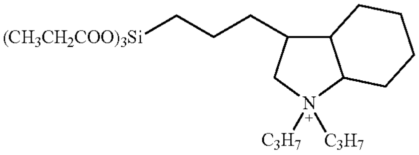

Formula (II-16)

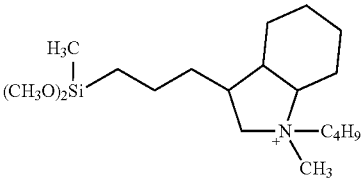

Formula (II-17)

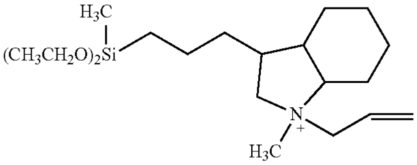

Formula (II-18)

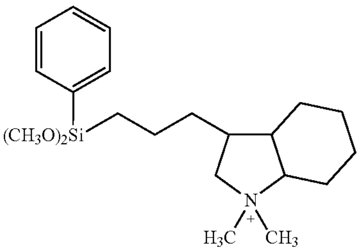

Formula (II-19)

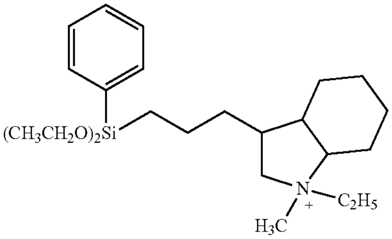

-continued

Formula (II-20)

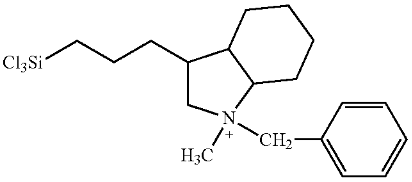

Formula (II-21)

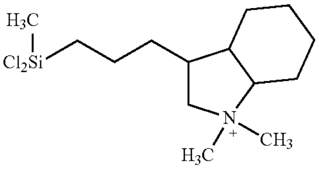

Formula (II-22)

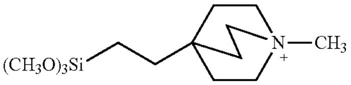

Formula (II-23)

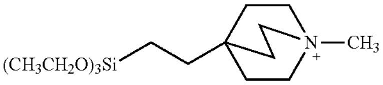

Formula (II-24)

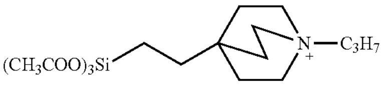

Formula (II-25)

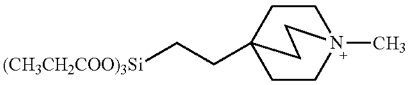

Formula (II-26)

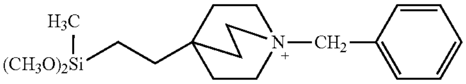

Formula (II-27)

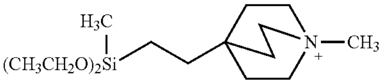

Formula (II-28)

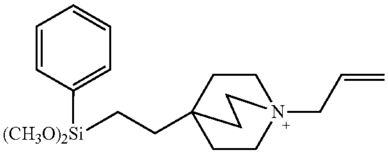

Formula (II-29)

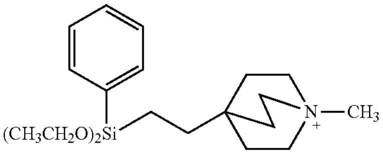

Formula (II-30)

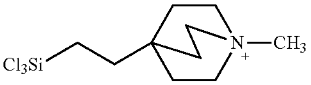

Formula (II-31)

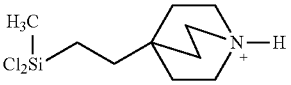

The hydrolyzable organosilane of Formula (1) has, in the molecule thereof, an ammonium group of Formula (8) or an organic group having an ammonium group of Formula (8).

$R^0$ in Formula (8) is a hydrogen atom, an alkyl group, an aryl group, an aralkyl group, or an alkenyl group. Examples thereof include the above-described organic groups.

Examples of the hydrolyzable organosilane of Formula (1) having a linear ammonium group of Formula (8) are shown below.

Formula (III-1)

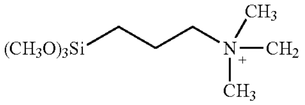

Formula (III-2)

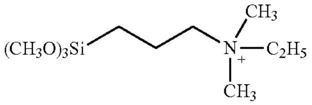

Formula (III-3)

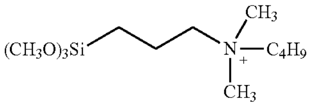

Formula (III-4)

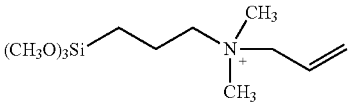

Formula (III-5)

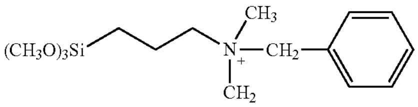

Formula (III-6)

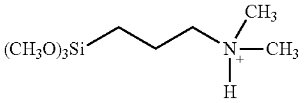

Formula (III-7)

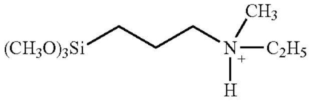

Formula (III-8)

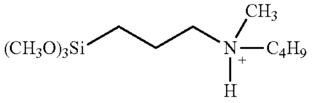

Formula (III-9)

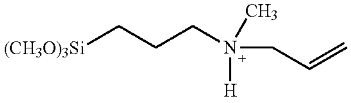

Formula (III-10)

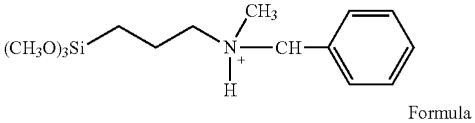

Formula (III-11)

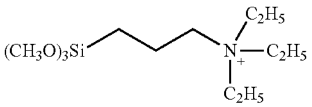

Formula (III-12)

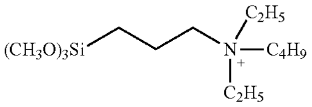

-continued

Formula (III-13)

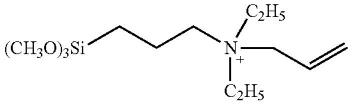

Formula (III-14)

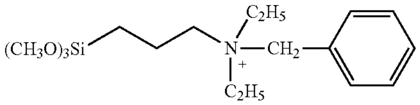

Formula (III-15)

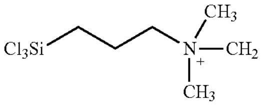

Formula (III-16)

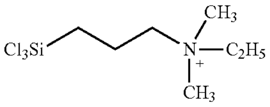

Formula (III-17)

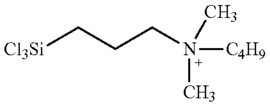

Formula (III-18)

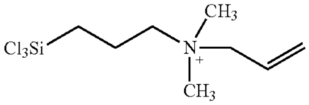

Formula (III-19)

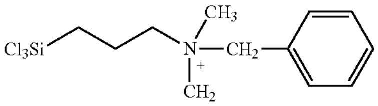

Formula (III-20)

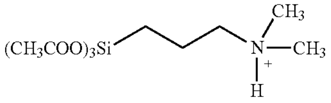

Formula (III-21)

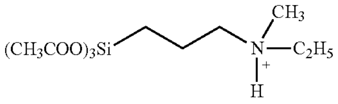

Formula (III-22)

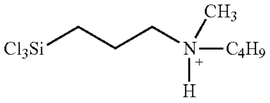

Formula (III-23)

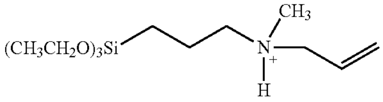

Formula (III-24)

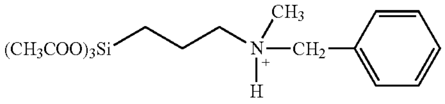

Formula (III-25)

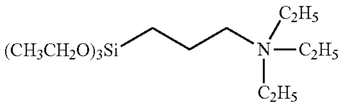

-continued
Formula (III-26)
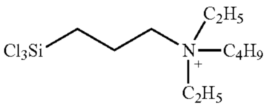
Formula (III-27)
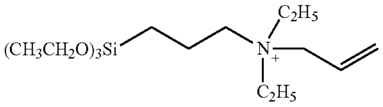
Formula (III-28)
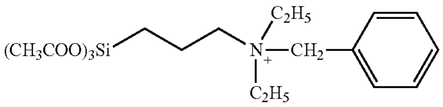
Examples of the hydrolyzable organosilane of Formula (1) having a phosphonium group or an organic group containing a phosphonium group as an onium group are shown below.
Formula (III-29)
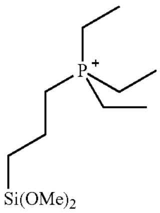
Formula (III-29)
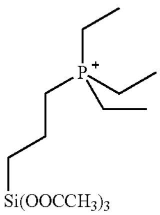
Formula (III-29)
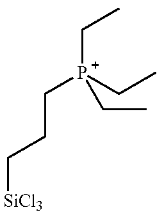
Formula (III-29)
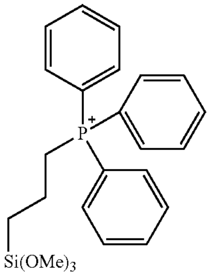
-continued
Formula (III-30)
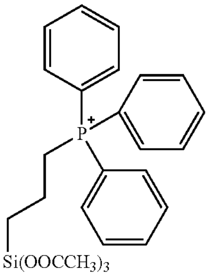
Formula (III-31)
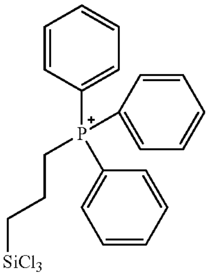
Formula (III-32)
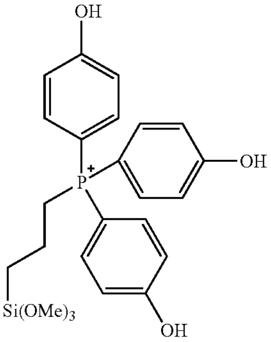
Formula (III-33)
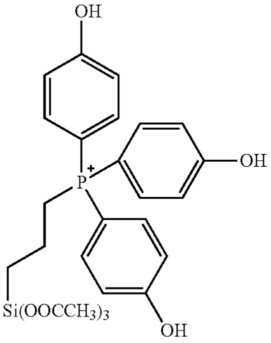
Formula (III-34)
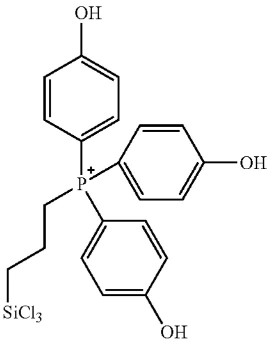

-continued
Formula (III-35)
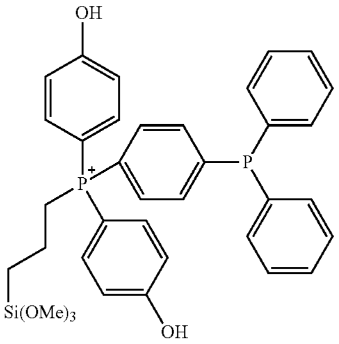
Formula (III-36)
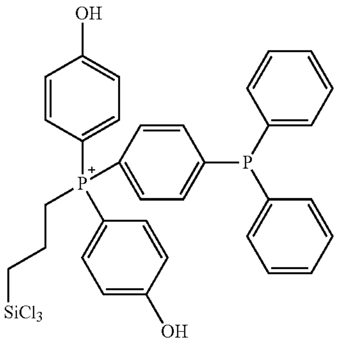
Examples of the hydrolyzable organosilane of Formula (1) having a sulfonium group or an organic group containing a sulfonium group as an onium group are shown below.
Formula (III-37)
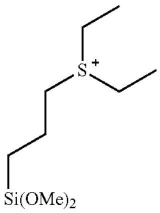
Formula (III-38)
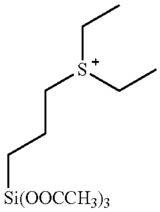
Formula (III-39)
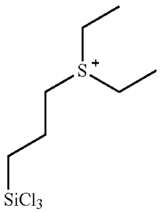
-continued
Formula (III-40)
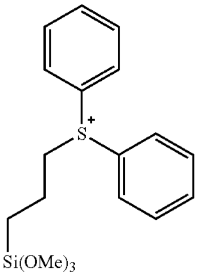
Formula (III-41)
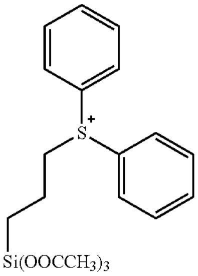
Formula (III-42)
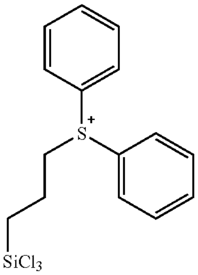
Formula (III-43)
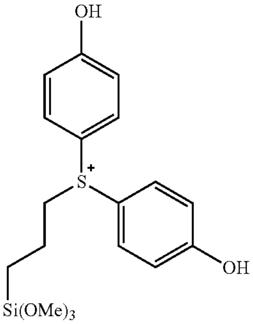
Formula (III-44)
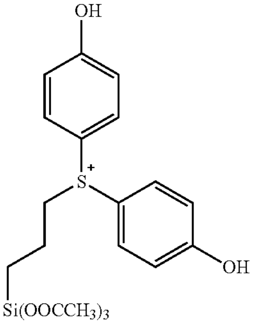

-continued

Formula (III-45)

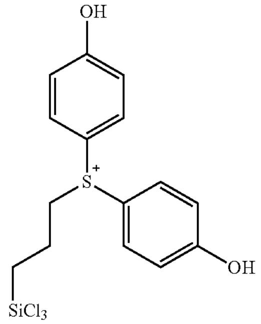

Formula (III-46)

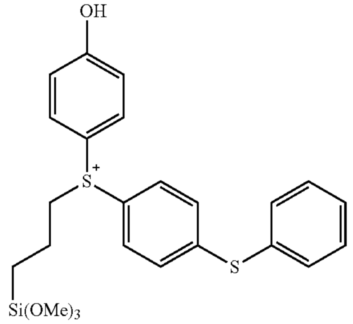

Formula (III-47)

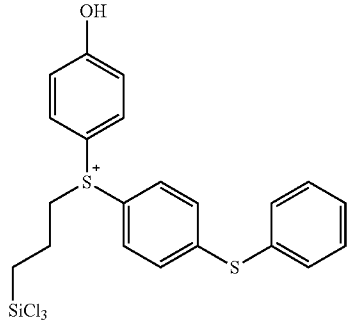

Examples of the hydrolyzable organosilane of Formula (1) having an iodonium group or an organic group containing an iodonium group as an onium group are shown below.

Formula (III-48)

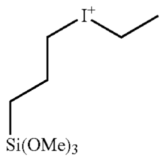

Formula (III-49)

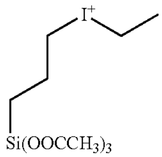

-continued

Formula (III-50)

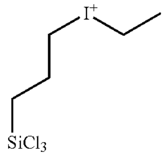

Formula (III-51)

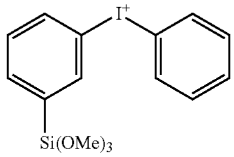

Formula (III-52)

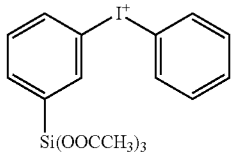

Formula (III-53)

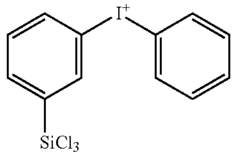

Formula (III-54)

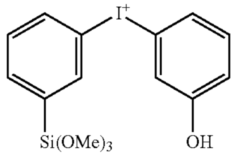

Formula (III-55)

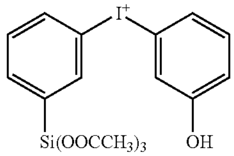

Formula (III-56)

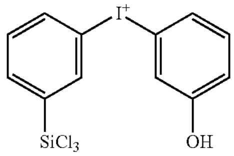

Formula (III-57)

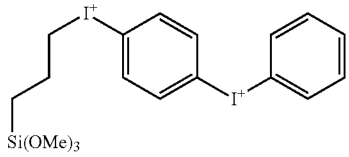

(Formula (III-58)

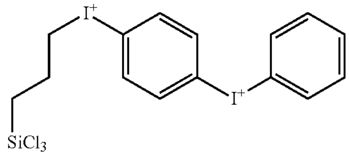

Examples of the hydrolysis-condensation product of the hydrolyzable organosilane of Formula (1) are shown below.

Formula (IV-1)
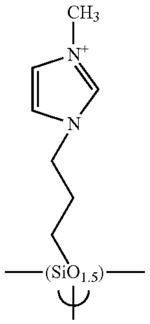
Formula (IV-2)
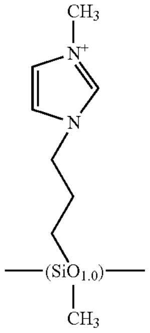
Formula (IV-3)
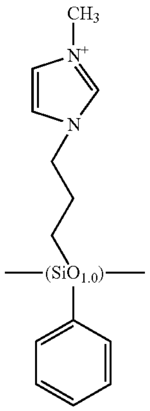
Formula (IV-4)
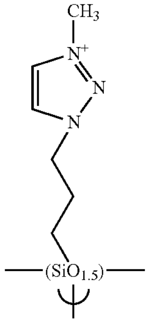
-continued
Formula (IV-5)
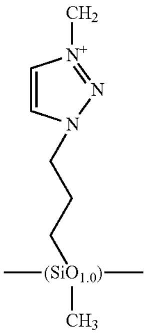
Formula (IV-6)
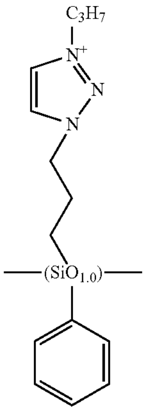
Formula (IV-7)
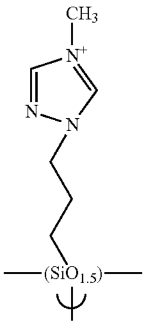
Formula (IV-8)
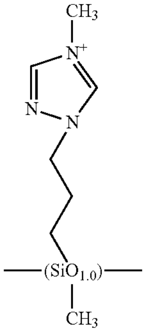

-continued
Formula (IV-9)
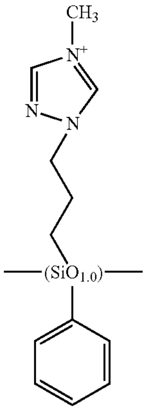
Formula (IV-10)
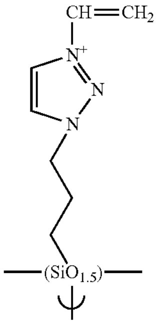
Formula (IV-11)
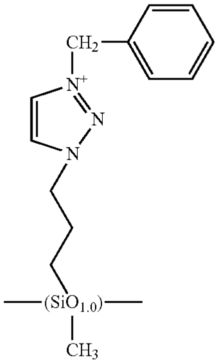
Formula (IV-12)
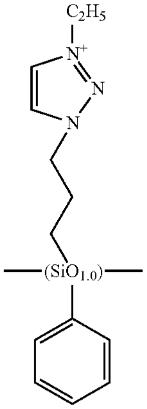
-continued
Formula (IV-13)
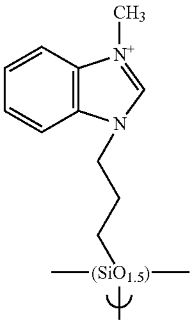
Formula (IV-14)
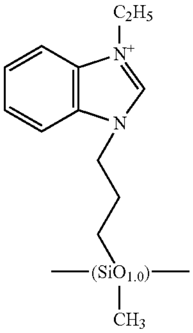
Formula (IV-15)
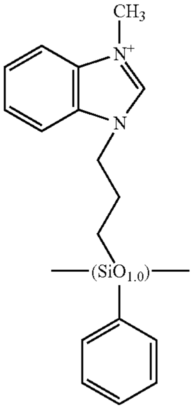
Formula (IV-16)
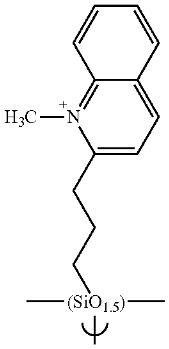

-continued
Formula (IV-17)
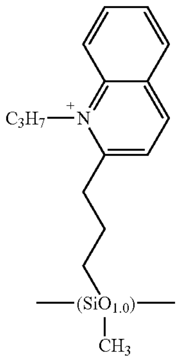
Formula (IV-18)
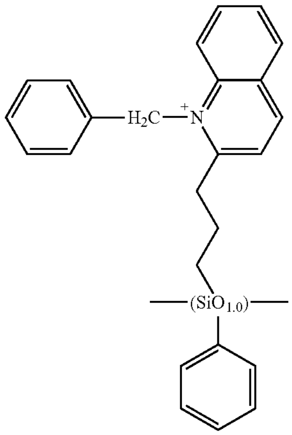
Formula (IV-19)
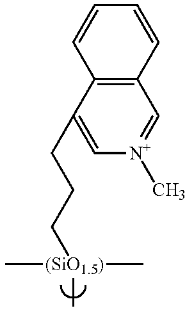
Formula (IV-20)
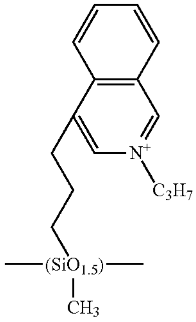
-continued
Formula (IV-21)
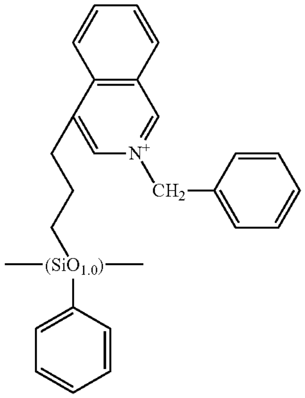
Formula (IV-22)
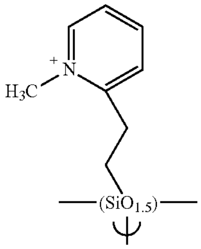
Formula (IV-23)
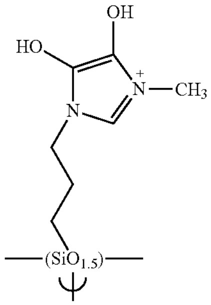
Formula (IV-24)
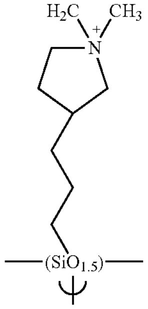
Formula (IV-25)
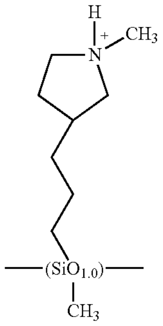

-continued
Formula (IV-26)
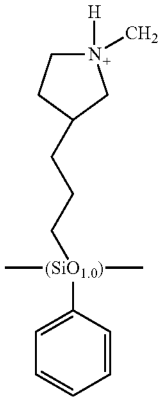
Formula (IV-27)
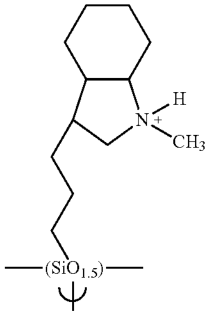
Formula (IV-28)
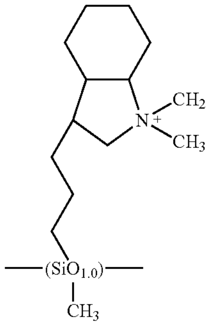
Formula (IV-29)
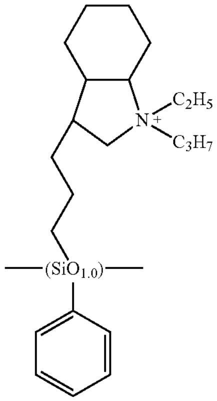
-continued
Formula (IV-30)
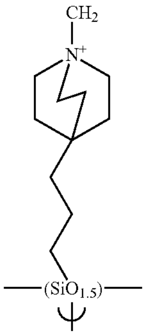
Formula (IV-31)
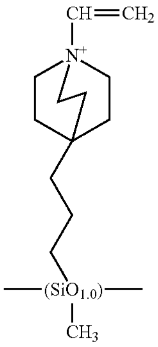
Formula (IV-32)
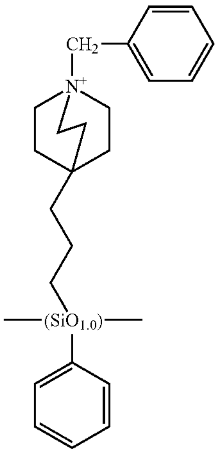
Formula (IV-33)
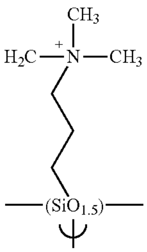

-continued
Formula (IV-34)
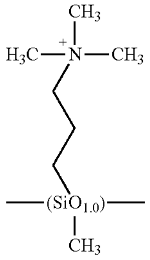
Formula (IV-35)
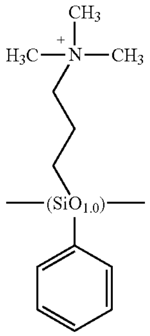
Formula (IV-36)
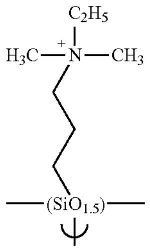
Formula (IV-37)
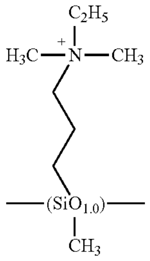
Formula (IV-38)
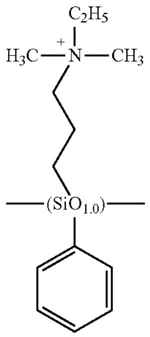
-continued
Formula (IV-39)
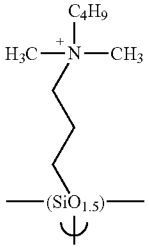
Formula (IV-40)
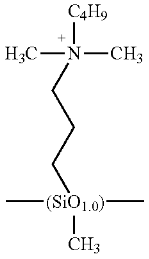
Formula (IV-41)
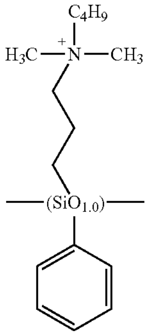
Formula (IV-42)
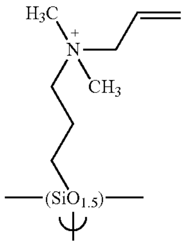
Formula (IV-43)
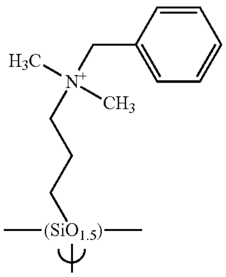
Formula (IV-44)
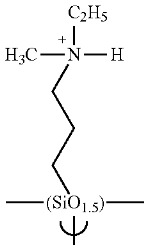

-continued
Formula (IV-45)
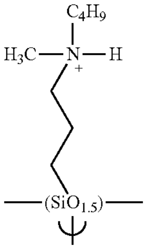
Formula (IV-46)
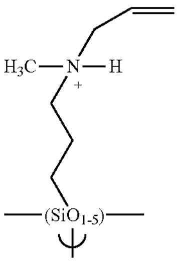
Formula (IV-47)
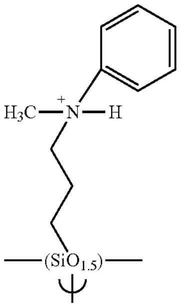
Formula (IV-48)
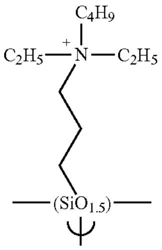
Formula (IV-49)
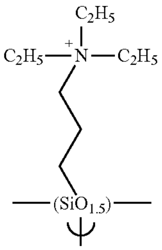
Formula (IV-50)
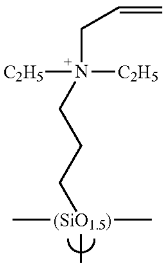
-continued
Formula (IV-51)
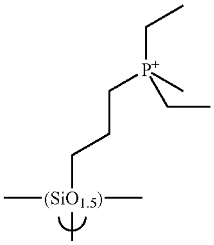
Formula (IV-52)
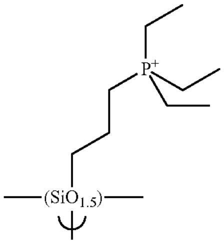
Formula (IV-53)
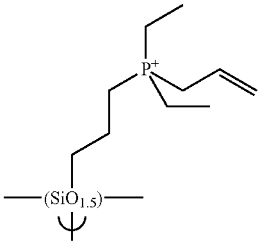
Formula (IV-54)
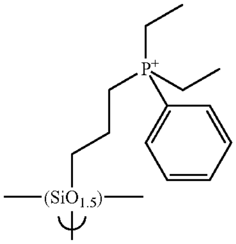
Formula (IV-55)
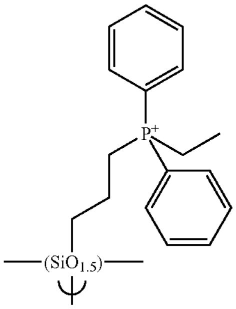
Formula (IV-56)
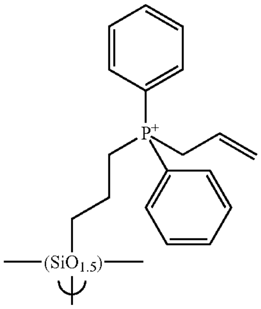

-continued
Formula (IV-57)
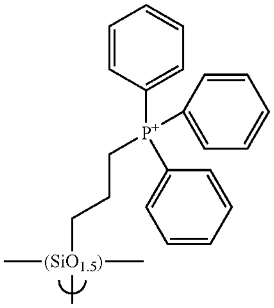
Formula (IV-58)
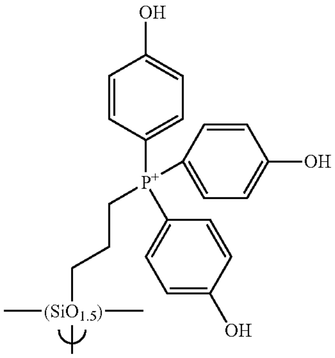
Formula (IV-59)
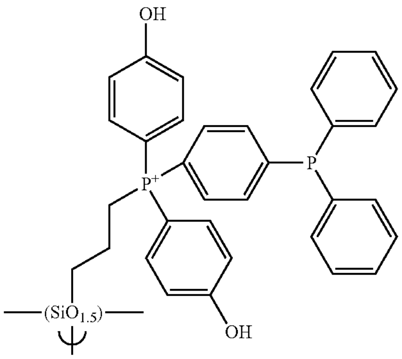
Formula (IV-60)
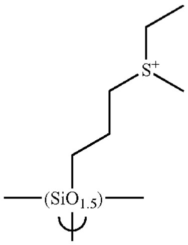
Formula (IV-61)
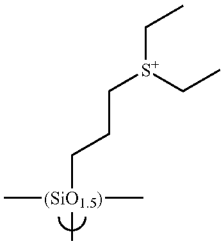
-continued
Formula (IV-62)
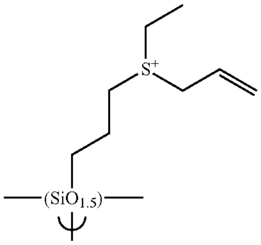
Formula (IV-63)
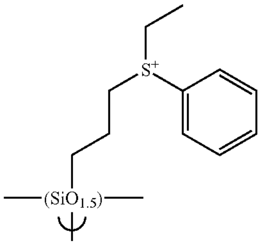
Formula (IV-64)
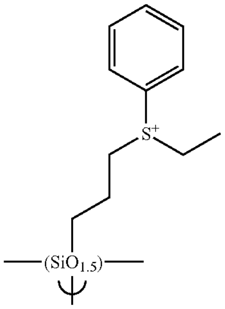
Formula (IV-65)
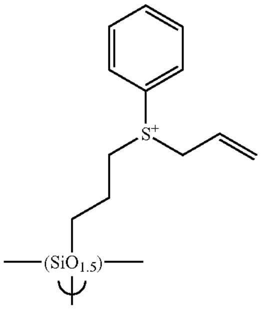
Formula (IV-66)
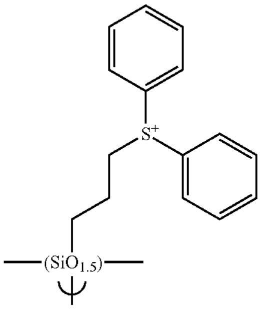

-continued

Formula (IV-67)

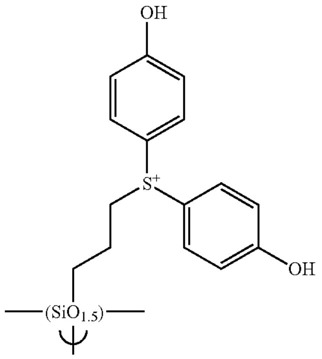

Formula (IV-68)

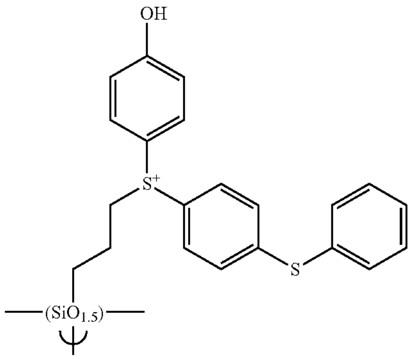

Formula (IV-69)

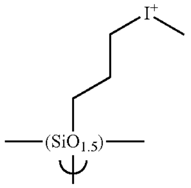

Formula (IV-70)

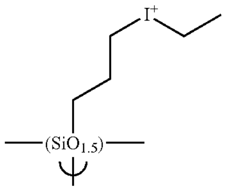

Formula (IV-71)

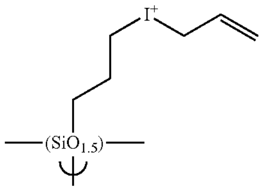

Formula (IV-72)

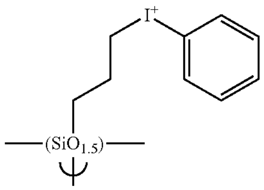

-continued

Formula (IV-73)

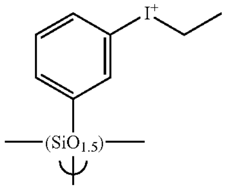

Formula (IV-74)

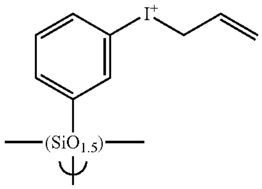

Formula (IV-75)

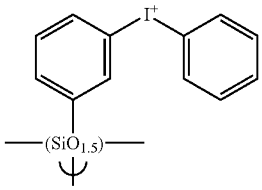

Formula (IV-76)

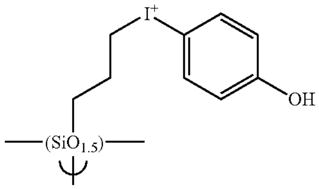

Formula (IV-77)

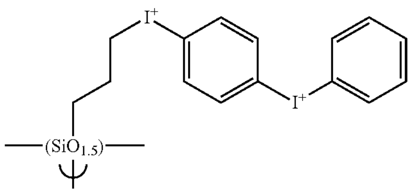

For the hydrolyzable organosilane having an onium group used in the present invention, a hydrolysis product thereof, and a hydrolysis-condensation product thereof, an anion corresponding to the onium group exists to form an onium salt. When the onium group is an ammonium group, an ammonium salt is generated and when the onium group is a phosphonium group, a phosphonium salt is generated. When the onium group is a sulfonium group, a sulfonium salt is generated. When the onium group is an iodonium group, an iodonium salt is generated.

Examples of such an anion include a halogen ion, an alkoxy ion, a hydroxyalkoxy ion, an acetoxy ion, a fluorine-substituted acetoxy ion, a sulfonyl ion, an oxalic acid ion, a maleic acid ion, a fluorine-substituted sulfonyl ion, a phosphonyl ion, a perchlorate ion, a nitrate ion, and a sulfonylimide ion. Examples of these anions are shown below.

$F^-$ Formula (V-1)

$Cl^-$ Formula (V-2)

$Br^-$ Formula (V-3)

-continued

Formula (V-4)

$I^-$

Formula (V-5)

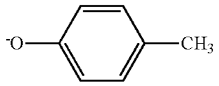

Formula (V-6)

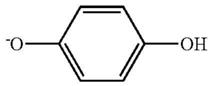

Formula (V-7)

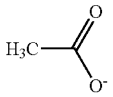

Formula (V-8)

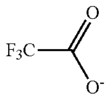

Formula (V-9)

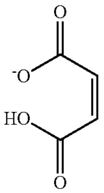

Formula (V-10)

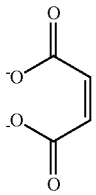

Formula (V-11)

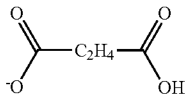

Formula (V-12)

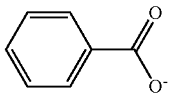

Formula (V-13)

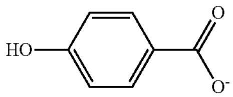

Formula (V-14)

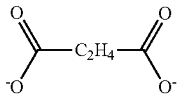

Formula (V-15)

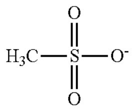

Formula (V-16)

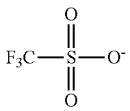

-continued

Formula (V-17)

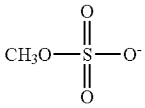

Formula (V-18)

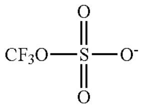

Formula (V-19)

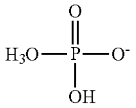

Formula (V-20)

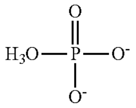

Formula (V-21)

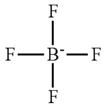

Formula (V-22)

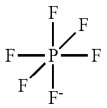

Formula (V-23)

$ClO_4^-$

Formula (V-24)

$NO_3^-$

Formula (V-25)

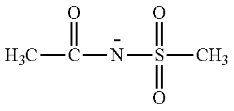

Formula (V-26)

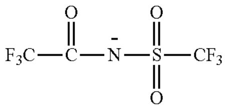

Formula (V-27)

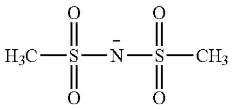

Formula (V-28)

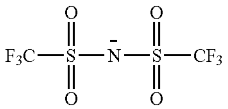

In the present invention, a hydrolyzable organosilane of Formula (1) can be used in combination with at least one of organosilicon compound selected from a group consisting of the compounds of Formula (9) and Formula (10).

That is, a hydrolyzable organosilane of Formula (1), a hydrolysis product thereof, or a hydrolysis-condensation product thereof can be used in combination with at least one of organosilicon compound selected from a group consisting of the compounds of Formula (9) and Formula (10), a hydrolysis product thereof, or a hydrolysis-condensation product thereof.

The ratio between the hydrolyzable organosilane of Formula (1) and the organosilicon compound(s) of Formula (9) and/or Formula (10) may be in a molar ratio in a range of 1:0 to 1:100,000 for use. As the organosilicon compound selected from a group consisting of Formula (9) and Formula (10), preferably used is an organosilicon compound of Formula (9).

These compounds are preferably used as a hydrolysis-condensation product (polymer of polyorganosiloxane) thereof and it is preferred to use a hydrolysis-condensation product (polymer of polyorganosiloxane) of a hydrolyzable organosilane of Formula (1) with an organosilicon compound of Formula (9).

Examples of $R^6$, $R^7$, $R^8$, and $R^9$ in the silicon-containing compounds of Formula (9) and Formula (10) include an alkyl group, an aryl group, a halogenated alkyl group, a halogenated aryl group, an alkenyl group, an organic group having an epoxy group, an acryloyl group, a methacryloyl group, a mercapto group, or a cyano group, and an alkoxy group, an acyloxy group, and a halogen group contained in a hydrolyzable group, and specific examples thereof include those exemplified with respect to Formula (1).

Examples of the organosilicon compound of Formula (9) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl) ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldibutoxysilane, γ-glycidoxypropylethyldiethoxysilane, γ-glycidoxypropylvinyldibutoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, methoxyphenyltrimethoxysilane, methoxyphenyltriethoxysilane, methoxyphenyltriacetoxysilane, methoxyphenyltrichlorosilane, methoxybenzyltrimethoxysilane, methoxybenzyltriethoxysilane, methoxybenzyltriacetoxysilane, methoxybenzyltrichlorosilane, methoxyphenethyltrimethoxysilane, methoxyphenethyltriethoxysilane, methoxyphenethyltriacetoxysilane, methoxyphenethyltrichlorosilane, ethoxyphenyltrimethoxysilane, ethoxyphenyltriethoxysilane, ethoxyphenyltriacetoxysilane, ethoxyphenyltriehlorosilane, ethoxybenzyltrimethoxysilane, ethoxybenzyltriethoxysilane, ethoxybenzyltriacetoxysilane, ethoxybenzyltrichlorosilane, isopropoxyphenyltrimethoxysilane, isopropoxyphenyltriethoxysilane, isopropoxyphenyltriacetoxysilane, isopropoxyphenyltrichlorosilane, isopropoxybenzyltrimethoxysilane, isopropoxybenzyltriethoxysilane, isopropoxybenzyltriacetoxysilane, isopropoxybenzyltrichlorosilane, tert-butoxyphenyltrimethoxysilane, tert-butoxyphenyltriethoxysilane, tert-butoxyphenyltriacetoxysilane, tert-butoxyphenyltfichlorosilane, tert-butoxybenzyltrimethoxysilane, tert-butoxybenzyltriethoxysilane, tert-butoxybenzyltriacetoxysilane, tert-butoxybenzyltrichlorosilane, methoxynaphthyltrimethoxysilane, methoxynaphthyltriethoxysilane, methoxynaphthyltriacetoxysilane, methoxynaphthyltrichlorosilane, ethoxynaphthyltrimethoxysilane, ethoxynaphthyltriethoxysilane, ethoxynaphthyltriacetoxysilane, ethoxynaphthyltrichlorosilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the organosilicon compound of Formula (10) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product of the hydrolyzable organosilane of Formula (1) with the organosilicon compound of Formula (9) are shown below.

Formula (VI-1)
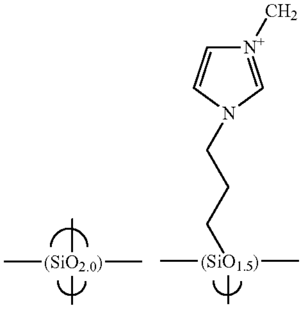
Formula (VI-2)
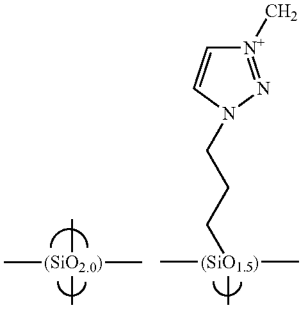
Formula (VI-3)
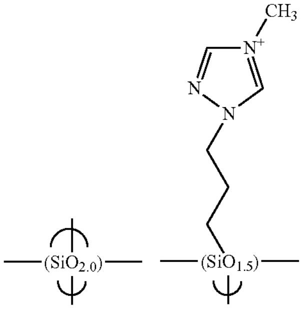
Formula (VI-4)
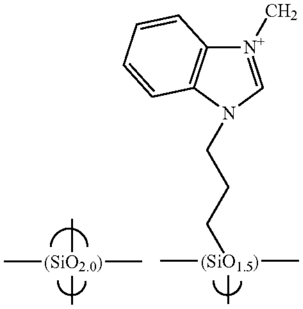
Formula (VI-5)
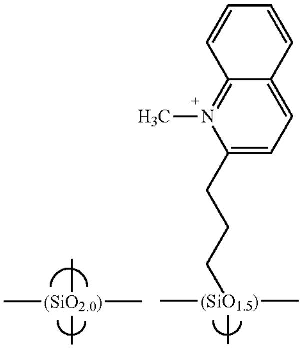
-continued
Formula (VI-6)
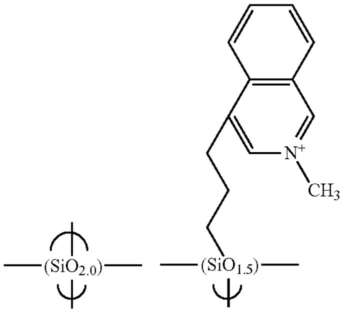
Formula (VI-7)
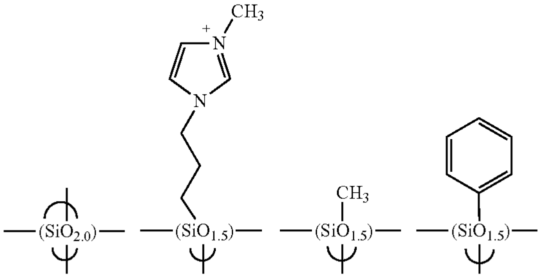
Formual (VI-8)
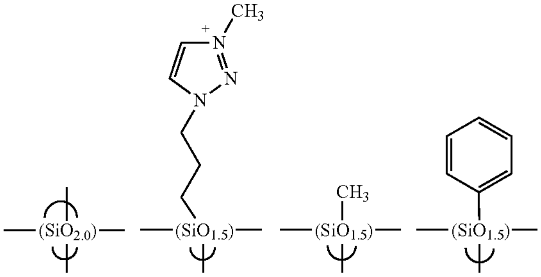
Formula (VI-9)
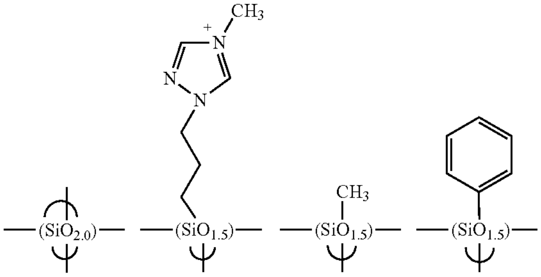
Formula (VI-10)
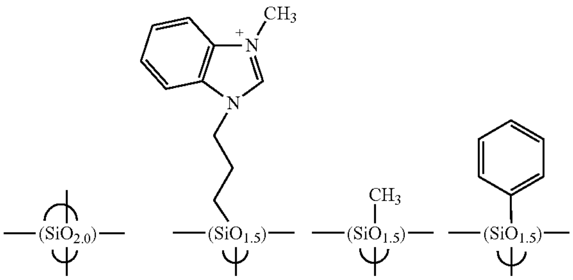

-continued
Formula (VI-11)
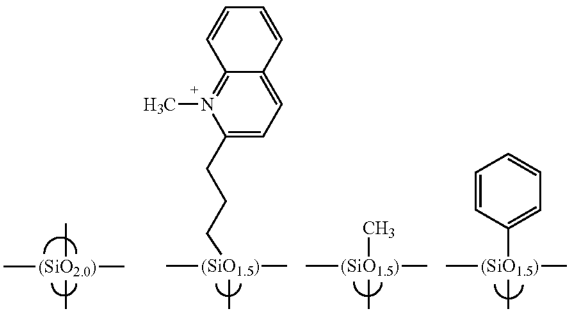
Formula (VI-12)
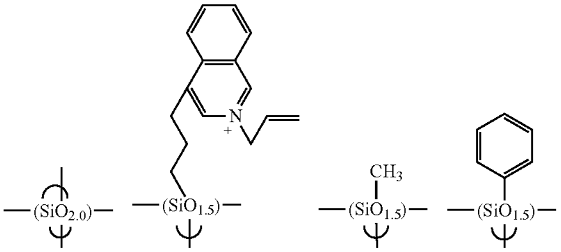
Formula (VI-13)
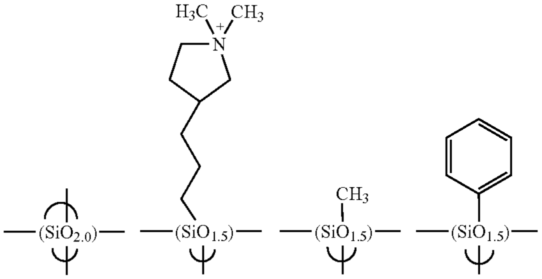
Formula (VI-14)
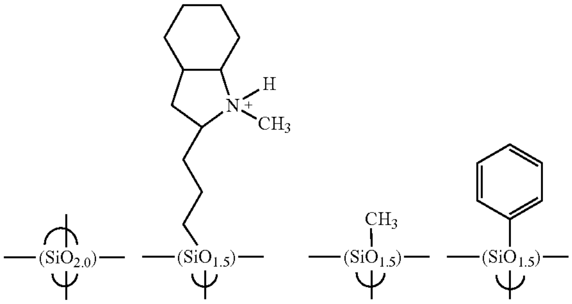
Formula (VI-15)
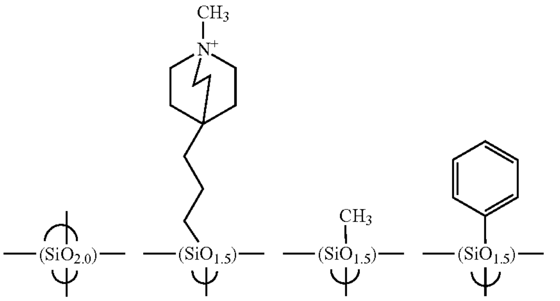
-continued
Formula (VI-16)
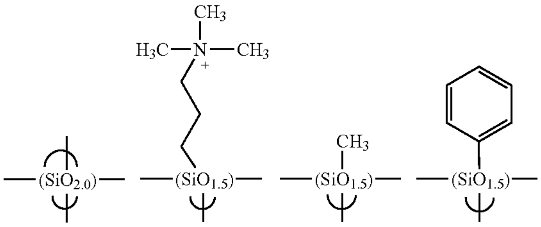
Formula (VI-17)
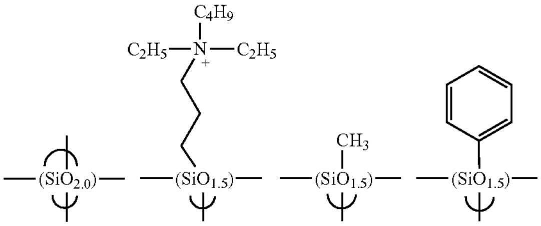
Formula (VI-18)
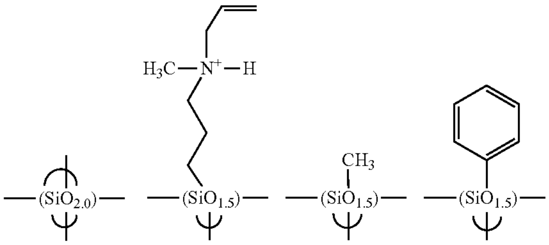
Formula (VI-19)
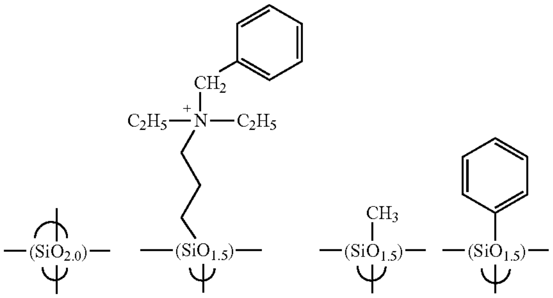
Formula (VI-19)
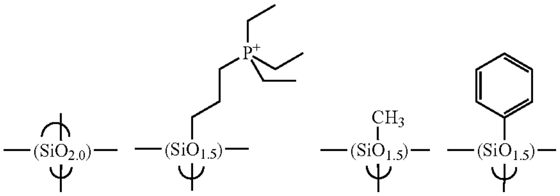

-continued
Formula (VI-20)
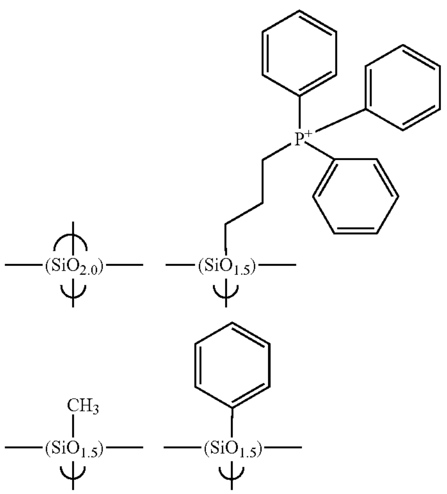
Formula (VI-21)
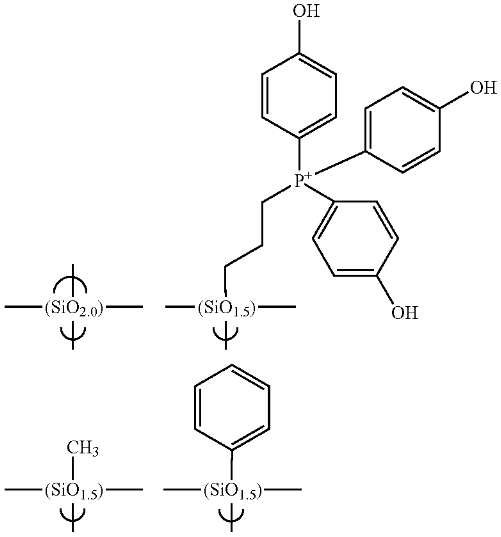
Formula (VI-22)
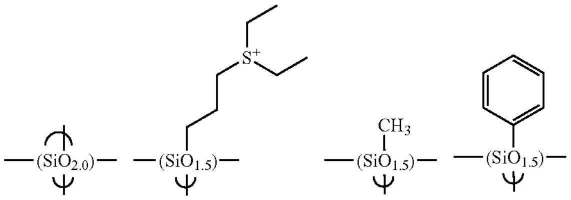
Formula (VI-23)
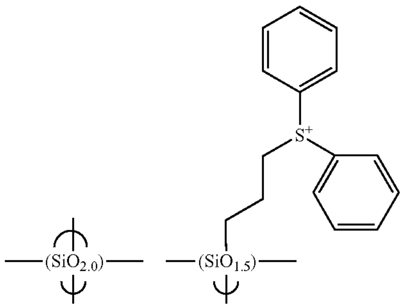
-continued
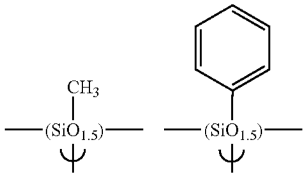
Formula (VI-24)
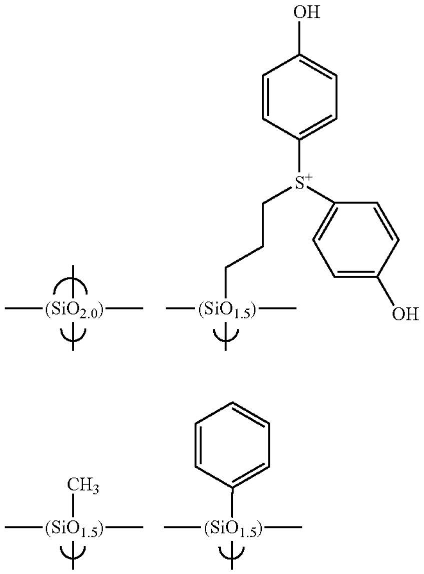
Formula (VI-25)
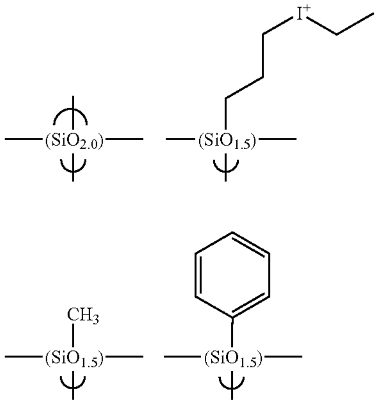
Formula (VI-26)
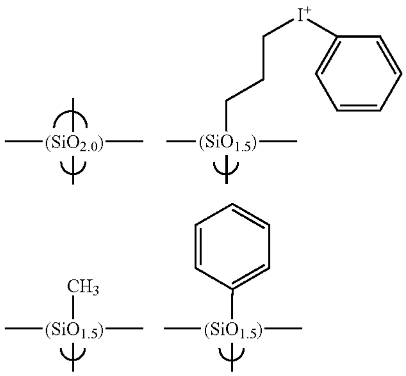

-continued

Formula (VI-27)

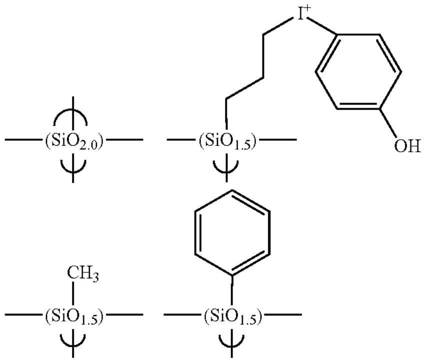

The onium group such as an ammonium group, a phosphonium group, a sulfonium group, and an iodonium group has an action of acting as a catalyst for accelerating the condensation of a silanol group generated by hydrolysis of a hydrolyzable group of a hydrolyzable organosilane and accelerating the polymer formation of a polyorganosiloxane and the curing thereof.

The hydrolysis-condensation product (polyorganosiloxane) of the hydrolyzable organosilane of Formula (1) or the hydrolysis-condensation product (polyorganosiloxane) of the hydrolyzable organosilane of Formula (1) with the organosilicon compound(s) of Formula (9) and/or Formula (10) can be obtained as a condensation product having a weight average molecular weight of 1,000 to 1,000,000 or 1,000 to 100,000. This weight average molecular weight is a weight average molecular weight obtained by a GPC analysis and converted into that of polystyrene.

Examples of the measurement condition for the GPC analysis include: using a GPC apparatus (trade name: HLC-8220GPC; manufactured by Tosoh Corporation); using a GPC column (trade names: Shodex KF803L, KF802, and KF801; manufactured by Showa Denko K.K.); using a column temperature of 40° C.; using tetrahydrofuran as the eluting liquid (eluting solvent); using a flow amount (flow rate) of 1.0 mL/min; and using polystyrene (manufactured by Showa Denko K.K.) as the standard sample.

For the hydrolysis of an alkoxysilyl group, an acyloxysilyl group, or a halogenated silyl group, water is used in an amount of 0.5 to 100 mol, preferably 1 to 10 mol, relative to 1 mol of a hydrolyzable group.

A hydrolysis catalyst can be used in an amount of 0.001 to 10 mol, preferably 0.001 to 1 mol, relative to 1 mol of a hydrolyzable group.

The reaction temperature for performing the hydrolysis and the condensation is usually 20 to 80° C.

The hydrolysis may be performed either perfectly or partially. That is, in the hydrolysis-condensation product thereof, a hydrolysis product, a hydrolyzable organosiloxane, and an organosilicon compound may remain.

During the hydrolysis and the condensation, a catalyst can be used.

Examples of the catalyst for the hydrolysis include metal chelate compounds, organic acids, inorganic acids, organic bases, and inorganic bases.

Examples of the metal chelate compound as the catalyst for the hydrolysis include: titanium chelate compounds such as triethoxy.mono(acetylacetonate)titanium, tri-n-propoxy-mono(acetylacetonate)titanium, tri-isopropoxy-mono(acetylacetonate)titanium, tri-n-butoxy.mono(acetylacetonate)titanium, tri-sec-butoxy.mono(acetylacetonate)titanium, tri-tert-butoxy.mono(acetylacetonate)titanium, diethoxy.bis(acetylacetonate)titanium, di-n-propoxy.bis(acetylacetonate)titanium, di-isopropoxy.bis(acetylacetonate)titanium, di-n-butoxy.bis(acetylacetonate)titanium, di-sec-butoxy.bis(acetylacetonate)titanium, di-tert-butoxy.bis(acetylacetonate)titanium, monoethoxy.tris(acetylacetonate)titanium, mono-n-propoxy.tris(acetylacetonate)titanium, mono-isopropoxy.tris(acetylacetonate)titanium, mono-n-butoxy.tris(acetylacetonate)titanium, mono-sec-butoxy.tris(acetylacetonate)titanium, mono-tert-butoxy.tris(acetylacetonate)titanium, tetrakis(acetylacetonate)titanium, triethoxy.mono(ethylacetoacetate)titanium, tri-n-propoxy-.mono(ethylacetoacetate)titanium, tri-isopropoxy.mono(ethylacetoacetate)titanium, tri-n-butoxy.mono(ethylacetoacetate)titanium, tri-sec-butoxy.mono(ethylacetoacetate)titanium, tri-tert-butoxy.mono(ethylacetoacetate)titanium, diethoxy.bis(ethylacetoacetate)titanium, di-n-propoxy.bis(ethylacetoacetate)titanium, di-isopropoxy.bis(ethylacetoacetate)titanium, di-n-butoxy.bis(ethylacetoacetate)titanium, di-sec-butoxy.bis(ethylacetoacetate)titanium, di-tert-butoxy-.bis(ethylacetoacetate)titanium, monoethoxy.tris(ethylacetoacetate)titanium, mono-n-propoxy.tris(ethylacetoacetate)titanium, mono-isopropoxy.tris(ethylacetoacetate)titanium, mono-n-butoxy.tris(ethylacetoacetate)titanium, mono-sec-butoxy.tris(ethylacetoacetate)titanium, mono-tert-butoxy.tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy.mono(acetylacetonate)zirconium, tri-n-propoxy.mono(acetylacetonate)zirconium, tri-isopropoxy.mono(acetylacetonate)zirconium, tri-n-butoxy.mono(acetylacetonate)zirconium, tri-sec-butoxy.mono(acetylacetonate)zirconium, tri-tert-butoxy.mono(acetylacetonate)zirconium, diethoxy.bis(acetylacetonate)zirconium, di-n-propoxy.bis(acetylacetonate)zirconium, di-isopropoxy.bis(acetylacetonate)zirconium, di-n-butoxy-.bis(acetylacetonate)zirconium, di-sec-butoxy.bis(acetylacetonate)zirconium, di-tert-butoxy.bis(acetylacetonate)zirconium, monoethoxy.tris(acetylacetonate)zirconium, mono-n-propoxy.tris(acetylacetonate)zirconium, mono-isopropoxy.tris(acetylacetonate)zirconium, mono-n-butoxy.tris(acetylacetonate)zirconium, mono-sec-butoxy.tris(acetylacetonate)zirconium, mono-tert-butoxy.tris(acetylacetonate)zirconium, tetrakis(acetylacetonate)zirconium, triethoxy.mono(ethylacetoacetate)zirconium, tri-n-propoxy.mono(ethylacetoacetate)zirconium, tri-isopropoxy.mono(ethylacetoacetate)zirconium, tri-n-butoxy.mono(ethylacetoacetate)zirconium, tri-sec-butoxy.mono(ethylacetoacetate)zirconium, tri-tert-butoxy.mono(ethylacetoacetate)zirconium, diethoxy.bis(ethylacetoacetate)zirconium, di-n-propoxy.bis(ethylacetoacetate)zirconium, di-isopropoxy.bis(ethylacetoacetate)zirconium, di-n-butoxy.bis(ethylacetoacetate)zirconium, di-sec-butoxy.bis(ethylacetoacetate)zirconium, di-tert-butoxy.bis(ethylacetoacetate)zirconium, monoethoxy.tris(ethylacetoacetate)zirconium, mono-n-propoxy.tris(ethylacetoacetate)zirconium, mono-isopropoxy.tris(ethylacetoacetate)zirconium, mono-n-butoxy.tris(ethylacetoacetate)zirconium, mono-sec-butoxy.tris(ethylacetoacetate)zirconium, mono-tert-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)

zirconium, and tris(acetylacetonate)mono(ethylacetoacetate) zirconium; and aluminum chelate compounds such as tris (acetylacetonate)aluminum and tris(ethylacetoacetate) aluminum.

Examples of the organic acid used as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid used as the catalyst for the hydrolysis include hydrochloric acid, nitric acid, sulfuric acid, hydrofluoric acid, and phosphoric acid.

Examples of the organic base used as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammoniumhydroxide.

Examples of the inorganic base used as the catalyst for the hydrolysis include ammonia, sodium hydroxide, potassium hydroxide, barium hydroxide, and calcium hydroxide.

Among these catalysts, metal chelate compounds, organic acids, and inorganic acids are preferred and these catalysts may be used individually or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used individually or in combination of two or more types thereof.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, and propylene glycol monopropyl ether acetate are preferred in terms of the preservation stability of the solution thereof.

From the hydrolysis-condensation product (polymer) obtained by hydrolyzing and then condensing a hydrolyzable organosilane in a solvent using a catalyst, an alcohol as a by-product, the used hydrolyzing catalyst, and the used water can simultaneously be removed by distilling them under reduced pressure or the like. An acid catalyst or a base catalyst used for the hydrolysis can be removed by neutralization or ion exchange. Then, to the resist underlayer film forming composition for lithography of the present invention containing the hydrolysis-condensation product thereof, an organic acid, water, an alcohol, or a combination thereof can be added to stabilize the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be blended in is 0.1 to 5.0 parts by mass, relative to 100 parts by mass of the condensation product thereof (polyorganosiloxane).

As the water to be blended in, pure water, ultrapure water, ion-exchanged water, or the like can be used and the blended amount thereof can be 1 to 20 part(s) by mass, relative to 100 parts by mass of the resist underlayer film forming composition.

As the alcohol to be blended in, an alcohol that is easily scattered by heating after the application is preferred and examples thereof include methanol, ethanol, propanol, isopropanol, and butanol. The amount of the alcohol to be blended in can be 1 to 20 part(s) by mass, relative to 100 parts by mass of the resist underlayer film forming composition.

The underlayer film forming composition for lithography of the present invention may contain, if necessary, organic polymer compounds, acid generators, surfactants, and the like, besides the components mentioned above.

By using an organic polymer compound, there can be controlled the dry etching rate (a decreased amount of the film thickness per unit time), the attenuation coefficient, the refractive index, and the like of the formed resist underlayer film.

The organic polymer compound is not particularly limited and various organic polymers such as condensation polymerization polymers and addition polymerization polymers can be used. Examples of such polymers include polyesters, polystyrenes, polyimides, acrylic polymers, methacrylic polymers, polyvinylethers, phenolnovolacs, naphtholnovolacs, polyethers, polyamides, and polycarbonates.

There is preferably used an organic polymer having an aromatic ring structure functioning as a light absorbing moiety such as a benzene ring, a naphthalene ring, an anthracene ring, a triazine ring, a quinoline ring, and a quinoxaline ring.

Examples of the organic polymer compound having a light absorbing moiety include: addition polymerization polymers containing, as a structure unit thereof, an addition polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether, and N-phenylmaleimide; and condensation polymerization polymers such as phenolnovolacs and naphtholnovolacs.

By using such an organic polymer having a light absorbing moiety, enhanced functions as a bottom anti-reflective coating can be obtained.

When an addition polymerization polymer is used as the organic polymer compound, the polymer compound may be a homopolymer or a copolymer. For producing the addition polymerization polymer, an addition polymerizable monomer is used. Examples of such an addition polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide, N-methylmaleimide, N-phenylmaleimide, N-cyclohexylmaleimide, N-benzylmaleimide, and N-hydroxyethylmaleimide.

When a condensation polymerization polymer is used as the organic polymer compound, examples of such a polymer include condensation polymerization polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer also include polyesters, polyamides, and polyimides such as polypyromellitimide, poly(p-phenyleneterephthalamide), polybutyleneterephthalate, and polyethyleneterephthalate.

When the organic polymer compound contains a hydroxy group, the hydroxy group can effect a crosslinking reaction with a polyorganosiloxane.

As the organic polymer compound, there can be used a polymer compound having a weight average molecular weight of, for example, 1,000 to 1,000,000, preferably 3,000 to 300,000, more preferably 5,000 to 200,000, further preferably 10,000 to 100,000.

The organic polymer compounds may be used individually or in combination of two or more types thereof.

When the organic polymer compound is used, the ratio thereof is 1 to 200 parts by mass, preferably 5 to 100 parts by mass, more preferably 10 to 50 parts by mass, further preferably 20 to 30 parts by mass, relative to 100 parts by mass of the condensation product thereof (polyorganosiloxane).

The resist underlayer film forming composition of the present invention may contain an acid generator.

Examples of the acid generator include photoacid generators and thermoacid generators.

The photoacid generator generates an acid during exposure of the resist. Therefore, the acidity of the underlayer film can be controlled. This is one method for adjusting the acidity of the underlayer film to that of the resist as an upper layer of the underlayer film. By adjusting the acidity of the underlayer film, the pattern shape of the resist formed in the upper layer can be controlled.

Examples of the photoacid generator contained in the resist underlayer film forming composition of the present invention include onium salt compounds, sulfonimide compounds, and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro n-butane sulfonate, diphenyliodoniumperfluoro n-octane sulfonate, diphenyliodoniumcamphorsulfonate, bis(4-tert-butylphenyl)iodoniumcamphorsulfonate, and bis(4-tert-butylphenyl) iodoniumtrifluoromethanesulfonate; and sulfonium salt compounds such as triphenylsulfoniumhexafluoroantimonate, triphenylsulfoniumnonafluoro n-butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro n-butane sulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used individually or in combination of two or more types thereof.

When the photoacid generator is used, the ratio thereof is 0.01 to 5 parts by mass, preferably 0.1 to 3 parts by mass, more preferably 0.5 to 1 part(s) by mass, relative to 100 parts by mass of the condensation product thereof (polyorganosiloxane).

The thermoacid generator generates an acid during prebake of the resist underlayer film. Therefore, the acidity of the underlayer film can be controlled. This is one method for adjusting the acidity of the underlayer film to that of the resist as an upper layer of the underlayer film. By adjusting the acidity of the underlayer film, the pattern shape of the resist formed in the upper layer can be controlled.

Examples of the thermoacid generator contained in the resist underlayer film forming composition of the present invention include bis(tosyloxy)ethane, bis(tosyloxy)propane, bis(tosyloxy)butane, p-nitrobenzyl tosylate, o-nitrobenzyl tosylate, 1,2,3-phenylenetris(methylsulfonate), p-toluenesulfonic acid pyridinium salt, p-toluenesulfonic acid morphonium salt, p-toluenesulfonic acid ethyl ester, p-toluenesulfonic acid propyl ester, p-toluenesulfonic acid butyl ester, p-toluenesulfonic acid isobutyl ester, p-toluenesulfonic acid methyl ester, p-toluenesulfonic acid phenethyl ester, cyanomethyl-p-toluenesulfonate, 2,2,2-trifluoromethyl-p-toluenesulfonate, 2-hydroxybutyl-p-tosylate, and N-ethyl-4-toluenesulfonamide.

These thermoacid generators may be used individually or in combination of two or more types thereof.

When the thermoacid generator is used, the ratio thereof is 0.01 to 5 parts by mass, preferably 0.1 to 3 parts by mass, more preferably 0.5 to 1 part(s) by mass, relative to 100 parts by mass of the condensation product thereof (polyorganosiloxane).

The photoacid generator and the thermoacid generator may be used in combination thereof.

The surfactant is effective for suppressing the formation of a pin hole, a striation, and the like when the resist underlayer film forming composition for lithography of the present invention is applied onto a substrate.

Examples of the surfactant used in the resist underlayer film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene.polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.).

These surfactants may be used individually or in combination of two or more types thereof. When the surfactant is used, the ratio thereof is 0.0001 to 5 parts by mass, preferably 0.001 to 1 part(s) by mass, more preferably 0.01 to 0.5 parts by mass, relative to 100 parts by mass of the condensation product thereof (polyorganosiloxane).

In the resist underlayer film forming composition of the present invention, a rheology controlling agent and an adhesion assistant may be blended. The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited to be used so long as the solvent can dissolve the solid content. Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycal monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, and γ-butyrolactone. These solvents may be used individually or in combination of two or more types thereof.

Hereinafter, the method of forming a photoresist pattern used in the production of semiconductor devices using the resist underlayer film forming composition of the present invention is described.

The processing method of a substrate used in the production of semiconductor devices using the resist underlayer film of the present invention is classified broadly into two methods. One method is a method including: forming a resist underlayer film directly on a substrate for semiconductor devices; and forming thereon, a resist film to form a pattern, and the other method is a method including: forming an underlayer organic film on a substrate for semiconductor devices; forming thereon, a resist underlayer film; and forming further thereon, a resist film layer to form a pattern.

First, described is a method including: forming a resist underlayer film directly on a substrate for semiconductor devices; and forming thereon, a resist film to form a pattern.

The resist underlayer film forming composition of the present invention is applied onto a substrate used in the production of semiconductor devices (for example, silicon wafer substrates, silicon/silicon dioxide coated substrates, silicon nitride substrates, glass substrates, ITO substrates, polyimide substrates, low dielectric constant material (low-k material) coated substrates, etc.) by an appropriate coating method such as a spinner and a coater and, then, is baked to form a resist underlayer film. The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes. Here, the formed underlayer film has a film thickness of, for example, 10 to 1,000 nm, or 20 to 500 nm, or 50 to 300 nm, or 100 to 200 nm.

Next, on the resist underlayer film, a resist film, for example a photoresist film is formed. The formation of the photoresist layer can be performed by a well-known method, that is, by applying a photoresist composition solution on the resist underlayer film and by baking the composition solution. The photoresist has a film thickness of, for example, 50 to 10,000 nm, or 100 to 2,000 nm, or 200 to 1,000 nm.

The photoresist formed on the resist underlayer film of the present invention is not particularly limited so long as the photoresist is sensitive to a light used for the exposure, and both of a negative-type photoresist and a positive-type photoresist can be used. Examples of the photoresist include: a positive-type photoresist made of a novolac resin and 1,2-naphthoquinonediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists such as those described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed relative to the formed resist through a predetermined mask. For the exposure, a KrF excimer laser (wavelength: 248 nm), an ArF excimer laser (wavelength: 193 nm), a F2 excimer laser (wavelength: 157 nm), and the like can be used. After the exposure, if necessary, post exposure bake can also be performed. The post exposure bake is performed under conditions accordingly selected from baking temperatures of 70° C. to 150° C. and baking times of 0.3 to 10 minutes.

In the present invention, as the resist, a resist for electron beam lithography can be used instead of the photoresist. As the electron beam resist, both a negative type and a positive type can be used. Examples of the electron beam resist include: a chemical amplification-type resist made of a binder having a group changing the alkali dissolving rate by being decomposed by an acid generator and an acid; a chemical amplification-type resist made of an alkali-soluble binder and a low molecule compound changing the alkali dissolving rate of a resist by being decomposed by an acid generator and an acid; a chemical amplification-type resist made of a binder having a group changing the alkali dissolving rate by being decomposed by an acid generator and an acid, and a low molecule compound changing the alkali dissolving rate of a resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Furthermore, in these developers, a surfactant and the like may also be blended.

The conditions for the development are accordingly selected from temperatures of 5 to 50° C. and times of 10 to 600 seconds.

Then, using the thus formed pattern of the photoresist as a protecting film, the removal of the resist underlayer film of the present invention is performed.

The resist underlayer film of the present invention at the part exposed by the removal of the photoresist is removed by dry etching to expose the semiconductor substrate. For dry etching the resist underlayer film, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane, preferably halogen-based gases, more preferably fluorine-based gases such as tetrafluoromethane ($CF_4$), perfluorocyclobutane ($C_4F_8$), perfluoropropane ($C_3F_8$), trifluoromethane, and difluoromethane ($CH_2F_2$).

By dry etching using a halogen-based gas, the dry etching rate of a moiety having a carbon-oxygen bond and a carbon-nitrogen bond becomes larger than that of a moiety having a carbon-carbon bond. Therefore, while the resist underlayer film of the present invention that is a film of inorganic components is rapidly removed by a halogen-based gas, fundamentally, a photoresist composed of organic substances is difficult to be removed. Therefore, the decrease of the film thickness of the photoresist according to dry etching of the resist underlayer film can be suppressed. Then, as the result, the photoresist can be used as a thin film, so that it becomes possible to form a fine pattern causing few pattern collapse.

Finally, using the patterned photoresist and the patterned resist underlayer film as protecting films, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Second, there is described a method including: forming an underlayer organic film on a substrate for semiconductor devices; forming thereon, a resist underlayer film; and forming further thereon, a resist to form a pattern.

On the substrate used in the production of semiconductor devices, the underlayer organic film is formed. The underlayer organic film and the forming method thereof are not particularly limited so long as the underlayer organic film and the forming method thereof are a well-known underlayer organic film used as a protecting film on a substrate for semiconductor devices and a forming method thereof. The underlayer organic film has preferably planarity on the substrate, heat resistance, anti-reflective property, and solvent resistance against a solvent used for the resist underlayer film forming composition.

Next, on the underlayer organic film, the resist underlayer film of the present invention and a photoresist film thereon are formed.

The forming method of the resist film and the forming method of patterns of the resist and the resist underlayer film are as described above. Using the film composed of the photoresist and the resist underlayer film of the present invention that are patterned by the above-described method as a protecting film, the removal of the underlayer organic film is performed.

The removal of the underlayer organic film is preferably performed by dry etching with an oxygen-based gas. The resist underlayer film of the present invention that is an inorganic component containing a large amount of silicon atoms has a small dry etching rate by an oxygen-based gas, so that the resist underlayer film is more difficult to be removed than the resist film and the underlayer organic film that are organic components.

Finally, using the patterned resist underlayer film and the patterned underlayer organic film as protecting films, the processing of the semiconductor substrate is performed. The processing method of the semiconductor substrate is as described above.

Particularly, in a method in which after the latter underlayer organic film is formed on the substrate, thereon, the resist underlayer film of the present invention is formed and further, the resist underlayer film is coated with the photoresist to form a pattern, even when the pattern width of the photoresist becomes smaller and the photoresist is coated thinly for preventing a pattern collapse, the processing of the substrate becomes possible by selecting an appropriate etching gas. For example, after patterning the resist: for etching the resist underlayer film, a fluorine-based gas having an etching rate of the resist underlayer film of the present invention satisfactorily higher than that of the photoresist can be used; next, for etching the organic layer, an oxygen-based gas having an etching rate of the underlayer organic film satisfactorily higher than that of the resist underlayer film can be used; and finally, for etching the semiconductor substrate, a fluorine-based gas having an etching rate of the semiconductor substrate satisfactorily higher than that of the underlayer organic film can be used.

Between the resist underlayer film of the present invention and the resist, an organic bottom anti-reflective coating may be formed before the formation of the resist. The bottom anti-reflective coating forming composition used here is not particularly limited and may optionally be selected from the compositions commonly used in a conventional lithography process to be used. The formation of the bottom anti-reflective coating can be performed by a commonly used method such as by applying by a spinner or a coater and baking The substrate on which the resist underlayer film forming composition of the present invention is applied may also be a substrate having an organic or inorganic bottom anti-reflective coating formed by a CVD method on its surface and, on the bottom anti-reflective coating, the resist underlayer film of the present invention can also be formed.

Further, a resist underlayer film formed from the resist underlayer film forming composition of the present invention may absorb a light having a wavelength used in a lithography process and then, the resist underlayer film can function as a bottom anti-reflective coating having the effect of preventing a light reflected on the substrate.

Furthermore, the resist underlayer film of the present invention can also be used as a layer for preventing an interaction between the substrate and the photoresist, a layer having a function of preventing an adverse action of a material used in the photoresist or of a substance generated during exposure of the photoresist against the substrate, a layer having a function of preventing the diffusion of a substance generated in or on the substrate during heating and baking to the upper layer photoresist, a barrier layer for reducing a poisoning effect to the photoresist film by a semiconductor substrate dielectric layer, and the like.

A resist underlayer film formed from the resist underlayer film forming composition can be applied to a substrate in which a via hole used in the dual damascene process is formed to be used as an embedding material capable of filling the hole without a void. The resist underlayer film can also be used as a planarizing material for planarizing the surface of a semiconductor substrate having unevenness.

The present invention will be more specifically described hereinafter, referring to Examples which should not be construed as limiting the scope of the present invention.

EXAMPLES

Synthesis Example 1

Imidazolium Acetate-Containing Siloxane Polymer 5.0 g of triethoxysilylpropyl-4,5-dihydroimidazole and 18 g of ethanol were charged into a 100 mL flask to be dissolved. While stirring the resultant mixed solution with a magnetic stirrer, to the mixed solution, a solution in which 1.2 g of acetic acid was dissolved in 24 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylpropyl-4,5-dihydroimidazole and acetic acid as by-products were removed. This purification was repeated three times and then remaining diethyl ether was distilled off under reduced pressure, followed by dissolving the resultant concentrate in ethanol to obtain a 30.4% ethanol solution of triethoxysilylpropyl-4,5-dihydroimidazolium acetate.

2.94 g of phenyltrimethoxysilane, 39.53 g of tetraethoxysilane, 15.86 g of methyltriethoxysilane, 3.26 g of the 30.4% ethanol solution of triethoxysilylpropyl-4,5-dihydroimidazolium acetate, and 43.50 g of ethanol were charged into a 300 mL flask to be dissolved and the resultant mixed solution was warmed while stirring the mixed solution with a magnetic stirrer to reflux. Next, an aqueous solution in which 1.72 g of maleic acid was dissolved in 97.18 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-1):

Formula (VII-1)

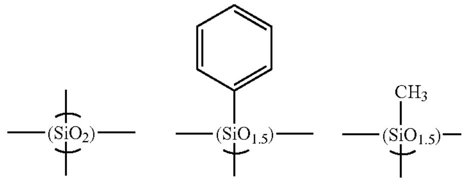

-continued

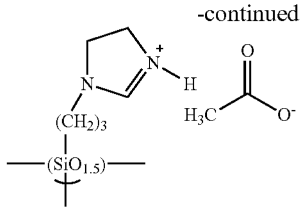

and was a polysiloxane derived from the raw material in which a silane having an onium group was contained in the total silanes at a ratio of 1.0% by mole. The molecular weight Mw of the obtained polymer was measured by GPC and found to be 5,300 in terms of polystyrene.

Synthesis Example 2

Ammonium Acetate-Containing Siloxane Polymer 5.0 g of trimethoxysilylpropyldimethylamine and 24 g of ethanol were charged into a 100 mL flask to be dissolved. While stirring the resultant mixed solution with a magnetic stirrer, to the mixed solution, a solution in which 1.5 g of acetic acid was dissolved in 24 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, trimethoxysilylpropyldimethylamine and acetic acid as by-products were removed. This purification was repeated three times and then remaining diethyl ether was distilled off under reduced pressure, followed by dissolving the resultant concentrate in ethanol to obtain a 13.1% ethanol solution of trimethoxysilylpropyldimethylammonium acetate.

2.83 g of phenyltrimethoxysilane, 38.00 g of tetraethoxysilane, 15.24 g of methyltriethoxysilane, 5.83 g of the 13.1% ethanol solution of trimethoxysilylpropyldimethylammonium acetate, and 48.11 g of ethanol were charged into a 300 mL flask to be dissolved and the resultant mixed solution was warmed while stirring the mixed solution with a magnetic stirrer to reflux. Next, an aqueous solution in which 1.65 g of maleic acid was dissolved in 93.41 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-2):

Formula (VII-2)

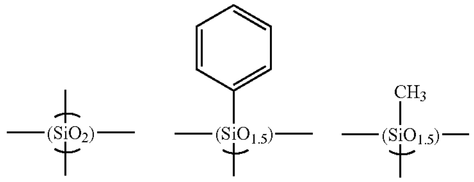

-continued

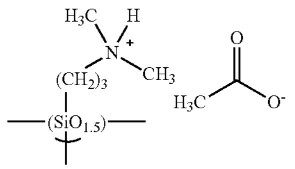

and was a polysiloxane derived from the raw material in which a silane having an onium group was contained in the total silanes at a ratio of 1.0% by mole. The molecular weight Mw of the obtained polymer was measured by GPC and found to be 1,900 in terms of polystyrene.

Synthesis Example 3

Imidazolium Maleate-Containing Siloxane Polymer 5.0 g of triethoxysilylpropyl-4,5-dihydroimidazole and 18 g of ethanol were charged into a 100 mL flask to be dissolved. While stirring the resultant mixed solution with a magnetic stirrer, to the mixed solution, a solution in which 2.3 g of maleic acid was dissolved in 18 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylpropyl-4,5-dihydroimidazole and maleic acid as by-products were removed. This purification was repeated three times and then remaining diethyl ether was distilled off under reduced pressure, followed by dissolving the resultant concentrate in ethanol to obtain a 39.4% ethanol solution of triethoxysilylpropyl-4,5-dihydroimidazolium maleate.

2.87 g of phenyltrimethoxysilane, 38.53 g of tetraethoxysilane, 15.46 g of methyltriethoxysilane, 2.56 g of the 39.4% ethanol solution of triethoxysilylpropyl-4,5-dihydroimidazolium maleate, and 45.75 g of ethanol were charged into a 300 mL flask to be dissolved and the resultant mixed solution was warmed while stirring the mixed solution with a magnetic stirrer to reflux. Next, an aqueous solution in which 1.68 g of maleic acid was dissolved in 94.72 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-3):

Formula (VII-3)

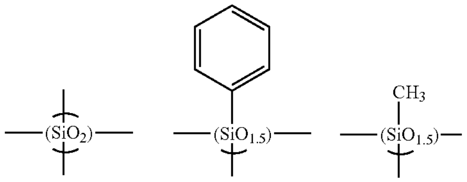

-continued

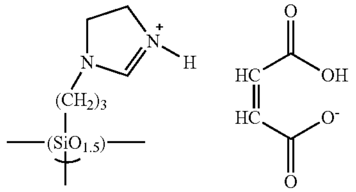

and was a polysiloxane derived from the raw material in which a silane having an onium group was contained in the total silanes at a ratio of 0.9% by mole. The molecular weight Mw of the obtained polymer was measured by GPC and found to be 4,200 in terms of polystyrene.

Synthesis Example 4

Ammonium Maleate-Containing Siloxane Polymer 5.0 g of trimethoxysilylpropyldimethylamine and 24 g of ethanol were charged into a 100 mL flask to be dissolved. While stirring the resultant mixed solution with a magnetic stirrer, to the mixed solution, a solution in which 3.0 g of maleic acid was dissolved in 26 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, trimethoxysilylpropyldimethylamine and maleic acid as by-products were removed. This purification was repeated three times and then remaining diethyl ether was distilled off under reduced pressure, followed by dissolving the resultant concentrate in ethanol to obtain a 62.6% ethanol solution of trimethoxysilylpropyldimethylammonium maleate.

2.88 g of phenyltrimethoxysilane, 38.77 g of tetraethoxysilane, 15.55 g of methyltriethoxysilane, 1.50 g of the 62.6% ethanol solution of trimethoxysilylpropyldimethylammonium maleate, and 44.86 g of ethanol were charged into a 300 mL flask to be dissolved and the resultant mixed solution was warmed while stirring the mixed solution with a magnetic stirrer to reflux. Next, an aqueous solution in which 1.69 g of maleic acid was dissolved in 95.31 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-4):

Formula (VII-4)

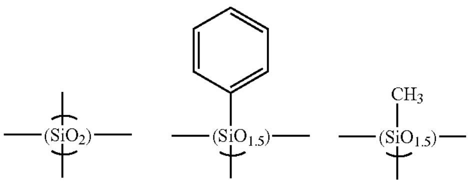

-continued

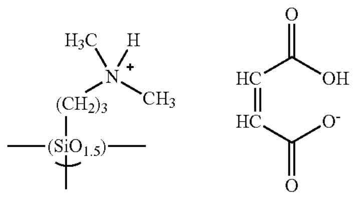

and was a polysiloxane derived from the raw material in which a silane having an onium group was contained in the total silanes at a ratio of 1.0% by mole. The molecular weight Mw of the obtained polymer was measured by GPC and found to be 3,700 in terms of polystyrene.

Synthesis Example 5

Pyridinium Maleate-Containing Siloxane Polymer 5.0 g of triethoxysilylpropylpyridine and 22 g of ethanol were charged into a 100 mL flask to be dissolved. While stirring the resultant mixed solution with a magnetic stirrer, to the mixed solution, a solution in which 2.8 g of maleic acid was dissolved in 30 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylethylpyridine and maleic acid as by-products were removed. This purification was repeated three times and then remaining diethyl ether was distilled off under reduced pressure, followed by dissolving the resultant concentrate in ethanol to obtain a 22.0% ethanol solution of triethoxysilylpropylpyridinium maleate.

2.83 g of phenyltrimethoxysilane, 38.00 g of tetraethoxysilane, 15.25 g of methyltriethoxysilane, 5.00 g of the 22.0% ethanol solution of triethoxysilylpropylpyridinium maleate, and 47.74 g of ethanol were charged into a 300 mL flask to be dissolved and the resultant mixed solution was warmed while stirring the mixed solution with a magnetic stirrer to reflux. Next, an aqueous solution in which 1.65 g of maleic acid was dissolved in 93.43 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-5):

Formula (VII-5)

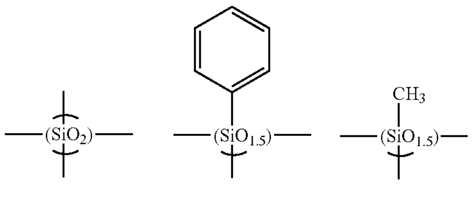

-continued

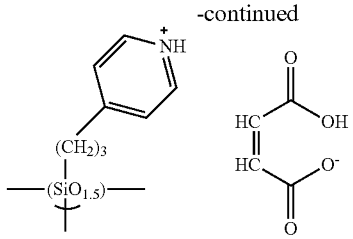

and was a polysiloxane derived from the raw material in which a silane having an onium group was contained in the total silanes at a ratio of 1.0% by mole. The molecular weight Mw of the obtained polymer was measured by GPC and found to be 4,100 in terms of polystyrene.

Synthesis Example 6

Ammonium Methanesulfonate-Containing Siloxane Polymer 5.0 g of trimethoxysilylpropyldimethylamine and 24 g of ethyl acetate were charged into a 100 mL flask to be dissolved. While stirring the resultant mixed solution with a magnetic stirrer, to the mixed solution, a solution in which 3.0 g of methyl methanesulfonate was dissolved in 26 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, trimethoxysilylpropyldimethylamine and methyl methanesulfonate as by-products were removed. This purification was repeated three times and then remaining diethyl ether was distilled off under reduced pressure, followed by dissolving the resultant concentrate in ethanol to obtain a 38.1% ethanol solution of trimethoxysilylpropyltrimethylammonium methanesulfonate.

2.95 g of phenyltrimethoxysilane, 39.71 g of tetraethoxysilane, 15.93 g of methyltriethoxysilane, 2.48 g of the 38.1% ethanol solution of trimethoxysilylpropyltrimethylammonium methanesulfonate, and 42.83 g of ethanol were charged into a 300 mL flask to be dissolved and the resultant mixed solution was warmed while stirring the mixed solution with a magnetic stirrer to reflux. Next, an aqueous solution in which 1.73 g of maleic acid was dissolved in 97.62 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-6):

Formula (VII-6)

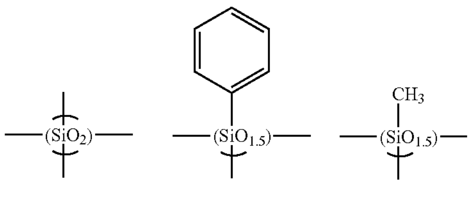

-continued

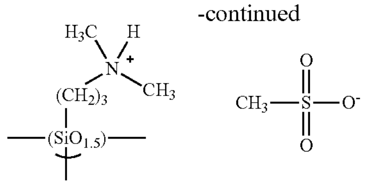

and was a polysiloxane derived from the raw material in which a silane having an onium group was contained in the total silanes at a ratio of 1.0% by mole. The molecular weight Mw of the obtained polymer was measured by GPC and found to be 2,600 in terms of polystyrene.

Synthesis Example 7

Pyridium Methanesulfonate-Containing Siloxane Polymer 5.0 g of triethoxysilylpropylpyridine and 22 g of ethanol were charged into a 100 mL flask to be dissolved. While stirring the resultant mixed solution with a magnetic stirrer, to the mixed solution, a solution in which 2.8 g of methyl methanesulfonate was dissolved in 30 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylpropylpyridine and methyl methanesulfonate as by-products were removed. This purification was repeated three times and then remaining diethyl ether was distilled off under reduced pressure, followed by dissolving the resultant concentrate in ethanol to obtain a 36.2% ethanol solution of triethoxysilylpropylpyridinium methanesulfonate.

2.86 g of phenyltrimethoxysilane, 38.52 g of tetraethoxysilane, 15.45 g of methyltriethoxysilane, 2.69 g of the 36.2% ethanol solution of triethoxysilylpropylpyridinium methanesulfonate, and 45.82 g of ethanol were charged into a 300 mL flask to be dissolved and the resultant mixed solution was warmed while stirring the mixed solution with a magnetic stirrer to reflux. Next, an aqueous solution in which 1.68 g of maleic acid was dissolved in 94.69 g of ion-exchanged water was added to the mixed solution. The mixed solution was subjected to the reaction for 120 minutes and then the resultant reaction solution was cooled down to room temperature. Then, 300 g of propylene glycol monoethyl ether was added to the reaction solution and ethanol as a reaction by-product and water were distilled off under reduced pressure to obtain a hydrolysis-condensation product. The polymer thus obtained corresponded to Formula (VII-7):

Formula (VII-7)

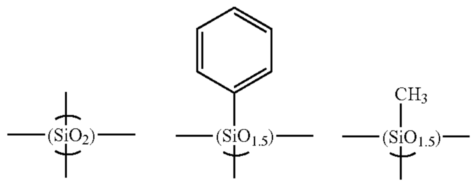

-continued

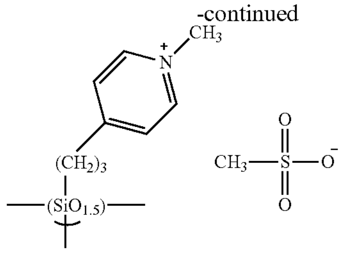

and was a polysiloxane derived from the raw material in which a silane having an onium group was contained in the total silanes at a ratio of 0.9% by mole. The molecular weight Mw of the obtained polymer was measured by GPC and found to be 2,200 in terms of polystyrene.

Synthesis Example 8

Imidazolium Acetate 0.1%

5.0 g of triethoxysilylpropyl-4,5-dihydroimidazole and 18 g of ethanol were charged into a 100 mL flask to be dissolved. While stirring the resultant mixed solution with a magnetic stirrer, to the mixed solution, a solution in which 1.6 g of acetic acid was dissolved in 24 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylpropyl-4,5-dihydroimidazole and acetic acid as by-products were removed. This purification was repeated three times and then remaining diethyl ether was distilled off under reduced pressure, followed by dissolving the resultant concentrate in ethanol to obtain a 30% ethanol solution of triethoxysilylpropyl-4,5-dihydroimidazolium acetate.

4.92 g of phenyltrimethoxysilane, 72.46 g of tetraethoxysilane, 22.06 g of methyltriethoxysilane, 0.55 g of the 30% ethanol solution of triethoxysilylpropyl-4,5-dihydroimidazolium acetate, and 150 g of acetone were charged into a 500 mL flask to be dissolved and the resultant mixed solution was warmed while stirring the mixed solution with a magnetic stirrer to reflux. Next, 33.13 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-8):

Formula (VII-8)

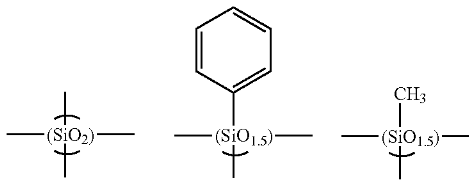

-continued

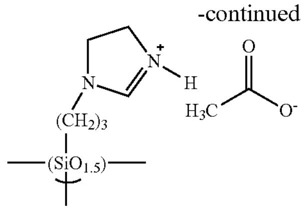

and was a polysiloxane derived from the raw material in which a silane having an onium group was contained in the total silanes at a ratio of 0.10% by mole. The molecular weight Mw of the obtained polymer was measured by GPC and found to be 1,700 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 9

Imidazolium Trifluoroacetate 0.1%

5.0 g of triethoxysilylpropyl-4,5-dihydroimidazole and 18 g of ethyl acetate were charged into a 100 mL flask to be dissolved. While stirring the resultant mixed solution with a magnetic stirrer, to the mixed solution, a solution in which 3.5 g of methyl trifluoroacetate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethoxysilylpropyl-4,5-dihydroimidazole and methyl trifluoroacetate as by-products were removed. This purification was repeated three times and then remaining diethyl ether was distilled off under reduced pressure, followed by dissolving the resultant concentrate in ethanol to obtain a 30% ethanol solution of triethoxysilylpropyl-4,5-dihydroimidazolium trifluoroacetate.

4.92 g of phenyltrimethoxysilane, 72.40 g of tetraethoxysilane, 22.04 g of methyltriethoxysilane, 0.64 g of the 30% ethanol solution of triethoxysilylpropyl-4,5-dihydroimidazolium trifluoroacetate, and 150 g of acetone were charged into a 500 mL flask to be dissolved and the resultant mixed solution was warmed while stirring the mixed solution with a magnetic stirrer to reflux. Next, 33.10 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-9):

Formula (VII-9)

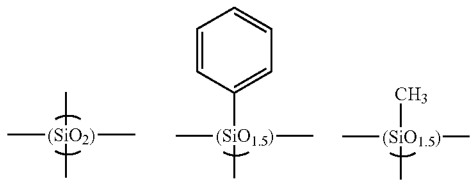

-continued

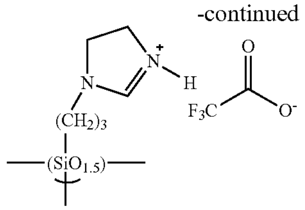

and was a polysiloxane derived from the raw material in which a silane having an onium group was contained in the total silanes at a ratio of 0.10% by mole. The molecular weight Mw of the obtained polymer was measured by GPC and found to be 1,700 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 10

Imidazolium Maleate 0.1%

5.0 g of triethoxysilylpropyl-4,5-dihydroimidazole and 18 g of ethanol were charged into a 100 mL flask to be dissolved. While stirring the resultant mixed solution with a magnetic stirrer, to the mixed solution, a solution in which 3.2 g of maleic acid was dissolved in 24 g of ethanol was gradually added at room temperature in a nitrogen atmosphere. The reaction mixture was stirred for half a day and therefrom, ethanol was distilled off under reduced pressure. The resultant concentrate was dropped into 100 mL of diethyl ether and therefrom, triethoxysilylpropyl-4,5-dihydroimidazole and maleic acid as by-products were removed. This purification was repeated three times and then remaining diethyl ether was distilled off under reduced pressure, followed by dissolving the resultant concentrate in ethanol to obtain a 30% ethanol solution of triethoxysilylpropyl-4,5-dihydroimidazolium maleate.

4.92 g of phenyltrimethoxysilane, 72.39 g of tetraethoxysilane, 22.04 g of methyltriethoxysilane, 0.65 g of the 30% ethanol solution of triethoxysilylpropyl-4,5-dihydroimidazolium maleate, and 150 g of acetone were charged into a 500 mL flask to be dissolved and the resultant mixed solution was warmed while stirring the mixed solution with a magnetic stirrer to reflux. Next, 33.10 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-10):

Formula (VII-10)

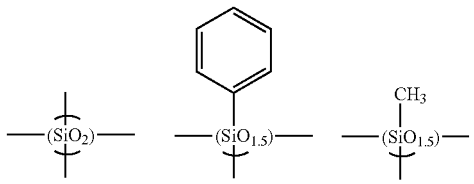

-continued

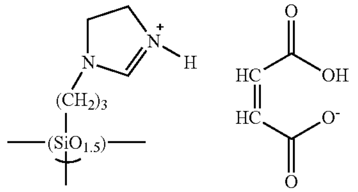

and was a polysiloxane derived from the raw material in which a silane having an onium group was contained in the total silanes at a ratio of 0.10% by mole. The molecular weight Mw of the obtained polymer was measured by GPC and found to be 2,400 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 11

Imidazolium Chloride 0.1%

3.0 g of ethylimidazole and 18 g of ethyl acetate were charged into a 100 mL flask to be dissolved. While stirring the resultant mixed solution with a magnetic stirrer, to the mixed solution, a solution in which 9.3 g of trimethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, ethylimidazole and trimethoxysilyl chloride as by-products were removed. This purification was repeated three times and then remaining diethyl ether was distilled off under reduced pressure, followed by dissolving the resultant concentrate in methanol to obtain a 30% methanol solution of trimethoxysilylpropyl-3-ethylimidazolium chloride.

4.93 g of phenyltrimethoxysilane, 72.51 g of tetraethoxysilane, 22.07 g of methyltriethoxysilane, 0.49 g of the 30% methanol solution of trimethoxysilylpropyl-3-ethylimidazolium chloride, and 150 g of acetone were charged into a 500 mL flask to be dissolved and the resultant mixed solution was warmed while stirring the mixed solution with a magnetic stirrer to reflux. Next, 33.15 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-11):

Formula (VII-11)

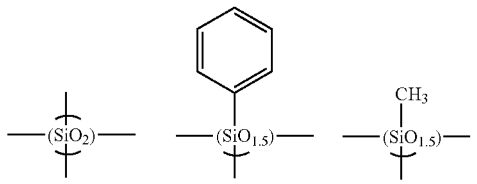

-continued

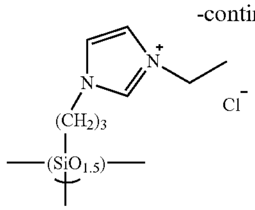

and was a polysiloxane derived from the raw material in which a silane having an onium group was contained in the total silanes at a ratio of 0.10% by mole. The molecular weight Mw of the obtained polymer was measured by GPC and found to be 1,700 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 12

Bissilylimidazolium Chloride 0.1%

5.0 g of triethoxysilylpropyl-4,5-dihydroimidazole and 18 g of ethyl acetate were charged into a 100 mL flask to be dissolved. While stirring the resultant mixed solution with a magnetic stirrer, to the mixed solution, a solution in which 5.4 g of triethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethoxysilylpropyl-4,5-dihydroimidazole and triethoxysilyl chloride as by-products were removed. This purification was repeated three times and then remaining diethyl ether was distilled off under reduced pressure, followed by dissolving the resultant concentrate in ethanol to obtain a 30% ethanol solution of a bis(trialkoxysilylpropyl)-4,5-dihydroimidazolium chloride.

4.92 g of phenyltrimethoxysilane, 72.29 g of tetraethoxysilane, 22.01 g of methyltriethoxysilane, 0.78 g of the 30% ethanol solution of a bis(trialkoxysilylpropyl)-4,5-dihydroimidazolium chloride, and 150 g of acetone were charged into a 500 mL flask to be dissolved and the resultant mixed solution was warmed while stirring the mixed solution with a magnetic stirrer to reflux. Next, 33.05 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-12):

Formula (VII-12)

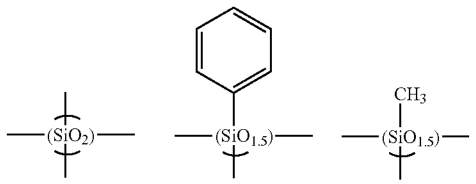

-continued

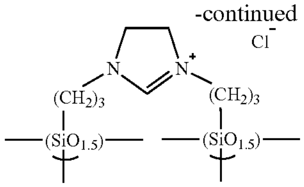

and was a polysiloxane derived from the raw material in which a silane having an onium group was contained in the total silanes at a ratio of 0.10% by mole. The molecular weight Mw of the obtained polymer was measured by GPC and found to be 1,700 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 13

Imidazolium Methanesulfonate 0.1%

5.0 g of triethoxysilylpropyl-4,5-dihydroimidazole and 18 g of ethyl acetate were charged into a 100 mL flask to be dissolved. While stirring the resultant mixed solution with a magnetic stirrer, to the mixed solution, a solution in which 3.0 g of methyl methanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethoxysilylpropyl-4,5-dihydroimidazole and methyl methanesulfonate as by-products were removed. This purification was repeated three times and then remaining diethyl ether was distilled off under reduced pressure, followed by dissolving the resultant concentrate in ethanol to obtain a 30% ethanol solution of triethoxysilylpropyl-3-methyl-4,5-dihydroimidazolium methanesulfonate.

4.92 g of phenyltrimethoxysilane, 72.40 g of tetraethoxysilane, 22.04 g of methyltriethoxysilane, 0.64 g of the 30% ethanol solution of triethoxysilylpropyl-3-methyl-4,5-dihydroimidazolium methanesulfonate, and 150 g of acetone were charged into a 500 mL flask to be dissolved and the resultant mixed solution was warmed while stirring the mixed solution with a magnetic stirrer to reflux. Next, 33.10 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-13):

Formula (VII-13)

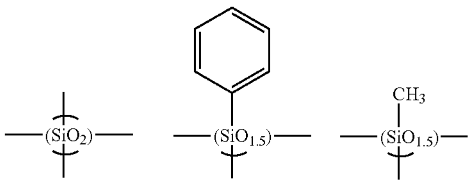

-continued

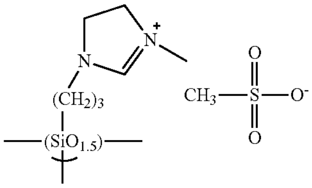

and was a polysiloxane derived from the raw material in which a silane having an onium group was contained in the total silanes at a ratio of 0.10% by mole. The molecular weight Mw of the obtained polymer was measured by GPC and found to be 1,500 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 14

Imidazolium Trifluoromethanesulfonate 0.1%

5.0 g of triethoxysilylpropyl-4,5-dihydroimidazole and 18 g of ethyl acetate were charged into a 100 mL flask to be dissolved. While stirring the resultant mixed solution with a magnetic stirrer, to the mixed solution, a solution in which 4.5 g of methyl trifluoromethanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethoxysilylpropyl-4,5-dihydroimidazole and methyl trifluoromethanesulfonate as by-products were removed. This purification was repeated three times and then remaining diethyl ether was distilled off under reduced pressure, followed by dissolving the resultant concentrate in ethanol to obtain a 30% ethanol solution of triethoxysilylpropyl-3-methyl-4,5-dihydroimidazolium trifluoromethanesulfonate.

4.92 g of phenyltrimethoxysilane, 72.34 g of tetraethoxysilane, 22.02 g of methyltriethoxysilane, 0.73 g of the 30% ethanol solution of triethoxysilylpropyl-3-methyl-4,5-dihydroimidazolium trifluoromethanesulfonate, and 150 g of acetone were charged into a 500 mL flask to be dissolved and the resultant mixed solution was warmed while stirring the mixed solution with a magnetic stirrer to reflux. Next, 33.10 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-14):

Formula (VII-14)

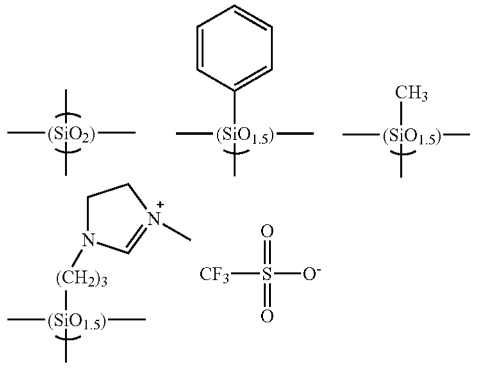

and was a polysiloxane derived from the raw material in which a silane having an onium group was contained in the total silanes at a ratio of 0.10% by mole. The molecular weight Mw of the obtained polymer was measured by GPC and found to be 1,500 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 15

Imidazolio Propanesulfonate 0.1%

5.0 g of triethoxysilylpropyl-4,5-dihydroimidazole and 18 g of ethyl acetate were charged into a 100 mL flask to be dissolved. While stirring the resultant mixed solution with a magnetic stirrer, to the mixed solution, a solution in which 3.3 g of propanesultone was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethoxysilylpropyl-4,5-dihydroimidazole and propanesultone as by-products were removed. This purification was repeated three times and then remaining diethyl ether was distilled off under reduced pressure, followed by dissolving the resultant concentrate in ethanol to obtain a 30% ethanol solution of triethoxysilylpropyl-4,5-dihydroimidazolio propanesulfonate.

4.92 g of phenyltrimethoxysilane, 72.39 g of tetraethoxysilane, 22.04 g of methyltriethoxysilane, 0.66 g of the 30% ethanol solution of triethoxysilylpropyl-4,5-dihydroimidazolio propanesulfonate, and 150 g of acetone were charged into a 500 mL flask to be dissolved and the resultant mixed solution was warmed while stirring the mixed solution with a magnetic stirrer to reflux. Next, 33.10 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-15):

Formula (VII-15)

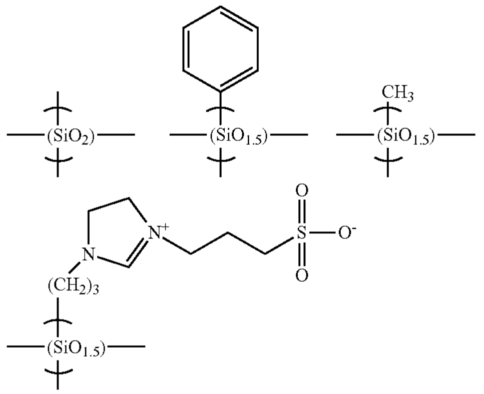

and was a polysiloxane derived from the raw material in which a silane having an onium group was contained in the total silanes at a ratio of 0.10% by mole. The molecular weight Mw of the obtained polymer was measured by GPC and found to be 1,700 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 16

Pyridinium Acetate 0.1%

5.0 g of 2-(trimethoxysilylethyl)pyridine and 18 g of methanol were charged into a 100 mL flask to be dissolved. While stirring the resultant mixed solution with a magnetic stirrer, to the mixed solution, a solution in which 2.0 g of acetic acid was dissolved in 24 g of methanol was gradually added at room temperature in a nitrogen atmosphere. The reaction mixture was stirred for half a day and therefrom, ethyl acetate was distilled off under reduced pressure. The resultant concentrate was dropped into 100 mL of diethyl ether and therefrom, 2-(trimethoxysilylethyl)pyridine and acetic acid as by-products were removed. This purification was repeated three times and then remaining diethyl ether was distilled off under reduced pressure, followed by dissolving the resultant concentrate in methanol to obtain a 30% methanol solution of trimethoxysilylethylpyridinium acetate.

4.93 g of phenyltrimethoxysilane, 72.52 g of tetraethoxysilane, 22.08 g of methyltriethoxysilane, 0.48 g of the 30% methanol solution of trimethoxysilylethylpyridinium acetate, and 150 g of acetone were charged into a 500 mL flask to be dissolved and the resultant mixed solution was warmed while stirring the mixed solution with a magnetic stirrer to reflux. Next, 33.15 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-16):

Formula (VII-16)

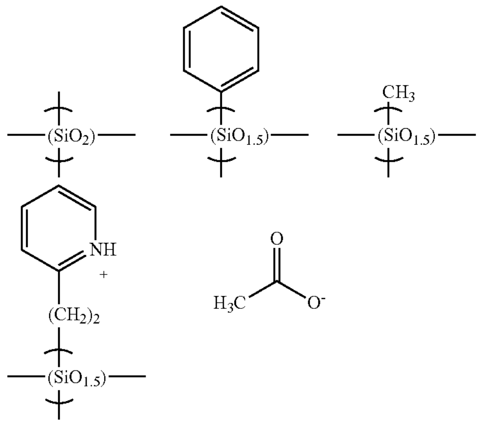

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 17

Pyridinium Trifluoroacetate 0.1%

5.0 g of 2-(trimethoxysilylethyl)pyridine and 18 g of ethyl acetate were charged into a 100 mL flask to be dissolved. While stirring the resultant mixed solution with a magnetic stirrer, to the mixed solution, a solution in which 4.2 g of methyl trifluoroacetate was dissolved in 24 g of ethyl acetate was gradually added at room temperature in a nitrogen atmosphere. The reaction mixture was refluxed over 3 days and therefrom, ethyl acetate was distilled of under reduced pressure. The resultant concentrate was dropped into 100 mL of diethyl ether and therefrom, 2-(trimethoxysilylethyl)pyridine and methyl trifluoroacetate as by-products were removed. This purification was repeated three times and then remaining diethyl ether was distilled off under reduced pressure, followed by dissolving the resultant concentrate in methanol to obtain a 30% methanol solution of trimethoxysilylethylmethylpyridinium trifluoroacetate.

4.92 g of phenyltrimethoxysilane, 72.44 g of tetraethoxysilane, 22.05 g of methyltriethoxysilane, 0.59 g of the 30% methanol solution of trimethoxysilylethylmethylpyridinium trifluoroacetate, and 150 g of acetone were charged into a 500 mL flask to be dissolved and the resultant mixed solution was warmed while stirring the mixed solution with a magnetic stirrer to reflux. Next, 33.12 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-17):

Formula (VII-17)

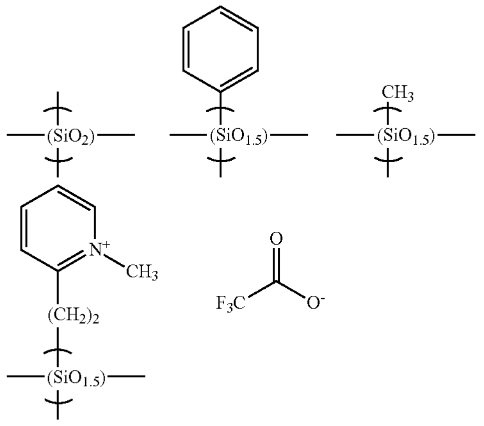

and was a polysiloxane derived from the raw material in which a silane having an onium group was contained in the total silanes at a ratio of 0.10% by mole. The molecular weight Mw of the obtained polymer was measured by GPC and found to be 2,100 in tens of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 18

Pyridinium Maleate 0.1%

5.0 g of 2-(trimethoxysilylethyl)pyridine and 18 g of methanol were charged into a 100 mL flask to be dissolved. While stirring the resultant mixed solution with a magnetic stirrer, to the mixed solution, a solution in which 3.8 g of maleic acid was dissolved in 24 g of methanol was gradually added at room temperature in a nitrogen atmosphere. The reaction mixture was stirred for half a day and therefrom, methanol was distilled off under reduced pressure. The resultant concentrate was dropped into 100 mL of diethyl ether and therefrom, 2-(trimethoxysilylethyl)pyridine and maleic acid as by-products were removed. This purification was repeated three times and then remaining diethyl ether was distilled off under reduced pressure, followed by dissolving the resultant concentrate in methanol to obtain a 30% methanol solution of 2-(trimethoxysilylethyl)pyridinium maleate.

4.93 g of phenyltrimethoxysilane, 72.45 g of tetraethoxysilane, 22.06 g of methyltriethoxysilane, 0.57 g of the 30% methanol solution of 2-(trimethoxysilylethyl)pyridinium maleate, and 150 g of acetone were charged into a 500 mL flask to be dissolved and the resultant mixed solution was warmed while stirring the mixed solution with a magnetic stirrer to reflux. Next, 33.12 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-18):

Formula (VII-18)

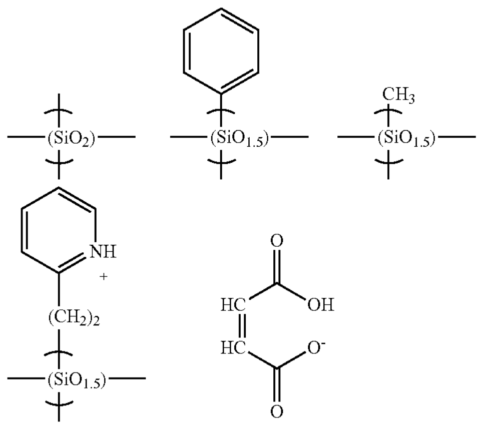

and was a polysiloxane derived from the raw material in which a silane having an onium group was contained in the total silanes at a ratio of 0.10% by mole. The molecular weight Mw of the obtained polymer was measured by GPC and found to be 2,200 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 19

Pyridinium Chloride 0.1%

3.0 g of pyridine and 18 g of ethyl acetate were charged into a 100 mL flask to be dissolved. While stirring the resultant mixed solution with a magnetic stirrer, to the mixed solution, a solution in which 11.3 g of trimethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, pyridine and trimethoxysilylpropyl chloride as by-products were removed. This purification was repeated three times and then remaining diethyl ether was distilled off under reduced pressure, followed by dissolving the resultant concentrate in methanol to obtain a 30% methanol solution of trimethoxysilylpropylpyridinium chloride.

4.93 g of phenyltrimethoxysilane, 72.53 g of tetraethoxysilane, 22.08 g of methyltriethoxysilane, 0.46 g of the 30% methanol solution of trimethoxysilylpropylpyridinium chloride, and 150 g of acetone were charged into a 500 mL flask to be dissolved and the resultant mixed solution was warmed while stirring the mixed solution with a magnetic stirrer to reflux. Next, 33.16 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-19):

Formula (VII-19)

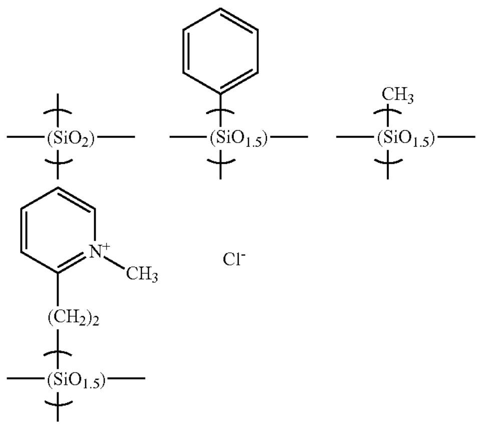

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 20

Bissilylpyridinium Chloride 0.1%

5.0 g of 2-(trimethoxysilylethyl)pyridine and 18 g of ethyl acetate were charged into a 100 mL flask to be dissolved. While stirring the resultant mixed solution with a magnetic stirrer, to the mixed solution, a solution in which 6.6 g of trimethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, 2-(trimethoxysilylethyl)pyridine and trimethoxysilylpropyl chloride as by-products were removed. This purification was repeated three times and then remaining diethyl ether was distilled off under reduced pressure, followed by dissolving the resultant concentrate in methanol to obtain a 30% methanol solution of bis(trimethoxysilyl)ethyl-N-propylpyridinium chloride.

4.92 g of phenyltrimethoxysilane, 72.35 g of tetraethoxysilane, 22.03 g of methyltriethoxysilane, 0.70 g of the 30% methanol solution of bis(trimethoxysilyl)ethyl-N-propylpyridinium chloride, and 150 g of acetone were charged into a 500 mL flask to be dissolved and the resultant mixed solution was warmed while stirring the mixed solution with a magnetic stirrer to reflux. Next, 33.08 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-20):

Formula (VII-20)

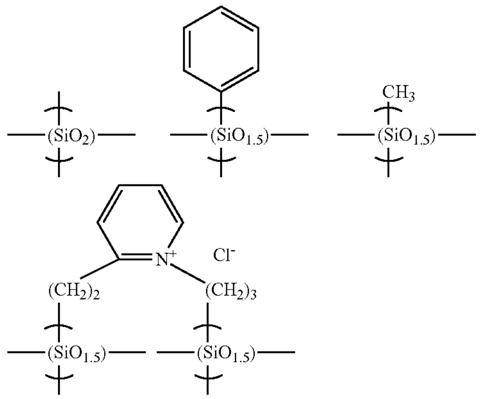

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 21

Pyridinium Methanesulfonate 0.1%

5.0 g of 2-(trimethoxysilylethyl)pyridine and 18 g of ethyl acetate were charged into a 100 mL flask to be dissolved. While stirring the resultant mixed solution with a magnetic stirrer, to the mixed solution, a solution in which 3.6 g of methyl methanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, 2-(trimethoxysilylethyl)pyridine and methyl methanesulfonate as by-products were removed. This purification was repeated three times and then remaining diethyl ether was distilled off under reduced pressure, followed by dissolving the resultant concentrate in methanol to obtain a 30% methanol solution of trimethoxysilylethylmethylpyridinium methanesulfonate.

4.93 g of phenyltrimethoxysilane, 72.46 g of tetraethoxysilane, 22.06 g of methyltriethoxysilane, 0.56 g of the 30% methanol solution of trimethoxysilylethylmethylpyridinium methanesulfonate, and 150 g of acetone were charged into a 500 mL flask to be dissolved and the resultant mixed solution was warmed while stirring the mixed solution with a magnetic stirrer to reflux. Next, 33.13 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-21):

Formula (VII-21)

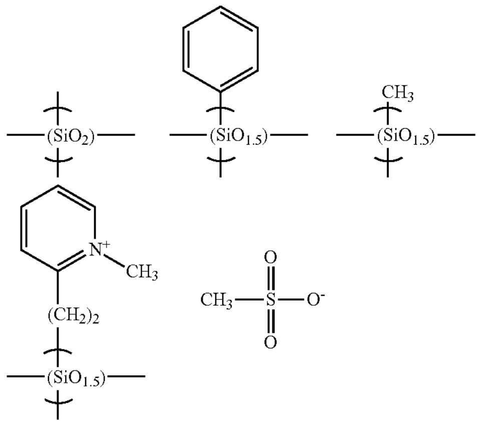

and was a polysiloxane derived from the raw material in which a silane having an onium group was contained in the total silanes at a ratio of 0.10% by mole. The molecular weight Mw of the obtained polymer was measured by GPC and found to be 2,300 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 22

Pyridinium Trifluoromethanesulfonate 0.1%

5.0 g of 2-(trimethoxysilylethyl)pyridine and 18 g of ethyl acetate were charged into a 100 mL flask to be dissolved. While stirring the resultant mixed solution with a magnetic stirrer, to the mixed solution, a solution in which 5.4 g of methyl trifluoromethanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, 2-(trimethoxysilylethyl)pyridine and methyl trifluoromethanesulfonate as by-products were removed. This purification was repeated three times and then remaining diethyl ether was distilled off under reduced pressure, followed by dissolving the resultant concentrate in methanol to obtain a 30% methanol solution of trimethoxysilylethylmethylpyridinium trifluoromethanesulfonate.

4.92 g of phenyltrimethoxysilane, 72.39 g of tetraethoxysilane, 22.04 g of methyltriethoxysilane, 0.56 g of the 30% methanol solution of trimethoxysilylethylmethylpyridinium trifluoromethanesulfonate, and 150 g of acetone were charged into a 500 mL flask to be dissolved and the resultant mixed solution was warmed while stirring the mixed solution with a magnetic stirrer to reflux. Next, 33.13 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-22):

Formula (VII-22)

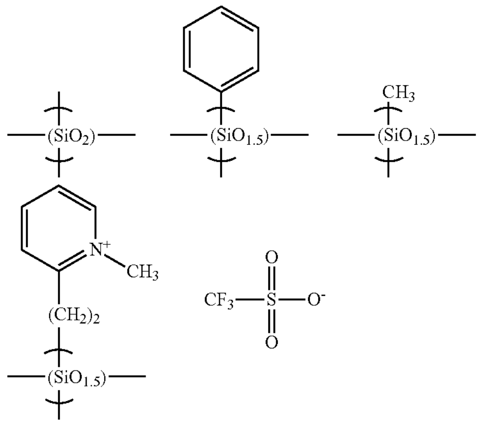

and was a polysiloxane derived from the raw material in which a silane having an onium group was contained in the total silanes at a ratio of 0.10% by mole. The molecular weight Mw of the obtained polymer was measured by GPC and found to be 2,300 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 23

Pyridinio Propanesulfonate 0.1%

5.0 g of 2-(trimethoxysilylethyl)pyridine and 18 g of ethyl acetate were charged into a 100 mL flask to be dissolved. While stirring the resultant mixed solution with a magnetic stirrer, to the mixed solution, a solution in which 4.0 g of propanesultone was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, 2-(trimethoxysilylethyl)pyridine and propanesultone as by-products were removed. This purification was repeated three times and then remaining diethyl ether was distilled off under reduced pressure, followed by dissolving the resultant concentrate in methanol to obtain a 30% methanol solution of trimethoxysilylethylpyridinio propanesulfonate.

4.93 g of phenyltrimethoxysilane, 72.44 g of tetraethoxysilane, 22.05 g of methyltriethoxysilane, 0.58 g of the 30% methanol solution of trimethoxysilylethylpyridinio propanesulfonate, and 150 g of acetone were charged into a 500 mL flask to be dissolved and the resultant mixed solution was warmed while stirring the mixed solution with a magnetic stirrer to reflux. Next, 33.12 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-23):

Formula (VII-23)

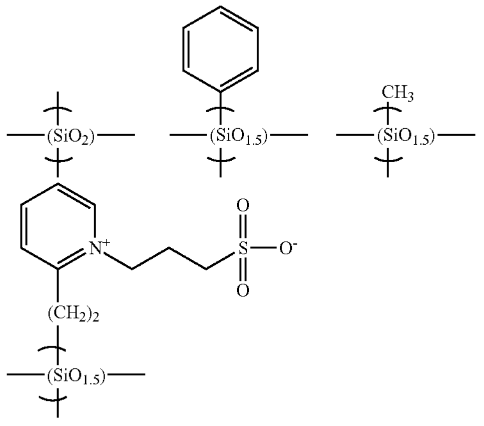

and was a polysiloxane derived from the raw material in which a silane having an onium group was contained in the total silanes at a ratio of 0.10% by mole. The molecular weight Mw of the obtained polymer was measured by GPC and found to be 2,500 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 24

Ammonium Acetate 0.1%

5.0 g of trimethoxysilylpropyldimethylamine and 18 g of methanol were charged into a 100 mL flask to be dissolved. While stirring the resultant mixed solution with a magnetic stirrer, to the mixed solution, a solution in which 2.2 g of acetic acid was dissolved in 24 g of methanol was gradually added at room temperature in a nitrogen atmosphere. The reaction mixture was stirred for half a day and therefrom, ethyl acetate was distilled off under reduced pressure. The resultant concentrate was dropped into 100 mL of diethyl ether and therefrom, trimethoxysilylpropyldimethylamine and acetic acid as by-products were removed. This purification was repeated three times and then remaining diethyl ether was distilled off under reduced pressure, followed by dissolving the resultant concentrate in methanol to obtain a 30% methanol solution of trimethoxysilylpropyldimethylammonium acetate.

4.93 g of phenyltrimethoxysilane, 72.54 g of tetraethoxysilane, 22.08 g of methyltriethoxysilane, 0.44 g of the 30% methanol solution of trimethoxysilylpropyldimethylammonium acetate, and 150 g of acetone were charged into a 500 mL flask to be dissolved and the resultant mixed solution was warmed while stirring the mixed solution with a magnetic stirrer to reflux. Next, 33.16 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-24):

Formula (VII-24)

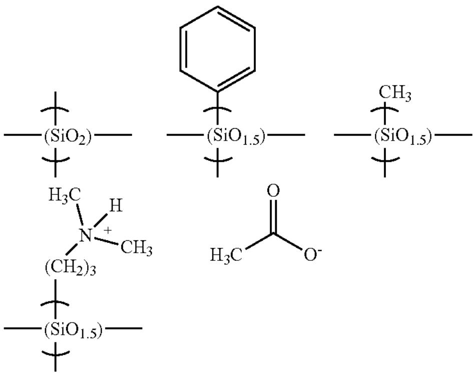

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 25

Ammonium Trifluoroacetate 0.1%

5.0 g of trimethoxysilylpropyldimethylamine and 18 g of ethyl acetate were charged into a 100 mL flask to be dissolved. While stirring the resultant mixed solution with a magnetic stirrer, to the mixed solution, a solution in which 4.6 g of methyl trifluoroacetate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, trimethoxysilylpropyldimethylamine and methyl trifluoroacetate as by-products were removed. This purification was repeated three times and then remaining diethyl ether was distilled off under reduced pressure, followed by dissolving the resultant concentrate in methanol to obtain a 30% methanol solution of trimethoxysilylpropyltrimethylammonium trifluoroacetate.

4.93 g of phenyltrimethoxysilane, 72.46 g of tetraethoxysilane, 22.06 g of methyltriethoxysilane, 0.56 g of the 30% methanol solution of trimethoxysilylpropyltrimethylammonium trifluoroacetate, and 150 g of acetone were charged into a 500 mL flask to be dissolved and the resultant mixed solution was warmed while stirring the mixed solution with a magnetic stirrer to reflux. Next, 33.13 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-25):

Formula (VII-25)

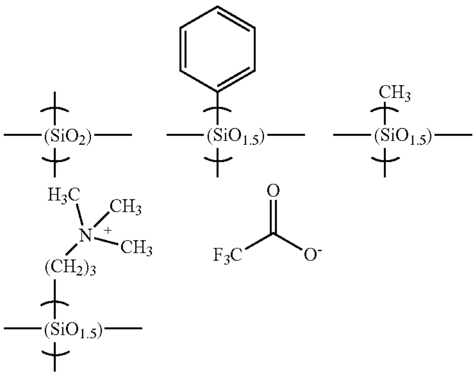

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 26

Ammonium Maleate 0.1%

5.0 g of trimethoxysilylpropyldimethylamine and 18 g of methanol were charged into a 100 mL flask to be dissolved. While stirring the resultant mixed solution with a magnetic stirrer, to the mixed solution, a solution in which 4.2 g of maleic acid was dissolved in 24 g of methanol was gradually added at room temperature in a nitrogen atmosphere. The reaction mixture was stirred for half a day and therefrom, methanol was distilled off under reduced pressure. The resultant concentrate was dropped into 100 mL of diethyl ether and therefrom, trimethoxysilylpropyldimethylamine and maleic acid as by-products were removed. This purification was repeated three times and then remaining diethyl ether was distilled off under reduced pressure, followed by dissolving the resultant concentrate in methanol to obtain a 30% methanol solution of trimethoxysilylpropyldimethylammonium maleate.

4.93 g of phenyltrimethoxysilane, 72.47 g of tetraethoxysilane, 22.06 g of methyltriethoxysilane, 0.54 g of the 30% methanol solution of trimethoxysilylpropyldimethylammonium maleate, and 150 g of acetone were charged into a 500 mL flask to be dissolved and the resultant mixed solution was warmed while stirring the mixed solution with a magnetic stirrer to reflux. Next, 33.14 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-26):

Formula (VII-26)

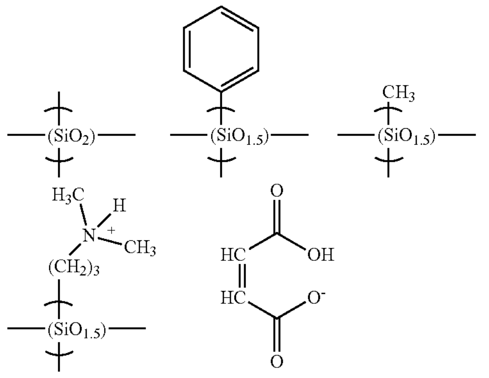

and was a polysiloxane derived from the raw material in which a silane having an onium group was contained in the total silanes at a ratio of 0.10% by mole. The molecular weight Mw of the obtained polymer was measured by GPC and found to be 2,200 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 27

Ammonium Chloride 0.1%

3.0 g of triethylamine and 18 g of ethyl acetate were charged into a 100 mL flask to be dissolved. While stirring the resultant mixed solution with a magnetic stirrer, to the mixed solution, a solution in which 8.8 g of trimethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, triethylamine and trimethoxysilylpropyl chloride as by-products were removed. This purification was repeated three times and then remaining diethyl ether was distilled off under reduced pressure, followed by dissolving the resultant concentrate in methanol to obtain a 30% methanol solution of trimethoxysilylpropyltriethylammonium chloride.

4.93 g of phenyltrimethoxysilane, 72.50 g of tetraethoxysilane, 22.07 g of methyltriethoxysilane, 0.50 g of the 30% methanol solution of trimethoxysilylpropyltriethylammonium chloride, and 150 g of acetone were charged into a 500 mL flask to be dissolved and the resultant mixed solution was warmed while stirring the mixed solution with a magnetic stirrer to reflux. Next, 33.15 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-27):

Formula (VII-27)

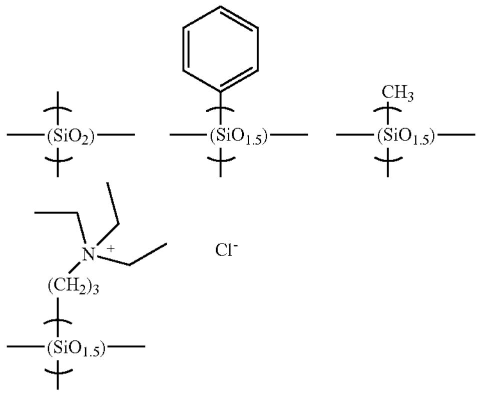

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 28

Bissilylammonium Chloride 0.1%

5.0 g of trimethoxysilylpropyldimethylamine and 18 g of ethyl acetate were charged into a 100 mL flask to be dissolved. While stirring the resultant mixed solution with a magnetic stirrer, to the mixed solution, a solution in which 7.2 g of trimethoxysilylpropyl chloride was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, trimethoxysilylpropyldimethylamine and trimethoxysilylpropyl chloride as by-products were removed. This purification was repeated three times and then remaining diethyl ether was distilled off under reduced pressure, followed by dissolving the resultant concentrate in methanol to obtain a 30% methanol solution of bis(trimethoxysilylpropyl)-N-dimethylammonium chloride.

4.92 g of phenyltrimethoxysilane, 72.37 g of tetraethoxysilane, 22.03 g of methyltriethoxysilane, 0.67 g of the 30% methanol solution of (trimethoxysilylpropyl)-N-dimethylammonium chloride, and 150 g of acetone were charged into a 500 mL flask to be dissolved and the resultant mixed solution was warmed while stirring the mixed solution with a magnetic stirrer to reflux. Next, 33.09 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-28):

Formula (VII-28)

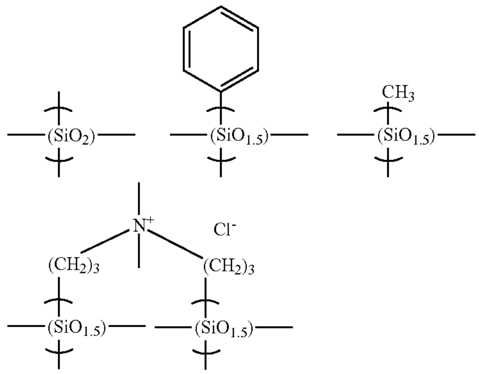

and was a polysiloxane derived from the raw material in which a silane having an onium group was contained in the total silanes at a ratio of 0.10% by mole. The molecular weight Mw of the obtained polymer was measured by GPC and found to be 2,100 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 29

Ammonium Methanesulfonate 0.1%

5.0 g of trimethoxysilylpropyldimethylamine and 18 g of ethyl acetate were charged into a 100 mL flask to be dissolved. While stirring the resultant mixed solution with a magnetic stirrer, to the mixed solution, a solution in which 4.0 g of methyl methanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, trimethoxysilylpropyldimethylamine and methyl methanesulfonate as by-products were removed. This purification was repeated three times and then remaining diethyl ether was distilled off under reduced pressure, followed by dissolving the resultant concentrate in methanol to obtain a 30% methanol solution of trimethoxysilylpropyltrimethylammonium methanesulfonate.

4.93 g of phenyltrimethoxysilane, 72.48 g of tetraethoxysilane, 22.07 g of methyltriethoxysilane, 0.53 g of the 30% methanol solution of trimethoxysilylpropyltrimethylammonium methanesulfonate, and 150 g of acetone were charged into a 500 mL flask to be dissolved and the resultant mixed solution was warmed while stirring the mixed solution with a magnetic stirrer to reflux. Next, 33.14 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-29):

Formula (VII-29)

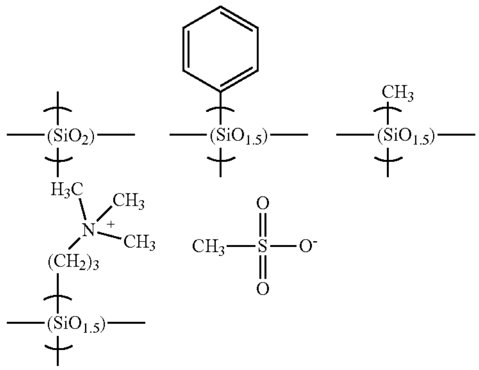

and was a polysiloxane derived from the raw material in which a silane having an onium group was contained in the total silanes at a ratio of 0.10% by mole. The molecular weight Mw of the obtained polymer was measured by GPC and found to be 2,300 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 30

Ammonium Trifluoromethanesulfonate 0.1%

5.0 g of trimethoxysilylpropyldimethylamine and 18 g of ethyl acetate were charged into a 100 mL flask to be dissolved. While stirring the resultant mixed solution with a magnetic stirrer, to the mixed solution, a solution in which 5.9 g of methyl trifluoromethanesulfonate was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, trimethoxysilylpropyldimethyl amine and methyl trifluoromethanesulfonate as by-products were removed. This purification was repeated three times and then remaining diethyl ether was distilled off under reduced pressure, followed by dissolving the resultant concentrate in methanol to obtain a 30% methanol solution of trimethoxysilylpropyltrimethylammonium trifluoromethanesulfonate.

4.92 g of phenyltrimethoxysilane, 72.42 g of tetraethoxysilane, 22.05 g of methyltriethoxysilane, 0.61 g of the 30% methanol solution of trimethoxysilylpropyltrimethylammonium trifluoromethanesulfonate, and 150 g of acetone were charged into a 500 mL flask to be dissolved and the resultant mixed solution was warmed while stirring the mixed solution with a magnetic stirrer to reflux. Next, 33.11 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-30):

Formula (VII-30)

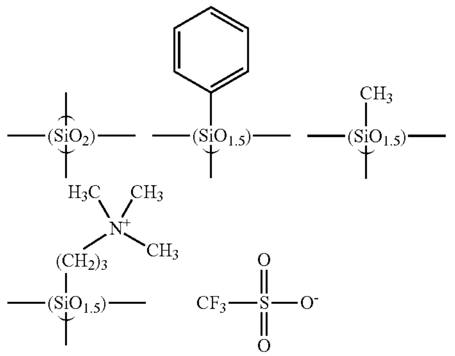

Formula (VII-31)

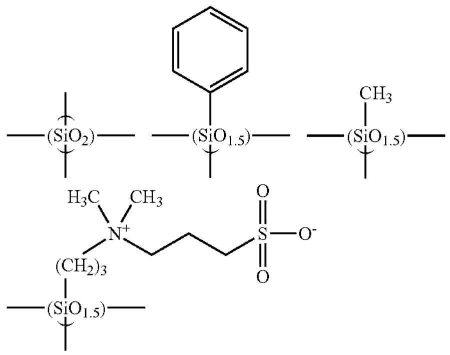

and was a polysiloxane derived from the raw material in which a silane having an onium group was contained in the total silanes at a ratio of 0.10% by mole. The molecular weight Mw of the obtained polymer was measured by GPC and found to be 2,300 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 31

Ammonio Propanesulfonate 0.1%

5.0 g of trimethoxysilylpropyldimethylamine and 18 g of ethyl acetate were charged into a 100 mL flask to be dissolved. While stirring the resultant mixed solution with a magnetic stirrer, to the mixed solution, a solution in which 4.4 g of propanesultone was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, trimethoxysilylpropyldimethylamine and propanesultone as by-products were removed. This purification was repeated three times and then remaining diethyl ether was distilled off under reduced pressure, followed by dissolving the resultant concentrate in methanol to obtain a 30% methanol solution of trimethoxysilylpropyldimethylammonio propanesulfonate.

4.93 g of phenyltrimethoxysilane, 72.47 g of tetraethoxysilane, 22.06 g of methyltriethoxysilane, 0.55 g of the 30% methanol solution of methoxysilylpropyldimethylammonio propanesulfonate, and 150 g of acetone were charged into a 500 mL flask to be dissolved and the resultant mixed solution was warmed while stirring the mixed solution with a magnetic stirrer to reflux. Next, 33.13 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-31):

and was a polysiloxane derived from the raw material in which a silane having an onium group was contained in the total silanes at a ratio of 0.10% by mole. The molecular weight Mw of the obtained polymer was measured by GPC and found to be 2,500 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 32

Sulfonium Iodide 0.1%

2.0 g of tetrahydrothiophene and 18 g of ethyl acetate were charged into a 100 mL flask to be dissolved. While stirring the resultant mixed solution with a magnetic stirrer, to the mixed solution, a solution in which 9.9 g of trimethoxysilylpropyl iodide was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, tetrahydrothiophene and trimethoxysilylpropyl iodide as by-products were removed. This purification was repeated three times and then remaining diethyl ether was distilled off under reduced pressure, followed by dissolving the resultant concentrate in methanol to obtain a 30% methanol solution of trimethoxysilylpropyltetrahydrothiophene iodide.

4.92 g of phenyltrimethoxysilane, 72.41 g of tetraethoxysilane, 22.04 g of methyltriethoxysilane, 0.63 g of the 30% methanol solution of trimethoxysilylpropyltetrahydrothiophene iodide, and 150 g of acetone were charged into a 500 mL flask to be dissolved and the resultant mixed solution was warmed while stirring the mixed solution with a magnetic stirrer to reflux, Next, 33.12 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-32):

Formula (VII-32)

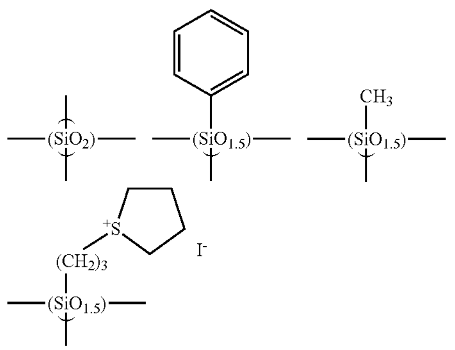

and was a polysiloxane derived from the raw material in which a silane having an onium group was contained in the total silanes at a ratio of 0.10% by mole. The molecular weight Mw of the obtained polymer was measured by GPC and found to be 4,400 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 33

Bissilylphosphonium Iodide 0.1%

5.0 g of diphenylphosphinoethyltrimethoxysilane and 18 g of ethyl acetate were charged into a 100 mL flask to be dissolved. While stirring the resultant mixed solution with a magnetic stirrer, to the mixed solution, a solution in which 6.5 g of trimethoxysilylpropyl iodide was dissolved in 24 g of ethyl acetate was gradually added at room temperature in a nitrogen atmosphere. The reaction mixture was refluxed over 3 days and therefrom, ethyl acetate was distilled off under reduced pressure. The resultant concentrate was dropped into 100 mL of diethyl ether and therefrom, diphenylphosphinoethyltrimethoxysilane and allyl iodide as by-products were removed. This purification was repeated three times and then remaining diethyl ether was distilled off under reduced pressure, followed by dissolving the resultant concentrate in methanol to obtain a 30% methanol solution of bis(trimethoxysilyl)ethylpropyldiphenylphosphonium iodide.

4.90 g of phenyltrimethoxysilane, 72.11 g of tetraethoxysilane, 21.95 g of methyltriethoxysilane, 1.03 g of the 30% methanol solution of bis(trimethoxysilyl)ethylpropyldiphenylphosphonium iodide, and 150 g of acetone were charged into a 500 mL flask to be dissolved and the resultant mixed solution was warmed while stirring the mixed solution with a magnetic stirrer to reflux, Next, 32.97 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-33):

Formula (VII-33)

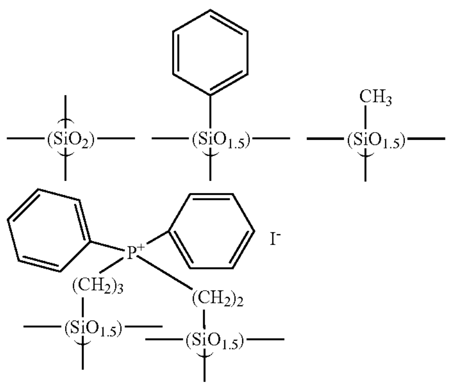

and was a polysiloxane derived from the raw material in which a silane having an onium group was contained in the total silanes at a ratio of 0.10% by mole. The molecular weight Mw of the obtained polymer was measured by GPC and found to be 5,000 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 34

Imidazolium Maleate 0.1%

4.86 g of phenyltrimethoxysilane, 71.36 g of tetraethoxysilane, 17.37 g of methyltriethoxysilane, 5.78 g of glycidoxypropyltrimethoxysilane, 0.64 g of a 30% methanol solution of triethoxysilylpropyl-4,5-dihydroimidazolium maleate, and 150 g of acetone were charged into a 500 mL flask to be dissolved and the resultant mixed solution was warmed while stirring the mixed solution with a magnetic stirrer to reflux. Next, 32.61 g of 0.01 M nitric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-34):

Formula (VII-34)

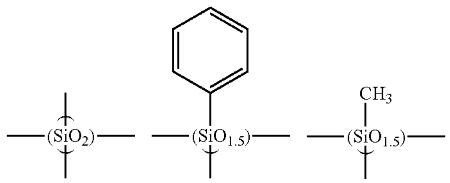

-continued

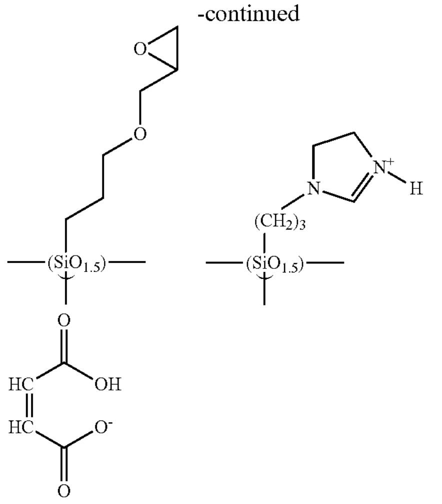

and was a polysiloxane derived from the raw material in which a silane having an onium group was contained in the total silanes at a ratio of 0.10% by mole. The molecular weight Mw of the obtained polymer was measured by GPC and found to be 5,000 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 35

Imidazolium Maleate 0.1%

4.90 g of phenyltrimethoxysilane, 72.07 g of tetraethoxysilane, 17.56 g of methyltriethoxysilane, 4.85 g of mercaptopropyltrimethoxysilane, 0.64 g of a 30% methanol solution of triethoxysilylpropyl-4,5-dihydroimidazolium maleate, and 150 g of acetone were charged into a 500 mL flask to be dissolved and the resultant mixed solution was warmed while stirring the mixed solution with a magnetic stirrer to reflux. Next, 32.61 g of 0.01 M nitric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-35):

Formula (VII-35)

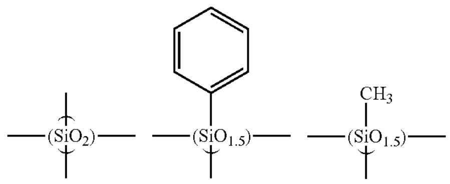

-continued

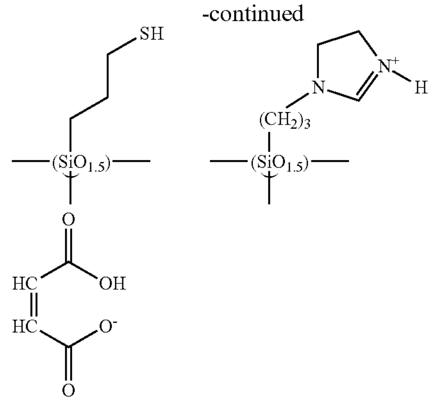

and was a polysiloxane derived from the raw material in which a silane having an onium group was contained in the total silanes at a ratio of 0.10% by mole. The molecular weight Mw of the obtained polymer was measured by GPC and found to be 5,000 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Synthesis Example 36

Containing No Onium Salt 4.95 g of phenyltrimethoxysilane, 72.80 g of tetraethoxysilane, 22.25 g of methyltriethoxysilane, and 150 g of acetone were charged into a 500 mL flask to be dissolved and the resultant mixed solution was warmed while stirring the mixed solution with a magnetic stirrer to reflux. Next, 33.28 g of 0.01 M hydrochloric acid was added to the mixed solution. The mixed solution was subjected to the reaction for 240 minutes and then the resultant reaction solution was cooled down to room temperature. Then, 200 g of propylene glycol monoethyl ether was added to the reaction solution, and ethanol and methanol as reaction by-products, acetone, water, and hydrochloric acid were distilled off under reduced pressure to obtain a hydrolysis-condensation product. The polymer thus obtained corresponded to Formula (VII-36):

Formula (VII-36)

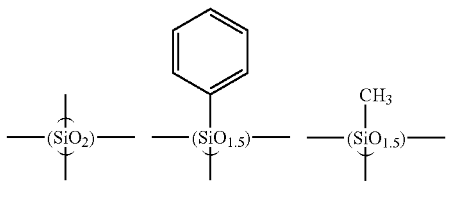

The molecular weight Mw of the obtained polymer was measured by GPC and found to be 1,500 in terms of polystyrene. A residue remaining after removing a solvent from the obtained hydrolysis-condensation product solution at 140° C. was defined as a solid content and the solid content was adjusted with propylene glycol monoethyl ether to be 15% by mass.

Comparative Synthesis Example 1

1.94 g of phenyltrimethoxysilane, 26.47 g of tetraethoxysilane, 10.46 g of methyltriethoxysilane, and 31.50 g of ethanol were charged into a 300 mL flask to be dissolved and the resultant mixed solution was warmed while stirring the mixed solution with a magnetic stirrer to reflux. Next, an aqueous solution in which 1.13 g of maleic acid was dissolved in 128.50 g of ion-exchanged water was added to the mixed solution. The mixed solution was subjected to the reaction for 120 minutes and then the resultant reaction solution was cooled down to room temperature. Then, 200 g of propylene glycol monopropyl ether was added to the reaction solution and ethanol as a reaction by-product and water were distilled off under reduced pressure to obtain a hydrolysis-condensation product. The polymer thus obtained corresponded to Formula (VII-36). The molecular weight of the obtained polymer was measured by GPC and found to be 3,100 in terms of polystyrene.

Example 1

Imidazolium Acetate-Containing Si Resist Underlayer Film

To 63.14 g of a solution (16.63% by mass) obtained in Synthesis Example 1, 14.48 g of water, 164.49 g of propylene glycol monoethyl ether, and 57.90 g of propylene glycol monomethyl ether were added to prepare a resist underlayer film material.

Example 2

Ammonium Acetate-Containing Si Resist Underlayer Film

To 116.19 g of a solution (10.07% by mass) obtained in Synthesis Example 2, 14.42 g of water, 111.74 g of propylene glycol monoethyl ether, and 57.66 g of propylene glycol monomethyl ether were added to prepare a resist underlayer film material.

Example 3

Imidazolium Maleate-Containing Si Resist Underlayer Film

To 85.71 g of a solution (12.25% by mass) obtained in Synthesis Example 3, 14.48 g of water, 141.91 g of propylene glycol monoethyl ether, and 57.90 g of propylene glycol monomethyl ether were added to prepare a resist underlayer film material.

Example 4

Ammonium Maleate-Containing Si Resist Underlayer Film

To 79.67 g of a solution (13.18% by mass) obtained in Synthesis Example 4, 14.48 g of water, 147.95 g of propylene glycol monoethyl ether, and 57.90 g of propylene glycol monomethyl ether were added to prepare a resist underlayer film material.

Example 5

Pyridinium Maleate-Containing Si Resist Underlayer Film

To 51.98 g of a solution (20.20% by mass) obtained in Synthesis Example 5, 14.48 g of water, 175.64 g of propylene glycol monoethyl ether, and 57.90 g of propylene glycol monomethyl ether were added to prepare a resist underlayer film material.

Example 6

Ammonium Methanesulfonate-Containing Si Resist Underlayer Film

To 113.04 g of a solution (10.35% by mass) obtained in Synthesis Example 6, 14.42 g of water, 114.88 g of propylene glycol monoethyl ether, and 57.66 g of propylene glycol monomethyl ether were added to prepare a resist underlayer film material.

Example 7

Pyridinium Methanesulfonate-Containing Si Resist Underlayer Film

To 100.52 g of a solution (11.64% by mass) obtained in Synthesis Example 7, 14.42 g of water, 127.41 g of propylene glycol monoethyl ether, and 57.66 g of propylene glycol monomethyl ether were added to prepare a resist underlayer film material.

Example 8

Si Resist Underlayer Film Containing Imidazolium Acetate and Imidazolium Trifluoromethanesulfonate To 5 g of the solution (15% by mass) obtained in Synthesis Example 8, 5 g of the solution (15% by mass) obtained in Synthesis Example 14, 0.015 g of maleic acid, 12.11 g of water, and 72.56 g of propylene glycol monoethyl ether were added to prepare a resist underlayer film material.

Example 9

Si Resist Underlayer Film Containing Imidazolium Trifluoroacetate and Imidazolium Methanesulfonate To 5 g of the solution (15% by mass) obtained in Synthesis Example 9, 5 g of the solution (15% by mass) obtained in Synthesis Example 13, 0.015 g of maleic acid, 12.11 g of water, and 72.56 g of propylene glycol monoethyl ether were added to prepare a resist underlayer film material.

Example 10

Imidazolium Maleate-Containing Si Resist Underlayer Film

To 10 g of the solution (15% by mass) obtained in Synthesis Example 10, 0.015 g of maleic acid, 12.11 g of water, and 72.56 g of propylene glycol monoethyl ether were added to prepare a resist underlayer film material.

Example 11

Si Resist Underlayer Film Containing Imidazolium Chloride and Imidazolio Propanesulfonate To 5 g of the solution (15% by mass) obtained in Synthesis Example 11, 5 g of the solution (15% by mass) obtained in Synthesis Example 15, 0.015 g of maleic acid, 12.11 g of water, and 72.56 g of propylene glycol monoethyl ether were added to prepare a resist underlayer film material.

Example 12

Si Resist Underlayer Film Containing Bissilylimidazolium Chloride and Imidazolium Methanesulfonate To 5 g of the solution (15% by mass) obtained in Synthesis Example 12, 5 g of the solution (15% by mass) obtained in Synthesis Example 13, 0.015 g of maleic acid, 12.11 g of water, and 72.56 g of propylene glycol monoethyl ether were added to prepare a resist underlayer film material.

Example 13

Si Resist Underlayer Film Containing Pyridinium Acetate and Pyridinium Trifluoromethanesulfonate To 5 g of the solution (15% by mass) obtained in Synthesis Example 16, 5 g of the solution (15% by mass) obtained in Synthesis Example 22, 0.015 g of maleic acid, 12.11 g of water, and 72.56 g of propylene glycol monoethyl ether were added to prepare a resist underlayer film material.

Example 14

Si Resist Underlayer Film Containing Pyridinium Trifluoroacetate and Pyridinium Methanesulfonate To 5 g of the solution (15% by mass) obtained in Synthesis Example 17, 5 g of the solution (15% by mass) obtained in Synthesis'Example 21, 0.015 g of maleic acid, 12.11 g of water, and 72.56 g of propylene glycol monoethyl ether were added to prepare a resist underlayer film material.

Example 15

Pyridinium Maleate-Containing Si Resist Underlayer Film

To 10 g of the solution (15% by mass) obtained in Synthesis Example 18, 0.015 g of maleic acid, 12.11 g of water, and 72.56 g of propylene glycol monoethyl ether were added to prepare a resist underlayer film material.

Example 16

Si Resist Underlayer Film Containing Pyridinium Chloride and Pyridinio Propanesulfonate To 5 g of the solution (15% by mass) obtained in Synthesis Example 19, 5 g of the solution (15% by mass) obtained in Synthesis Example 23, 0.015 g of maleic acid, 12.11 g of water, and 72.56 g of propylene glycol monoethyl ether were added to prepare a resist underlayer film material.

Example 17

Si Resist Underlayer Film Containing Bissilylpyridinium Chloride and Pyridinium Methanesulfonate To 5 g of the solution (15% by mass) obtained in Synthesis Example 20, 5 g of the solution (15% by mass) obtained in Synthesis Example 21, 0.015 g of maleic acid, 12.11 g of water, and 72.56 g of propylene glycol monoethyl ether were added to prepare a resist underlayer film material.

Example 18

Si Resist Underlayer Film Containing Ammonium Acetate and Ammonium Trifluoromethanesulfonate To 5 g of the solution (15% by mass) obtained in Synthesis Example 24, 5 g of the solution (15% by mass) obtained in Synthesis Example 30, 0.015 g of maleic acid, 12.11 g of water, and 72.56 g of propylene glycol monoethyl ether were added to prepare a resist underlayer film material.

Example 19

Si Resist Underlayer Film Containing Ammonium Trifluoroacetate and Ammonium Methanesulfonate To 5 g of the solution (15% by mass) obtained in Synthesis Example 25, 5 g of the solution (15% by mass) obtained in Synthesis Example 29, 0.015 g of maleic acid, 12.11 g of water, and 72.56 g of propylene glycol monoethyl ether were added to prepare a resist underlayer film material.

Example 20

Ammonium Maleate-Containing Si Resist Underlayer Film

To 10 g of the solution (15% by mass) obtained in Synthesis Example 26, 0.015 g of maleic acid, 12.11 g of water, and 72.56 g of propylene glycol monoethyl ether were added to prepare a resist underlayer film material.

Example 21

Si Resist Underlayer Film Containing Ammonium Chloride and Ammonio Propanesulfonate To 5 g of the solution (15% by mass) obtained in Synthesis Example 27, 5 g of the solution (15% by mass) obtained in Synthesis Example 31, 0.015 g of maleic acid, 12.11 g of water, and 72.56 g of propylene glycol monoethyl ether were added to prepare a resist underlayer film material.

Example 22

Si Resist Underlayer Film Containing Bissilylammonium Chloride and Ammonium Methanesulfonate To 5 g of the solution (15% by mass) obtained in Synthesis Example 28, 5 g of the solution (15% by mass) obtained in Synthesis Example 29, 0.015 g of maleic acid, 12.11 g of water, and 72.56 g of propylene glycol monoethyl ether were added to prepare a resist underlayer film material.

Example 23

Si Resist Underlayer Film Containing Sulfonium Iodide and Bissilylphosphonium Iodide)

To 5 g of the solution (15% by mass) obtained in Synthesis Example 32, 5 g of the solution (15% by mass) obtained in Synthesis Example 33, 0.015 g of maleic acid, 12.11 g of water, and 72.56 g of propylene glycol monoethyl ether were added to prepare a resist underlayer film material.

Example 24

Si Resist Underlayer Film Containing Imidazolium Chloride and Imidazolium Methanesulfonate To 10 g of the solution (15% by mass) obtained in Synthesis Example 36, 0.015 g of maleic acid, 0.0023 g of trimethoxysilylimidazolium chloride, 0.0023 g of trimethoxysilylimidazolium methanesulfonate, 12.15 g of water, and 72.58 g of propylene glycol monoethyl ether were added to prepare a resist underlayer film material.

Example 25

Si Resist Underlayer Film Containing Imidazolium Maleate and Epoxy

To 10 g of the solution (15% by mass) obtained in Synthesis Example 34, 0.015 g of maleic acid, 12.11 g of water, and 72.56 g of propylene glycol monoethyl ether were added to prepare a resist underlayer film material.

Example 26

Si Resist Underlayer Film Containing Imidazolium Maleate And Thiol

To 10 g of the solution (15% by mass) obtained in Synthesis Example 35, 0.015 g of maleic acid, 12.11 g of water, and 72.56 g of propylene glycol monoethyl ether were added to prepare a resist underlayer film material.

Comparative Example 1

To 50 g of a solution (10% by mass) obtained in Comparative Synthesis Example 1, 6.84 g of water, 57.63 g of propylene glycol monopropyl ether, and 27.38 g of propylene glycol monomethyl ether were added to prepare a resist underlayer film material.

Comparative Example 2

To 50 g of a solution (10% by mass) obtained in Comparative Synthesis Example 1, 0.05 g of benzyltriethylammonium chloride, 7.05 g of water, 60.69 g of propylene glycol monopropyl ether, and 28.19 g of propylene glycol monomethyl ether were added to prepare a resist underlayer film material.

(Evaluation of Solvent Resistance)

The resist underlayer film material was applied onto a silicon wafer by a spin coating method and was baked on a hot plate at 160° C. for 1 minute. Then, the resist underlayer film material was immersed in propylene glycol monomethyl ether acetate used as a resist solvent for 1 minute. When the change in the film thickness of the coating film between before and after the immersion was 2 nm or less, the evaluation was made as "advantageous", and when the change was more than 2 nm, the evaluation was made as "disadvantageous".

TABLE 1

| Solvent resistance test | |
|---|---|
| Example 1 | advantageous |
| Example 2 | advantageous |
| Example 3 | advantageous |
| Example 4 | advantageous |
| Example 5 | advantageous |
| Example 6 | advantageous |
| Example 7 | advantageous |
| Example 8 | advantageous |
| Example 9 | advantageous |
| Example 10 | advantageous |
| Example 11 | advantageous |
| Example 12 | advantageous |
| Example 13 | advantageous |
| Example 14 | advantageous |
| Example 15 | advantageous |
| Example 16 | advantageous |
| Example 17 | advantageous |
| Example 18 | advantageous |
| Example 19 | advantageous |
| Example 20 | advantageous |
| Example 21 | advantageous |
| Example 22 | advantageous |
| Example 23 | advantageous |
| Example 24 | advantageous |
| Example 25 | advantageous |
| Example 26 | advantageous |
| Comparative Example 1 | disadvantageous |
| Comparative Example 2 | disadvantageous |

(Optical Constants)

The resist underlayer film solution was applied onto a silicon wafer using a spinner. The composition was heated on a hot plate at 240° C. for 1 minute to form a resist underlayer film (film thickness: 0.09 μm). Then, the refractive index (n value) and the optical absorptivity (k value; also called as the attenuation coefficient) at a wavelength of 193 nm of the resist underlayer film were measured using a spectro-ellipsometer (VUV-VASE VU-302; manufactured by J. A. Woollam Corporation). The result of the measurement is shown in Table 2.

TABLE 2

| Refractive index n and optical absorptivity k | | |
|---|---|---|
| | Refractive index n (wavelength 193 nm) | Optical absorptivity k (wavelength 193 nm) |
| Example 1 | 1.62 | 0.12 |
| Example 2 | 1.63 | 0.12 |
| Example 3 | 1.63 | 0.12 |
| Example 4 | 1.64 | 0.14 |
| Example 5 | 1.65 | 0.16 |
| Example 6 | 1.64 | 0.15 |
| Example 7 | 1.65 | 0.15 |
| Example 8 | 1.63 | 0.13 |
| Example 9 | 1.63 | 0.13 |
| Example 10 | 1.63 | 0.13 |
| Example 11 | 1.63 | 0.13 |
| Example 12 | 1.63 | 0.13 |
| Example 13 | 1.63 | 0.13 |
| Example 14 | 1.63 | 0.13 |
| Example 15 | 1.63 | 0.13 |
| Example 16 | 1.63 | 0.13 |
| Example 17 | 1.63 | 0.13 |
| Example 18 | 1.63 | 0.13 |
| Example 19 | 1.63 | 0.13 |
| Example 20 | 1.63 | 0.13 |
| Example 21 | 1.63 | 0.13 |
| Example 22 | 1.63 | 0.13 |
| Example 23 | 1.63 | 0.13 |
| Example 24 | 1.63 | 0.13 |
| Example 25 | 1.63 | 0.13 |
| Example 26 | 1.63 | 0.13 |
| Comparative Example 1 | 1.60 | 0.11 |
| Comparative Example 2 | 1.60 | 0.12 |

(Measurement of Dry Etching Rate)

Etchers and etching gases used in the measurement of dry etching rates were as follows.

ES401 (manufactured by Nippon Scientific Co., Ltd.): $CF_4$

RIE-10NR (manufactured by Samco, Inc.): $O_2$

Each of the solutions of resist underlayer film forming compositions prepared in Examples 1 to 26 and Comparative Examples 1 and 2 was applied onto a silicon wafer using a spinner. The composition solution was heated on a hot plate at 240° C. for 1 minute to form a resist underlayer film. In the case of measurement with $CF_4$ gas, a film thickness of 0.20 μm was used and in the case of measurement with $O_2$ gas, a film thickness of 0.08 μm was used. In the same manner, a photoresist solution (trade name: UV 113; manufactured by Shipley Company, L.L.C.) was applied onto a silicon wafer using a spinner to form a coating film. Using $CF_4$ gas and $O_2$ gas as the etching gas, the dry etching rate was measured. Then, the dry etching rate of each of the resist underlayer films of Examples 1 to 26 and Comparative Examples 1 and 2 was compared with that of the resist film that was formed separately in the same manner. The result is shown in Table 2. The rate ratio is a dry etching rate ratio of (resist underlayer film)/(resist).

TABLE 3

| | Dry etching rate ratio | |
|---|---|---|
| | $CF_4$ | $O_2$ |
| Example 1 | 2.0 | 0.02 |
| Example 2 | 2.0 | 0.02 |
| Example 3 | 1.9 | 0.02 |
| Example 4 | 1.9 | 0.02 |
| Example 5 | 2.0 | 0.02 |
| Example 6 | 1.9 | 0.02 |
| Example 7 | 2.1 | 0.02 |
| Example 8 | 1.7 | 0.01 |
| Example 9 | 1.7 | 0.01 |
| Example 10 | 1.6 | 0.02 |
| Example 11 | 1.6 | 0.01 |
| Example 12 | 1.6 | 0.01 |
| Example 13 | 1.6 | 0.01 |
| Example 14 | 1.6 | 0.01 |
| Example 15 | 1.7 | 0.02 |
| Example 16 | 1.6 | 0.01 |
| Example 17 | 1.6 | 0.01 |
| Example 18 | 1.6 | 0.01 |
| Example 19 | 1.6 | 0.01 |
| Example 20 | 1.7 | 0.02 |
| Example 21 | 1.6 | 0.01 |
| Example 22 | 1.6 | 0.01 |
| Example 23 | 1.7 | 0.01 |
| Example 24 | 1.7 | 0.01 |
| Example 25 | 1.7 | 0.01 |
| Example 26 | 1.7 | 0.01 |
| Comparative Example 1 | 1.7 | 0.02 |
| Comparative Example 2 | 1.7 | 0.02 |

<Preparation of Underlayer Organic Film Forming Composition>

Into a 200 mL flask, 16.5 g of acenaphthylene, 1.5 g of 4-hydroxystyrene, and 60 g of 1,2-dichloroethane as a solvent were charged. Thereto, 1 g of trifluoro boron as a polymerization initiator was added and the resultant reaction mixture was heated to 60° C. and was then subjected to the reaction for 24 hours. To this solution, 1 L of methanol and 500 g of water were added and the resultant reaction mixture was subjected to a re-precipitation purification, followed by filtering and drying the resultant white solid to obtain 11 g of a white polymer.

The obtained polymer below:

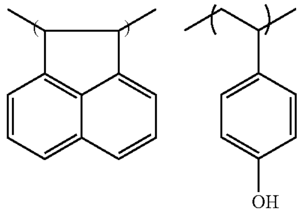

was measured by $^{13}$C-NMR, $^{1}$H-NMR, and GPC and was found to be acenaphthylene:4-hydroxystyrene=86:14.

Mw: 6,000, Mw/Mn=1.5.

To 10 g of the obtained polymer, 1.0 g of tetramethoxymethyl glycoluril (trade name: POWDER LINK 1174; manufactured by Mitsui Cytec Ltd.), 0.01 g of p-toluenesulfonic acid as a crosslinking catalyst, and 0.03 g of MEGAFAC R-30 (trade name; manufactured by Dainippon Ink and Chemicals, Inc.) as a surfactant were added and the resultant mixture was dissolved in 101.57 g of propylene glycol monomethyl ether acetate and 25.39 g of propylene glycol monomethyl ether. Then, the resultant solution was filtered using a polyethylene microfilter having a pore diameter of 0.10 μm and was further filtered using a polyethylene microfilter having a pore diameter of 0.05 μm to prepare a solution of an underlayer organic film forming composition to be used for a lithography process by a multilayer film.

<Resist Patterning Evaluation 1>

The underlayer organic film forming composition prepared as described above was applied onto a silicon wafer and the composition was heated on a hot plate at 240° C. for 1 minute to obtain an underlayer organic film (layer A) having a film thickness of 250 nm. On the underlayer organic film, each of the resist underlayer film forming compositions obtained in Examples 1 to 26 and Comparative Examples 1 and 2 was applied and the composition was heated on a hot plate at 240° C. for 1 minute to obtain a resist underlayer film having a film thickness of 35 nm. On the resist underlayer film, a commercially available photoresist solution (trade name: PAR 855; manufactured by Sumitomo Chemical Co., Ltd.) was applied by a spinner and the solution was heated on a hot plate at 100° C. for 1 minute to form a photoresist film having a film thickness of 150 nm. The patterning of the resist was performed using an exposing machine (S307E scanner; manufactured by Nikon Corporation; wavelength: 193 nm, NA, σ: 0.85, 0.93/0.85 (Annular)). The target was a photoresist after the development having a line width and a width between lines both of 0.08 μm, which is a so-called line and space (dense line), and the exposure was performed through a mask set to form 9 lines. Then, the resist pattern was baked on a hot plate at 105° C. for 60 seconds, was cooled down, and was developed with a 2.38% tetramethylammonium hydroxide developer.

With respect to the resist pattern skirt shape after the lithography was performed, a shape having a straight line was evaluated as "advantageous" and a shape having an undercut (tapering of bottom portion), a footing (spreading of bottom portion), or a pattern collapse was evaluated as "disadvantageous". Even in the case where a slight footing was partially observed, when there is practically no problem, such a shape was evaluated as "advantageous (with proviso that footing partially existed)".

TABLE 4

| Resist shape evaluation 1 | |
|---|---|
| | Resist skirt shape |
| Example 1 | advantageous |
| Example 2 | advantageous |
| Example 3 | advantageous |
| Example 4 | advantageous |
| Example 5 | advantageous |
| Example 6 | advantageous |
| Example 7 | advantageous |
| Example 8 | advantageous |
| Example 9 | advantageous |
| Example 10 | advantageous |
| Example 11 | advantageous |
| Example 12 | advantageous |
| Example 13 | advantageous |
| Example 14 | advantageous |
| Example 15 | advantageous |
| Example 16 | advantageous |
| Example 17 | advantageous |
| Example 18 | advantageous |
| Example 19 | advantageous |
| Example 20 | advantageous |
| Example 21 | advantageous |
| Example 22 | advantageous |
| Example 23 | advantageous |
| Example 24 | advantageous |
| Example 25 | advantageous |
| Example 26 | advantageous |
| Comparative Example 1 | disadvantageous (partial pattern break) |
| Comparative Example 2 | advantageous |

<Resist Patterning Evaluation 2>

The underlayer organic film forming composition prepared as described above was applied onto a silicon wafer and the composition was heated on a hot plate at 240° C. for 1 minute to obtain an underlayer organic film having a film thickness of 250 nm. On the underlayer organic film, each of the resist underlayer film forming compositions obtained in Examples 1 to 26 and Comparative Examples 1 and 2 was applied and the composition was heated on a hot plate at 240° C. for 1 minute to obtain a resist underlayer film having a film thickness of 35 nm. On the resist underlayer film, a commercially available photoresist solution (trade name: PAR 855; manufactured by Sumitomo Chemical Co., Ltd.) was applied by a spinner and the solution was heated on a hot plate at 100° C. for 1 minute to form a photoresist film having a film thickness of 150 nm. The patterning of the resist was performed using an immersion exposing machine (TWINSCAN XT: 1900Gi scanner; manufactured by ASML Holding N.V.; wavelength: 193 nm, NA, σ: 1.20, 0.94/0.74 (C-quad), immersion liquid: water). The target was a photoresist after the development having a line width and a width between lines both of 0.05 μm, which is a so-called line and space (dense line), and the exposure was performed through a mask set to form 15 lines. Then, the resist pattern was baked on a hot plate at 105° C. for 60 seconds, was cooled down, and was developed with a 2.38% tetramethylammonium hydroxide developer.

With respect to the resist pattern skirt shape after the lithography was performed, a shape having a straight line was evaluated as "advantageous" and a shape having an undercut (tapering of bottom portion), a footing (spreading of bottom portion), or a pattern collapse was evaluated as "disadvantageous".

TABLE 5

| Resist shape evaluation 2 | |
|---|---|
| | Resist skirt shape |
| Example 1 | advantageous (footing partially existed) |
| Example 2 | advantageous (footing partially existed) |
| Example 3 | advantageous |
| Example 4 | advantageous (footing partially existed) |
| Example 5 | advantageous (footing partially existed) |
| Example 6 | advantageous (footing partially existed) |
| Example 7 | advantageous |
| Example 8 | advantageous |
| Example 9 | advantageous |
| Example 10 | advantageous |
| Example 11 | advantageous |
| Example 12 | advantageous |
| Example 13 | advantageous |
| Example 14 | advantageous |
| Example 15 | advantageous |
| Example 16 | advantageous |
| Example 17 | advantageous |
| Example 18 | advantageous |
| Example 19 | advantageous |
| Example 20 | advantageous |
| Example 21 | advantageous |
| Example 22 | advantageous |
| Example 23 | advantageous |
| Example 24 | advantageous |
| Example 25 | advantageous |
| Example 26 | advantageous |
| Comparative Example 1 | disadvantageous (pattern collapse) |
| Comparative Example 2 | advantageous (footing) |

In Examples 1 to 26 of the present invention, there was used either a polyorganosiloxane obtained by subjecting a hydrolyzable organosilane in which an onium group was incorporated in the molecule thereof beforehand to hydrolysis and condensation, or a combination of a polyorganosiloxane with a hydrolyzable organosilane in which an onium group was incorporated in the molecule of a silane beforehand. On the other hand, Comparative Example 1 is a case where a polysiloxane containing no onium group was used. Comparative Example 2 is a case where the polysiloxane contained no onium group and the composition contained an onium salt as a mixture.

As the result of the solvent resistance test, Examples 1 to 26 exhibited more advantageous solvent resistance than that of Comparative Example 1 or Comparative Example 2. Thus, on the resist underlayer film formed from the resist underlayer film forming composition of the present invention, a resist film can be formed without causing intermixing.

As the result of the resist patterning evaluation, Examples 1 to 26 exhibited advantageous resist shapes. As the result of fine patterning evaluation by an immersion exposure, Examples 1 to 26 except Examples 1, 2, 4, 5, and 6 exhibited advantageous resist shapes. Although with respect to a pattern having a line and space of 0.08 μm, Examples 1, 2, 4, 5, and 6 containing a siloxane polymer having an onium group of 1% by mole had practically no problem, with respect to a pattern having a line and space of 0.05 μm, these Examples slightly exhibited a partially footing shape.

With respect to the dry etching rate test, in Examples 1 to 7 containing an onium group at around 1.0%, the etching rate by a fluorine-based gas was enhanced higher than in Comparative Examples 1 and 2, so that in these Examples, it is possible to accurately transfer a resist pattern of an upper layer of the resist underlayer film of the present invention to the resist underlayer film of the present invention.

In Examples 1 to 26, the etching resistance against an oxygen gas was the same as that in Comparative Examples 1 and 2, so that these Examples have satisfactorily high function as a hard mask for processing an underlayer organic film or a substrate as further underlayers of the resist underlayer film of the present invention.

When comparing Comparative Example 1 with Comparative Example 2, it became apparent that even when an ammonium salt is contained in the composition as a mixture, the dry etching rate by a fluorine-based gas is not enhanced, and by incorporating an ammonium salt in a silane, a high dry etching rate can be obtained.

As described above, a resist underlayer film containing an onium group exhibits solvent resistance, advantageous etching characteristics, optical characteristics, and advantageous lithography characteristics.

INDUSTRIAL APPLICABILITY

A cured film formed from the (resist underlayer) film forming composition according to the present invention causes no intermixing with a resist and can be used as a hard mask and a bottom anti-reflective coating. When a halogenated gas is used, the film forming composition can be utilized as a resist underlayer film for lithography having a dry etching rate larger than that of a resist.

The invention claimed is:

1. A film forming composition comprising:

a silane compound having an onium group, wherein the silane compound having an onium group is a hydrolyzable organosilane having, in a molecule thereof, an onium group, a hydrolysis product thereof, or a hydrolysis-condensation product thereof, and a silane compound having no onium group, wherein the silane compound having an onium group is contained at a ratio of 0.01 to 0.95% by mole on the basis of a total amount of silane compounds in the film forming composition.

2. The composition according to claim 1, wherein the hydrolyzable organosilane is a compound of Formula (1):

$R^1_aR^2_bSi(R^3)_{4-(a+b)}$ Formula (1)

(where $R^1$ is an onium group or an organic group containing an onium group, and is a group bonded to a silicon atom through a Si—N bond, a Si—P bond, a Si—S bond, or a Si—C bond; $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond; $R^3$ is an alkoxy group, an acyloxy group, or a halogen group; and a is an integer of 1 or 2, and b is an integer of 0 or 1, where a+b is an integer of 1 or 2).

3. The composition according to claim 2, comprising:

a combination of the hydrolyzable organosilane of Formula (1) with at least one of organosilicon compound selected from a group consisting of compounds of Formula (9) and Formula (10):

$R^6_aSi(R^7)_{4-a}$ Formula (9)

(where $R^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond; $R^7$ is an alkoxy group, an acyloxy group, or a halogen group; and a is an integer of 0 to 3), $[R^8_cSi(R^9)_{3-c}]_2Y_b$ Formula (10)

(where $R^8$ is an alkyl group bonded to a silicon atom through a Si—C bond; $R^9$ is an alkoxy group, an acyloxy group, or a halogen group; Y is an alkylene group or an arylene group; b is an integer of 0 or 1; and c is an integer of 0 or 1);

a hydrolysis product thereof; or a hydrolysis-condensation product thereof.

4. The composition according to claim 1, wherein the onium group is an ammonium group, a sulfonium group, an iodonium group, or a phosphonium group.

5. The composition according to claim 1, wherein the onium group is a cyclic ammonium group or a linear ammonium group.

6. The composition according to claim 5, wherein the cyclic ammonium group is an aromatic heterocyclic ammonium group of Formula (2):

Formula (2)

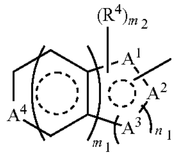

[where $A^1$, $A^2$, $A^3$, and $A^4$ are individually a group of Formula (3):

Formula (3)

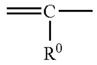

(where $R^0$s are individually a single bond, a hydrogen atom, an alkyl group, an aryl group, an aralkyl group, or an alkenyl group), Formula (4), or Formula (4'):

Formula (4)

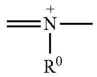

Formula (4')

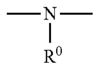

(where $R^0$s are individually a single bond, a hydrogen atom, an alkyl group, an aryl group, an aralkyl group, or an alkenyl group), where at least one of $A^1$ to $A^4$ is a group of Formula (4); the substituent $R^4$s are individually an alkyl group, an aryl group, an aralkyl group, an alkenyl group, a hydroxy group, or a combination thereof, where $R^4$s optionally form a ring with each other; $n_1$ is an integer of 1 to 8; $m_1$ is an integer of 0 or 1; and $m_2$ is 0 or an integer of 1 to a maximum number of $R^4$s that are substituted on a monocycle or a polycycle], or an aliphatic heterocyclic ammonium group of Formula (5):

Formula (5)

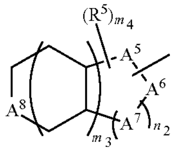

[where $A^5$, $A^6$, $A^7$, and $A^8$ are individually a group of Formula (6):

Formula (6)

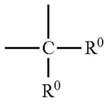

(where $R^0$s are individually a single bond, a hydrogen atom, an alkyl group, an aryl group, an aralkyl group, or an alkenyl group), Formula (7), or Formula (7'):

Formula (7)

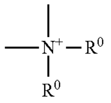

Formula (7')

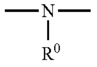

(where $R^0$s are individually a single bond, a hydrogen atom, an alkyl group, an aryl group, an aralkyl group, or an alkenyl group), where at least one of $A^5$ to $A^8$ is a group of Formula (7); the substituent $R^5$s are individually an alkyl group, an aryl group, an aralkyl group, an alkenyl group, a hydroxy group, or a combination thereof, where $R^5$s optionally form a ring with each other; $n_2$ is an integer of 1 to 8; $m_3$ is an integer of 0 or 1; and $m_4$ is 0 or an integer of 1 to a maximum number of $R^5$s that are substituted on a monocycle or a polycycle].

7. The composition according to claim 5, wherein the linear ammonium group is a linear ammonium group of Formula (8):

Formula (8)

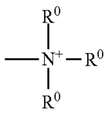

(where $R^0$s are individually a hydrogen atom, an alkyl group, an aryl group, an aralkyl group, or an alkenyl group).

8. The composition according to claim 1, wherein the onium group is a tertiary ammonium group or a quaternary ammonium group.

9. The composition according to claim 1 comprising:

a hydrolysis-condensation product of a compound of Formula (1):

$R^1_aR^2_bSi(R^3)_{4-(a+b)}$ Formula (1)

(where $R^1$ is an onium group or an organic group containing an onium group, and is a group bonded to a silicon atom through a Si—N bond, a Si—P bond, a Si—S bond, or a Si—C bond; $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon atom through a Si—C bond; $R^3$ is an alkoxy group, an acyloxy group, or a halogen group; and a is an integer of 1 or 2, and b is an integer of 0 or 1, where a+b is an integer of 1 or 2); or a hydrolysis-condensation product of a combination of the hydrolyzable organosilane of Formula (1) with an organosilicon compound of Formula (9):

$R^6_aSi(R^7)_{4-a}$ Formula (9)

(where $R^6$ is an alkyl group, an aryl group, a halogenated alkyl group, a halogenated aryl group, an alkenyl group, or an organic group having an epoxy group, an acryloyl group, a methacryloyl group, a mercapto group, or a cyano group, and is a group bonded to a silicon, atom through a Si—C bond; $R^7$ is an alkoxy group, an acyloxy group, or a, halogen group; and a is an integer of 0 to 3).

10. The composition according to claim 1, further comprising an acid as a hydrolysis catalyst.

11. The composition according to claim 10, further comprising water.

12. A resist underlayer film obtained by applying the composition as claimed in claim 1 onto a semiconductor substrate and by baking the composition.

13. A method of forming a resist pattern used in a production of a semiconductor device, the method comprising:

applying the resist underlayer film forming composition as claimed in claim 1 onto a semiconductor substrate and baking the composition to form a resist underlayer film;

applying a resist composition onto the resist underlayer film to form a resist film;

exposing the resist film to light;

developing the exposed resist film to obtain a resist pattern;

etching the resist underlayer film according to the resist pattern; and processing the semiconductor substrate according to the patterned resist underlayer film.

14. A method of forming a resist pattern used in a production of a semiconductor device, the forming method comprising:

forming an underlayer organic film on a semiconductor substrate;

applying the resist underlayer film forming composition as claimed in claim 1 onto the underlayer organic film and baking the composition to form a resist underlayer film;

applying a resist composition onto the resist underlayer film to form a resist film;

exposing the resist film to light;

developing the exposed resist film to obtain a resist pattern;

etching the resist underlayer film according to the resist pattern;

etching the underlayer organic film according to the patterned resist underlayer film; and processing the semiconductor substrate according to the patterned underlayer organic film.

15. A resist underlayer film forming composition for lithography comprising:

a silane compound having an onium group, wherein the silane compound having an onium group is a hydrolyzable organosilane having, in a molecule thereof, an onium group, a hydrolysis product thereof, or a hydrolysis-condensation product thereof, and a silane compound having no onium group, wherein the silane compound having an onium group is contained at a ratio of 0.01 to 0.95% by mole on the basis of a total amount of silane compounds in the resist underlayer film forming composition.

* * * * *